United States Patent [19]
Iijima et al.

[11] Patent Number: 5,903,053
[45] Date of Patent: May 11, 1999

[54] SEMICONDUCTOR DEVICE

[75] Inventors: Tadashi Iijima; Hisako Ono; Kyoichi Suguro; Yasushi Akasaka; Shinichi Nakamura, all of Yokohama, Japan

[73] Assignee: Kabushiki Kaisha Toshiba, Kawasaki, Japan

[21] Appl. No.: 08/677,397

[22] Filed: Jul. 9, 1996

Related U.S. Application Data

[63] Continuation of application No. 08/391,585, Feb. 21, 1995, abandoned.

[30] Foreign Application Priority Data

| Feb. 21, 1994 | [JP] | Japan | ................................... | 6-022490 |
| Sep. 16, 1994 | [JP] | Japan | ................................... | 6-222017 |
| Feb. 8, 1995  | [JP] | Japan | ................................... | 7-042612 |

[51] Int. Cl.⁶ .......................... H01L 23/48; H01L 23/52; H01L 29/40

[52] U.S. Cl. .......................... 257/751; 257/764; 257/767; 257/770

[58] Field of Search .................................... 757/751, 764, 757/767, 770

[56] References Cited

U.S. PATENT DOCUMENTS

| 5,516,579 | 5/1996 | Agnello et al. | .......................... 257/751 |
| 5,525,837 | 6/1996 | Choudhury | ................................ 257/751 |
| 5,607,722 | 3/1997 | Vaarstra et al. | . |
| 5,641,985 | 6/1997 | Tamura et al. | . |
| 5,659,057 | 8/1997 | Vaarstra | . |

FOREIGN PATENT DOCUMENTS

| 58-166770 | 10/1983 | Japan . |
| 62-203370 | 9/1987  | Japan . |

OTHER PUBLICATIONS

"Ti–Si–N Diffusion Barriers Between Silicon and Copper", Rid et al—IEEE Electron Device Letters. vol. 15. No. 8, Aug. 1994.

"Evaluation of Amorphous (Mo, Ta, W), –Si–N Diffusion Barriers for <Si>/Cu Metallizations" Reid et al, Thin Solid Films, 236 (1993) p. 319–324, 1993.

Byoung Taek Lee, et al.; Journal IEEE, 1997; "Integration of (Ba, Sr) $TiO_3$ Capacitor With Platinum Electrodes Having $SiO_2$ Spacer"; pp. 249–252.

*Primary Examiner*—Mahshid Saadat
*Assistant Examiner*—S. V. Clark
*Attorney, Agent, or Firm*—Oblon, Spivak, McClelland, Maier & Neustadt, P.C.

[57] ABSTRACT

A semiconductor device comprising a conductive layer and an amorphous alloy layer formed on the bottom surface of said conductive layer and acting as a barrier layer. The conductive layer is either an electrode layer or a wiring layer. The amorphous alloy layer is made of a matrix phase and microcrystal grains. The matrix phase consists mainly of a Ti—Si—N amorphous alloy. The microcrystal grains are dispersed in the matrix phase, not continuously arranged in the direction of thickness of the amorphous alloy layer.

29 Claims, 31 Drawing Sheets

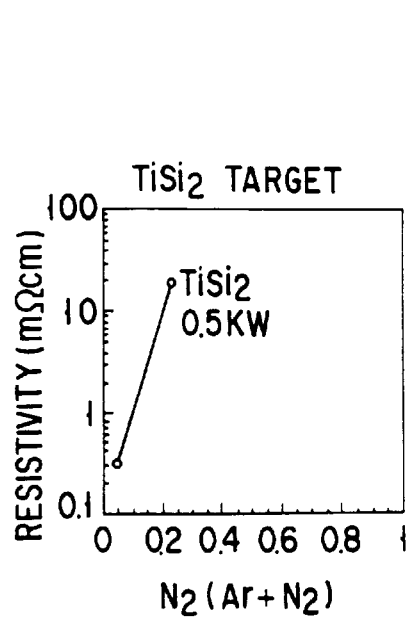
F I G. 11A
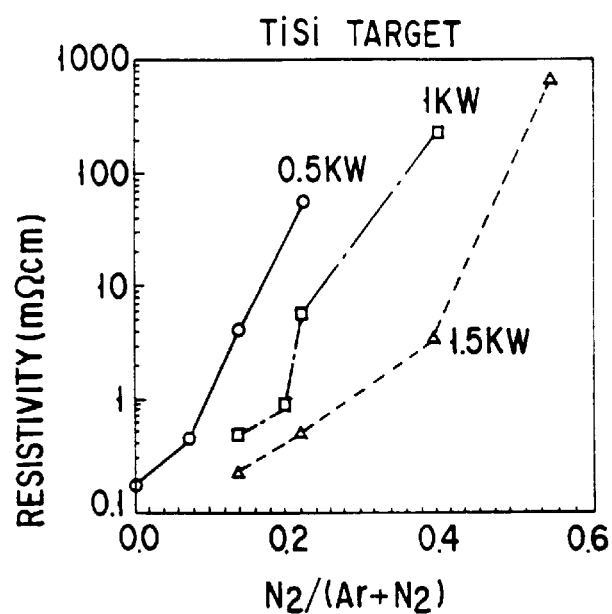
F I G. 11B
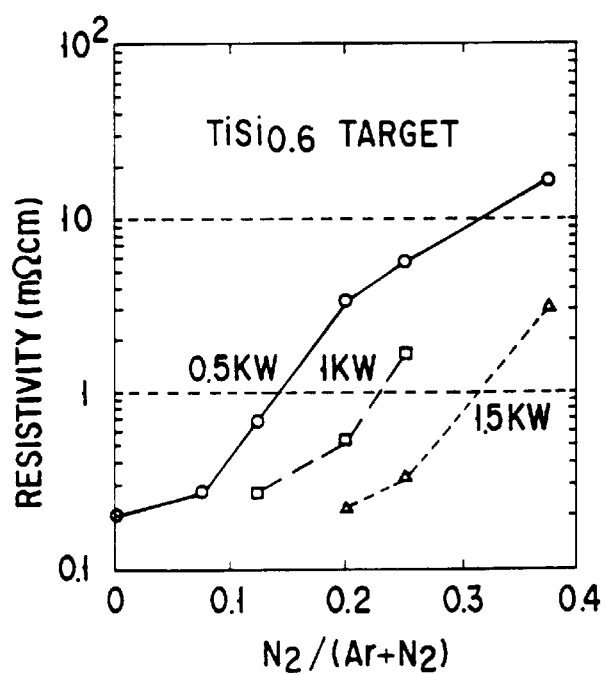
F I G. 11C

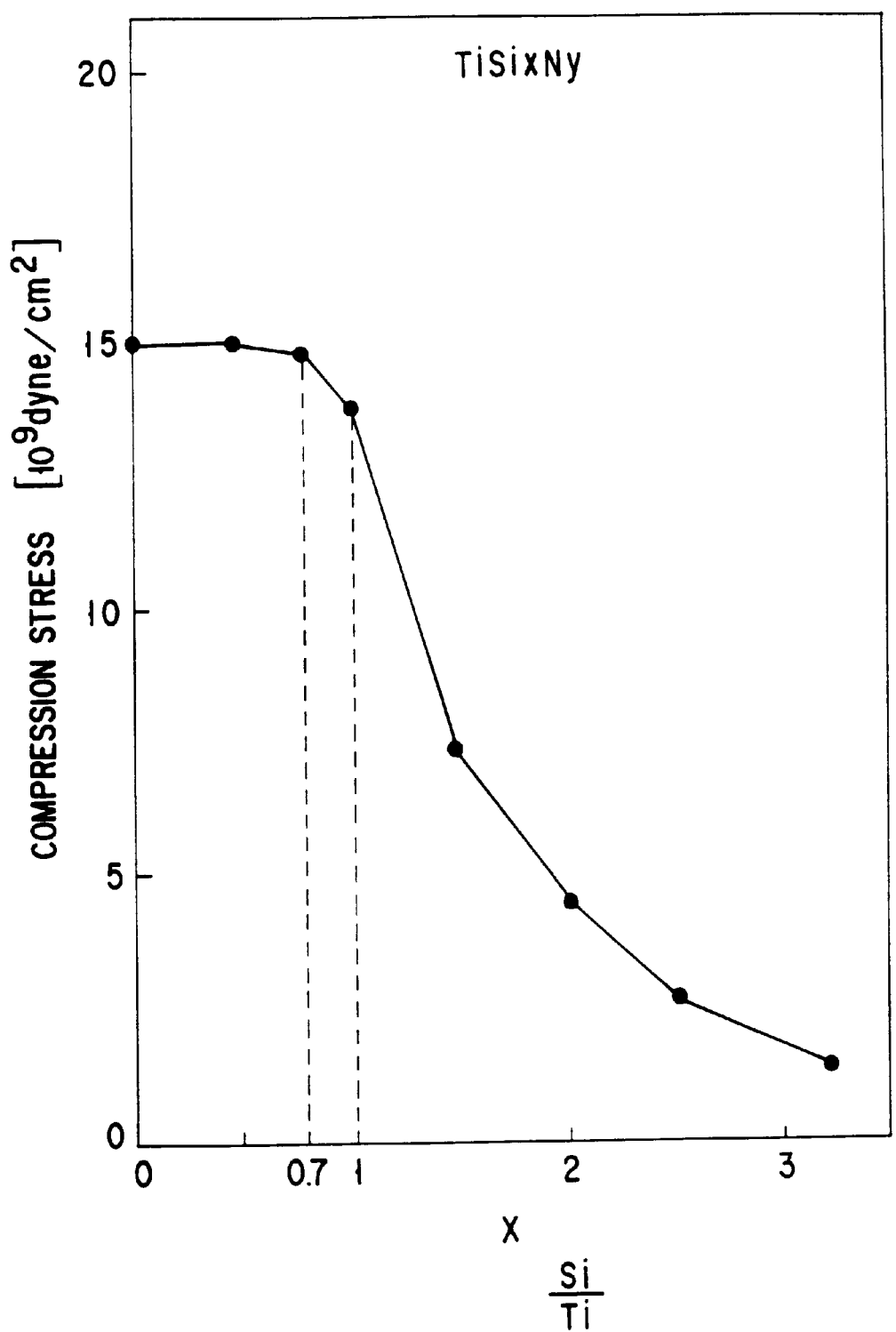
F I G. 12

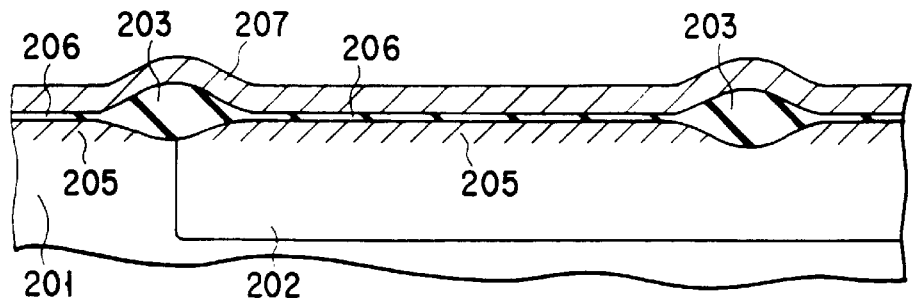
F I G. 17D
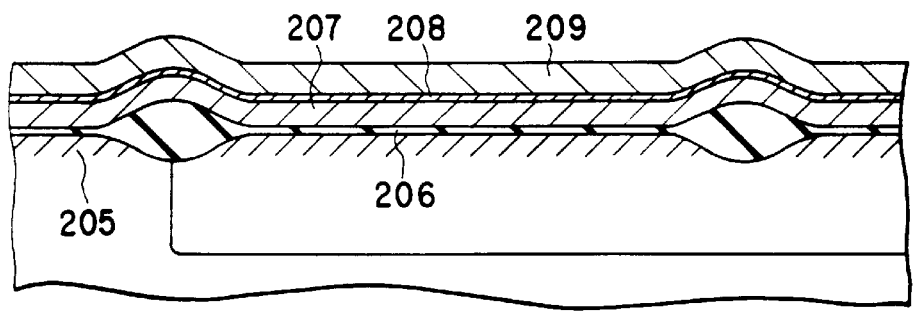
F I G. 17E
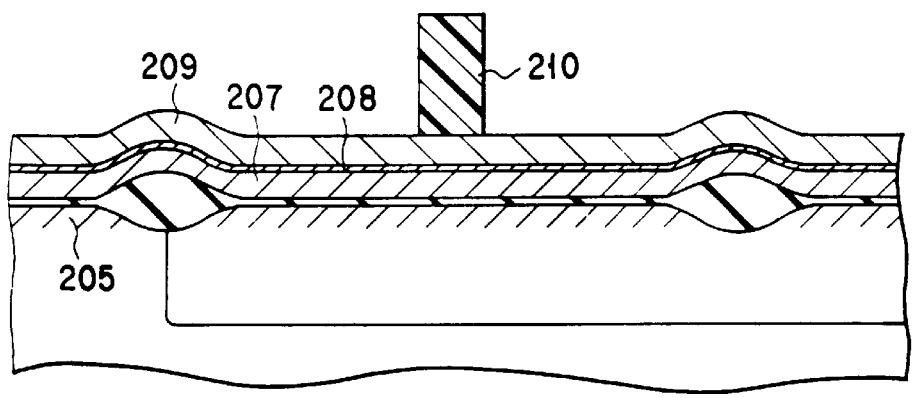
F I G. 17F
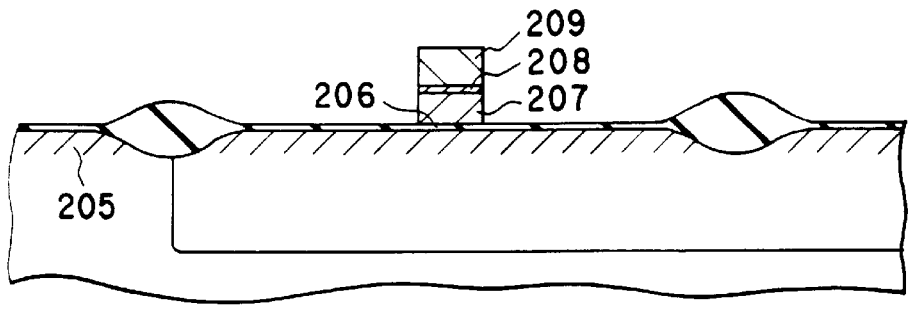
F I G. 17G

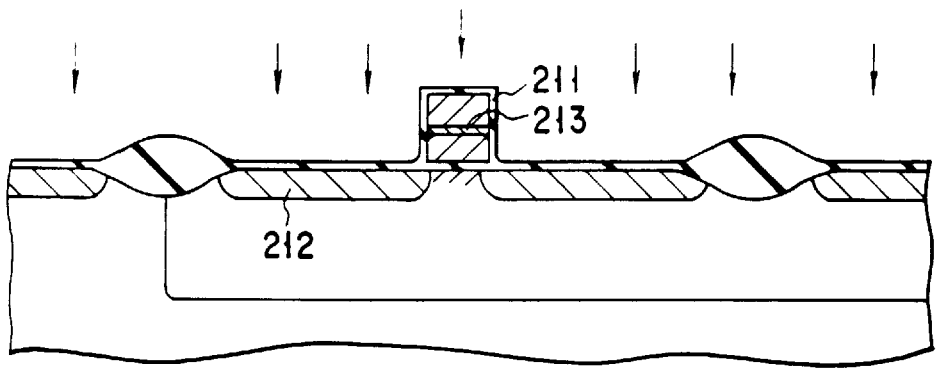
F I G. 17H
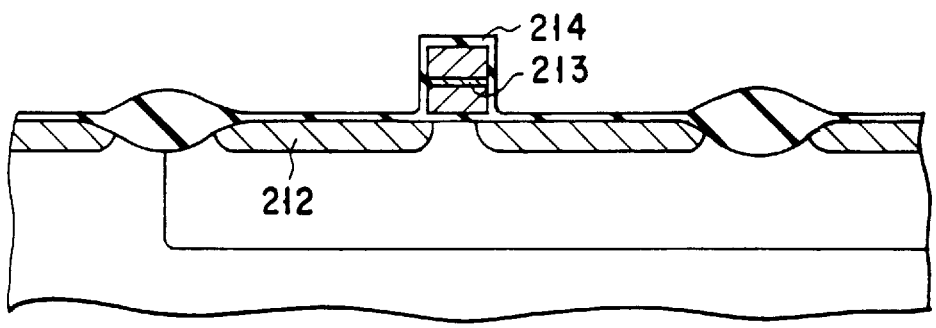
F I G. 17I
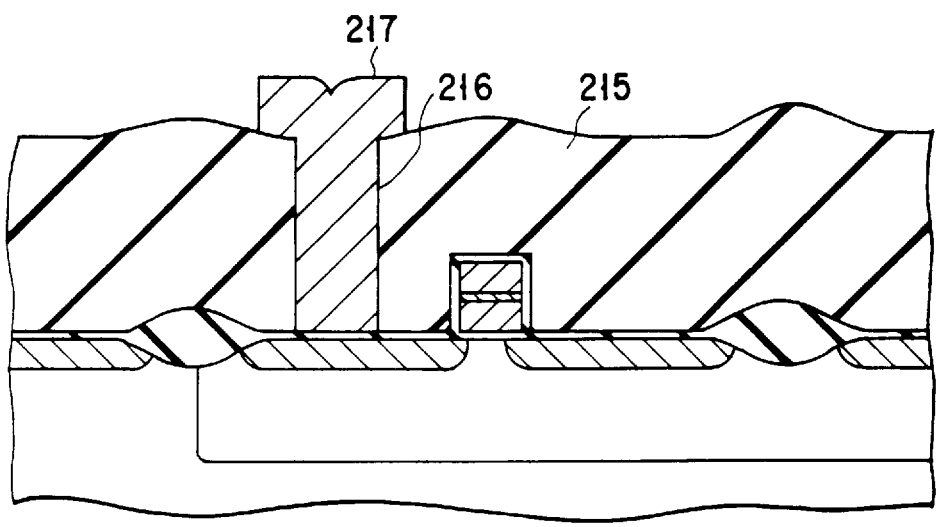
F I G. 17J (a) SECTIONAL VIEW (b) PLAN VIEW

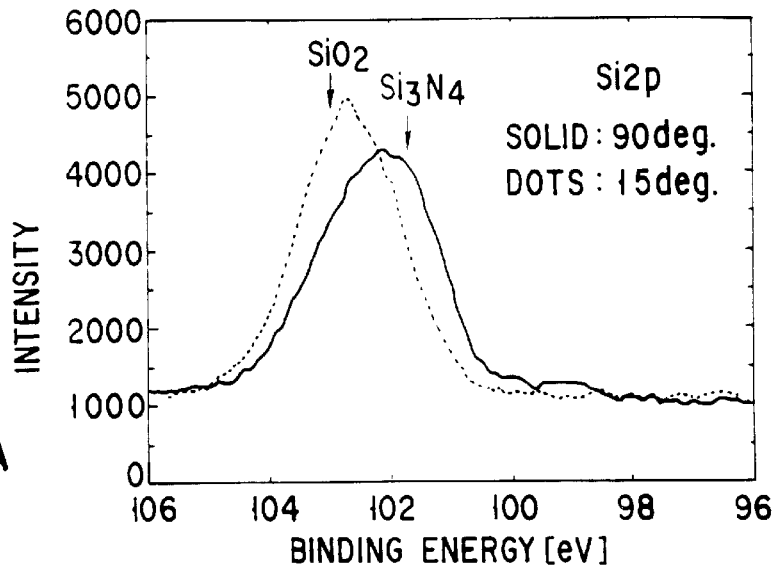
FIG. 30A (a) Si PEAK
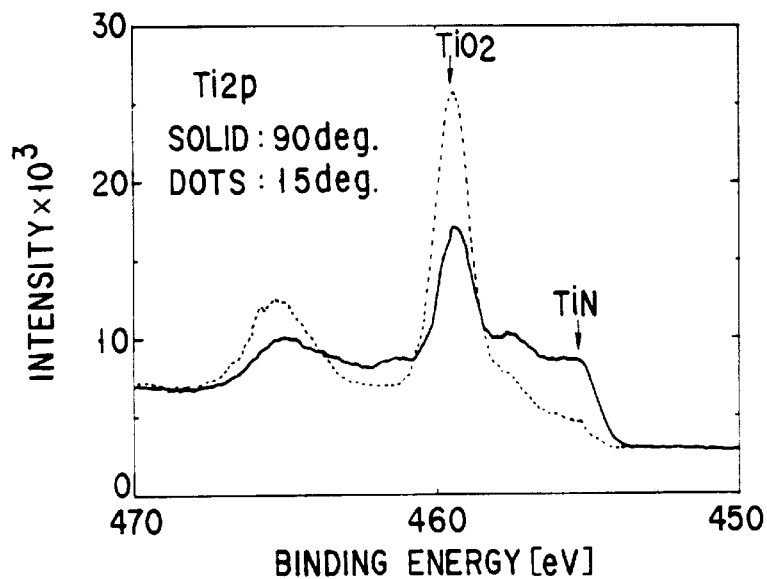
FIG. 30B (b) Ti PEAK
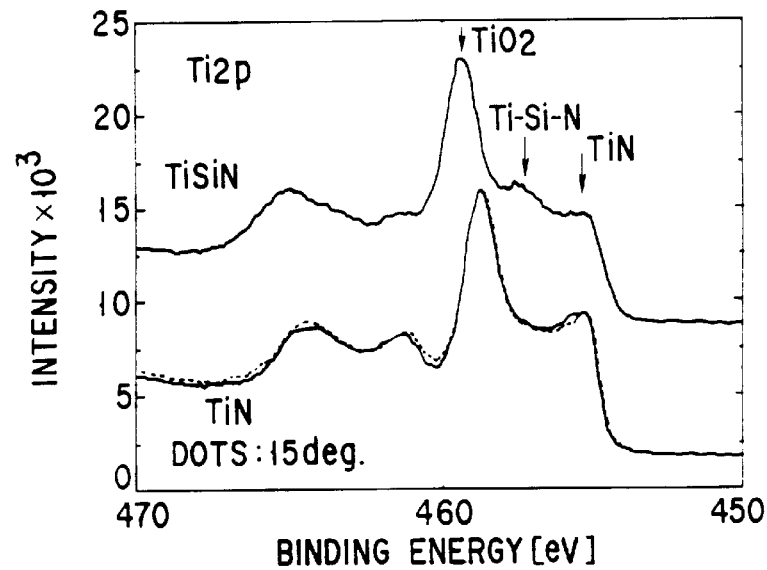
FIG. 30C (c) Ti PEAK IN TiN FILM AND Ti-Si-N FILM, DETECTED BY XPS

SEMICONDUCTOR DEVICE

RELATED APPLICATION

This application is a Continuation of application Ser. No. 08/391,585 filed Feb. 21, 1995, abandoned.

BACKGROUND OF THE INVENTION

1. Field of the Invention

The present invention relates to a semiconductor device, and more particularly to a semiconductor device which has an improved barrier metal layer incorporated in an electrode or a wiring layer. It also relates to a semiconductor device which has electrodes or wiring layers of polycide structure, each comprising a polysilicon layer and a refractory metal silicide film deposited on the polysilicon layer.

2. Description of the Related Art

Hitherto, a barrier metal layer has been interposed between one wiring layer and another wiring layer or a semiconductor device when the one wiring layer is electrically contacts the other wiring layer or the semiconductor element. The barrier metal layer prevents the wiring layer from reacting the semiconductor element or the other wiring layer, or prevents diffusion of metal element between the wiring layer and the semiconductor element or the other wiring layer through the interface between the two components. Thus, the barrier metal layer not only achieves good and reliable contact between the two components. But also is it interposed between an insulating film and a wiring layer or an electrode when the wiring layer or the electrode is formed on the insulating film.

At present TiN, TiW and the like are used as materials for barrier metal layers. Films of these materials are formed by means of sputtering or the like. The films thus formed are polycrystalline, made of columnar crystals having crystal grain boundaries which extend at right angles to the surface of the underlying film. The crystal grain boundaries are likely to cause the metal to diffuse in the very direction in which the metal should not diffuse. Obviously, the films have a structure which fails to function as a barrier against the diffusion of the metal. It is desired that the wiring layer have a low resistance in order to enable the semiconductor element work with high efficiency. To this end, the barrier metal layer must be thin enough to be sufficiently low in resistance. Here arises a problem. A thin barrier metal layer acts less effectively as a barrier than a thick one. The conventional barrier metal layer does not seem to function well as a barrier. It would be necessary to use a single-crystal thin film instead, since the film can effectively work as a barrier. With the method available at present, however, it is extremely difficult to form a flawless, single-crystal thin film.

Polysilicon has been used as material for gate electrodes. Since polysilicon has high resistance, a semiconductor element having a gate electrode made of polysilicon has a high parasitic resistance. The high parasitic resistance deteriorates the characteristics of the semiconductor element. For that reason, it is proposed that metal or metal silicide, which has low resistance, be used as material for gate electrodes. When a metal film is formed on a gate insulating film by ordinary sputtering technique, however, it becomes polycrystalline and has various crystal faces. Different crystal faces have different work functions which brings about unstable difference in work functions between the metal and the semiconductor beneath the gate insulating film. The difference in work functions affect the semiconductor beneath the gate insulating film. Consequently, the semiconductor element has but an unstable threshold voltage and cannot be practically used at all.

Assume a tungsten (W) film is used as a gate electrode of a transistor. The tungsten film exhibits work functions of 5.25 eV, 4.63 eV and 4.47 eV in crystal axes (110), (100) and (111), respectively. It is required that the crystals be oriented in the same axis at the bottom of the tungsten film, which contacts a gate insulating film. Otherwise, the transistor could not have its threshold voltage controlled well.

Recently a so-called "polycide structure" has come to be used generally as a gate structure. It comprises a polysilicon layer and a refractory metal silicide layer deposited on the polysilicon layer. The metal silicide layer is made of $MoSi_x$, $WSi_x$ or the like which has a lower electric resistance than polysilicon and a relatively high heat resistance Refractory metal silicide is an excellent material for the following reason. That is, it can be well processed applied to the process in which polysilicon is processed. The process need not be modified so much even if a polycide structure is employed.

When a polysilicon layer is processed to a shape of a gate electrode, and is oxidized, the edge portion of the polysilicon layer is oxidized to a large thickness. A transistor having a gate electrode thus formed has a high gate breakdown voltage and reliably operates for a long time, as is known in the art. Even when a refractory metal silicide film is also oxidized at its surface at the same time the surface of the polysilicon layer is oxidized, metal oxide will not be formed, but only $SiO_2$ will be formed on the metal silicide film, if the metal silicide film contains more silicon than in stoichiometric composition.

If the metal silicide film contains more silicon than in stoichiometric composition, the silicon in the metal silicide will be consumed in oxidation. As a result, the mental content in the film will be more excessive. This composition change is prominent in inverse proportion to the width of the polycide structure. $SiO_2$ films, each 85 nm thick, were formed on $WSi_x$ films of two types which had the same thickness of 300 nm and different initial compositions of $WSi_{2.50}$ and $WSix_{2.65}$, thereby forming strips of polycide structure. The average composition of the $WSi_x$ films of either type were plotted against the widths of the strips. The results were as illustrated in FIG. 1.

As is evident from FIG. 1, when the strip of either polycide structure had a width of 0.8 nm or less, the composition of either tungsten silicide ($WSi_x$) approached the stoichiometric composition, i.e., $WSi_2$, and the tungsten content became excessive. This is because, the narrower the strip of polycide structure, the higher the ratio of the surface area (i.e., upper and side surfaces combined) to the unit volume of the strip and, hence, the larger the amount of silicon consumed in the oxidation.

When silicon is oxidized in excess, silicon is supplied from the polysilicon layer (i.e,layer, the lower layer) into the tungsten silicide film (i.e., the upper layer) to preserve the stoichiometric composition of tungsten silicide film. Tungsten silicide (i.e., refractory metal silicide) inevitably bites into the polysilicon layer, changing the gate breakdown voltage of the transistor very much as shown in FIG. 2. More precisely, after the polysilicon layer has been thermally oxidized to form an $SiO_2$ film, the gate current-to-gate voltage characteristic greatly of the transistor shifts from the normal relation indicated by the broken curve to one indicated by the solid-line curve.

As described above, in the conventional semiconductor device, the barrier metal layer incorporated in an electrode or wiring layer of a semiconductor element cannot acts as an effective barrier. Consequently, the characteristics of the semiconductor element and the reliability of the wiring layer are deteriorated. Further, the metal layer can hardly be used as gate electrode since work function of the metal electrode on the gate insulating film can not be controlled.

In the polycide structure used in a semiconductor element, silicon is supplied from the polysilicon layer into the refractory metal silicide film formed on the polysilicon layer, when silicon in the metal silicate film is oxidized in an excessive amount. The silicon supplied into the metal silicide film deteriorates the gate breakdown voltage of the semiconductor element. This phenomenon is prominent if the polycide structure is so narrow that far more silicon is consumed in the lateral edges of the structure than in the other portion thereof. The deterioration of breakdown voltage does not take place in the entire gate electrode (i.e., the polycide structure). It is attributed to the metal silicide locally invaded into the polysilicon layer. In other words, the gate breakdown voltage of the element is deteriorated due to the non-uniform refractory metal silicide and the fast diffusion of silicon through crystal grain boundaries.

SUMMARY OF THE INVENTION

An object of the present invention is to provide a semiconductor device, which comprises an electrode or a wiring layer including an improved barrier metal layer which can function as an effective barrier, thus enhancing the characteristic of the device and the reliability of the wiring layer.

Another object of the invention is to provide a semiconductor device which comprises a gate insulating film and a gate electrode formed on the gate insulating film, the gate electrode including a barrier metal layer having improved barrier property, whereby the device has good characteristic and its wiring layer is greatly reliable.

Still another object of this invention is to provide a semiconductor device which comprises an electrode or a wiring layer of polycide structure, and in which a polysilicon layer and a metal silicide film are prevented from reacting even when the electrode or the wiring layer is oxidized at its surface, and no metal silicide locally invaded into the polysilicon layer, thus enhancing the reliability of the device.

According to the present invention, there is provided a semiconductor device which comprises a conductive layer being either one of an electrode layer and a wiring layer, and an amorphous alloy layer formed on a bottom surface of the conductive layer and made of a matrix phase and microcrystal grains, said matrix phase containing amorphous alloy as a main component, and said microcrystal grains being dispersed in the matrix phase, not continuously arranged in a direction of thickness of the amorphous alloy layer.

According to the present invention, there is provided a semiconductor device which comprises a conductive layer being either one of an electrode layer and a wiring layer, and a barrier metal layer formed on a bottom of the conductive layer and containing Ti, Si and N.

According to the present invention, there is provided a semiconductor device which comprises a conductive layer being either one of an electrode layer and a wiring layer, and a barrier metal layer formed on a bottom of the conductive layer and containing a refractory metal, Si and N, the atomic ratio of Si to the refractory metal being 0.7 or more.

According to the present invention, there is provided a semiconductor device which comprises a three-layer structure acting as either one of an electrode and a wiring layer and consisting essentially of a silicon layer, a refractory metal silicide layer provided above the silicon layer and a barrier metal layer interposed between the silicon layer and the refractory metal silicide layer and containing Si, N and a refractory metal identical to or different from the refractory metal of the refractory metal silicide layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 11A, 11B and 11C are graphs showing how the resistivity of TiSiN varies with the partial pressure of $N_2$;

FIG. 12 is a graph illustrating how the compression stress on a TiSiN film changes with the Si/Ti atomic ratio of the TiSiN film;

FIGS. 17A to 17J are sectional views, explaining the steps of forming a semiconductor device according to the ninth example of the invention;

FIGS. 30A to 30C are graphs, each showing the XPS spectra of a TiN film and TiSiN film for comparison.

DETAILED DESCRIPTION OF THE PREFERRED EMBODIMENTS

Figure 1:
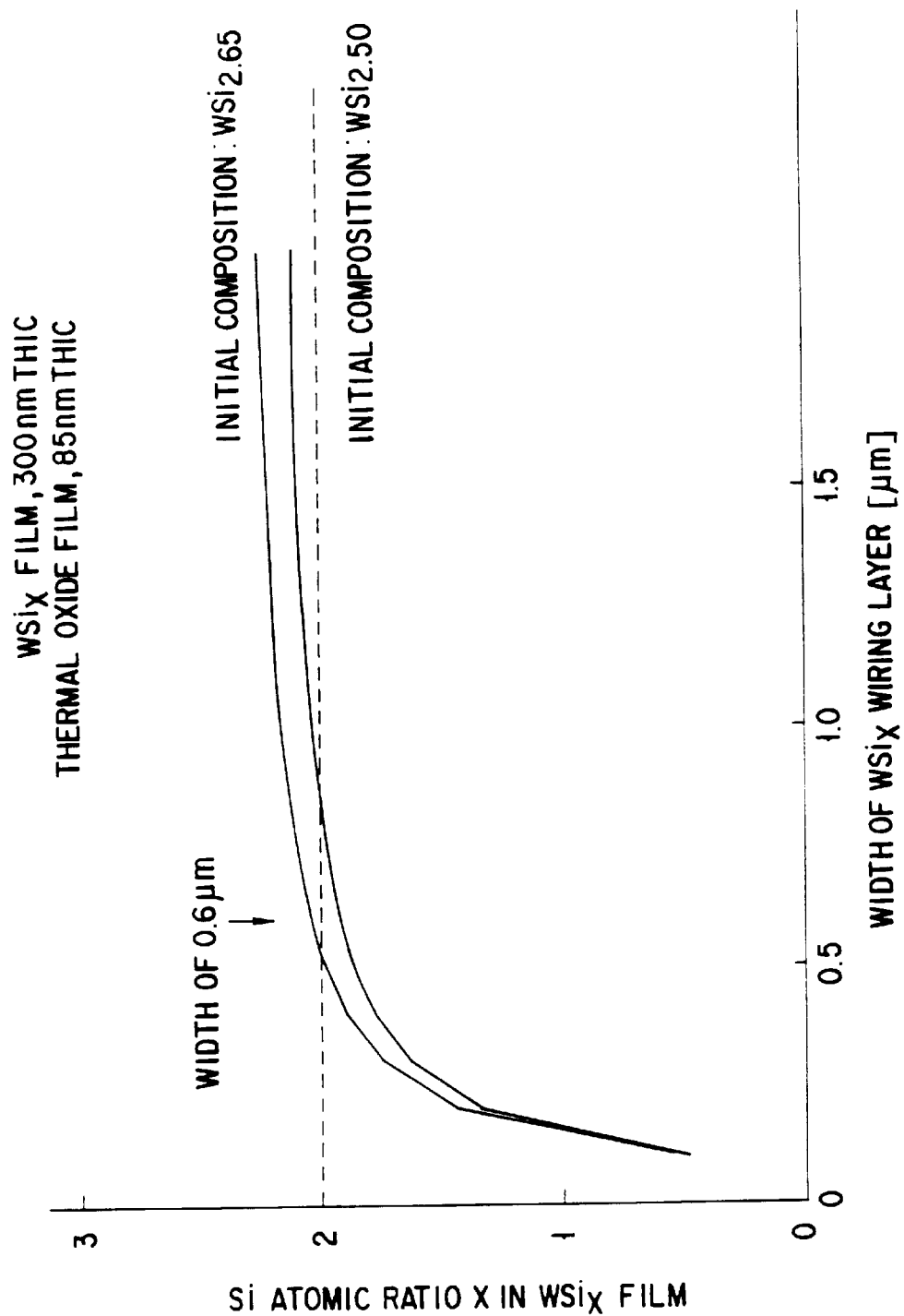
FIG. 1 is a graph illustrating how the atomic ratio x of $WSi_x$ changes with the widths of the conventional wiring layers made of $WSi_{2.65x}$ and $WSi_{2.50}$, after the wiring layers have been thermally oxidized.
Figure 2:
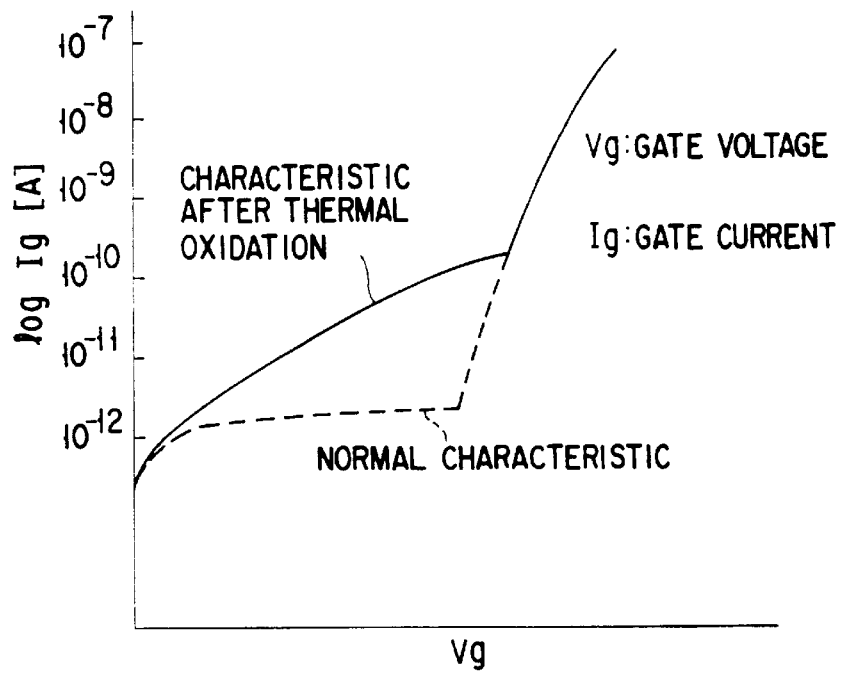
FIG. 2 is a graph representing the Ig-Vg characteristic of a gate electrode formed by a conventional method.

Preferred embodiments of the present invention will be described in detail.

A semiconductor device according to the invention comprises a conductive layer and an amorphous alloy layer formed on the bottom of the conductive layer. The conductive layer is either an electrode layer or a wiring layer. The amorphous alloy layer is made of a matrix phase and microcrystal grains. The matrix phase consists mainly of amorphous alloy. The microcrystal grains are dispersed in the matrix phase, not continuously arranged in the direction of thickness of the amorphous alloy layer. The amorphous alloy layer acts as a barrier layer.

As mentioned above, the barrier layer is made of amorphous alloy, and the microcrystal grains are dispersed without being arranged continuously in the direction of thickness of the barrier layer. Metal element does not diffuse through crystal grain boundaries unlike in the case where the barrier layer is made of TiN. The barrier layer can therefore have improved barrier property.

The amorphous alloy may contain a refractory metal, semiconductor, and nitrogen. The refractory metal may be one selected from the group consisting of Ti, Zr, Hf, V, Nb, Ta, Cr, W and Mo. The semiconductor may be one selected from the group consisting of IV group material such as Si, Ge, and C, a binary compound semiconductor such as GaAs, InP, InSb, BN, GaP, ZnSe, ZnS, CdS, and CdTe, and a ternary compound semiconductor such as II-IV-VI compound semiconductor, II-IV-V compound semiconductor, III-IV-VI compound semiconductor, I-III-VI compound semiconductor and II-V-VII compound semiconductor.

The microcrystal grains may be those of refractory metal silicide. In this-case, it is preferred that they have a grain size of 2 nm or less.

It is most desirably that the amorphous alloy layer be made of Ti—Si—N and that the microcrystal grains be TiN grains.

It is also desirable that the amorphous alloy layer be made of W—Si—N and that the microcrystal grains be W or $W_xNy$ grains.

If the amorphous alloy layer is made up of refractory metal, Si and N, the film stress can be reduced by setting the atomic ratio of Si to the refractory metal at 0.7 or more. Reduction in the film stress is effective means for enhancing the characteristics of any element incorporated in the semiconductor device.

If Ti is used as the refractory metal, the barrier metal layer, i.e., the amorphous alloy layer, will firmly adhere to the lower layer or substrate since Ti well reduces an oxide film (a natural oxide film on the lower layer or the substrate). Hence, the barrier metal layer makes good contact with the lower layer or the substrate. In addition, the composition of the barrier metal layer is stabilized since Ti bonds to N strongly.

If Ti, Zr or Hf is used as the refractory metal, the barrier metal layer remains stable if heated. This is because nitrides of Ti, Zr and Hf have a standard energy of formation negative value larger than a nitride of Ta. As a result, the barrier metal layer has an improved barrier property.

It was found that the barrier metal layer firmly adhered to the insulating film. Moreover, low contact resistance was detected between the barrier metal layer and the lower electrode and also between the barrier metal layer and the upper electrode.

When a metal oxide layer is formed on the surface of the barrier metal layer, the metal oxide layer thus formed can suppress diffusion of metal or silicon through the crystal grain boundaries. Furthermore, if the metal oxide film is made 2 nm or less thick, the contact resistance between the upper and lower wiring layers can be reduced sufficiently.

Thus, it is possible with the present invention to improve the barrier property of the barrier metal layer, to suppress the diffusion of metal or impurity through the barrier metal layer, and to enhance the reliability of the wiring.

A polycide structure according to the invention comprises a refractory metal silicide film, a polysilicon layer and a reaction-inhibiting layer. The reaction-inhibiting layer is formed at the interface between the refractory metal silicide layer and the polysilicon film. It is made of a ternary system such as metal-Si-nitrogen or a quarternary system such as metal-Si-nitrogen-oxygen. Even after subjected to a heating step, the polycide structure remains stable, not deteriorating the gate breakdown voltage of the semiconductor device.

Figure 25A:
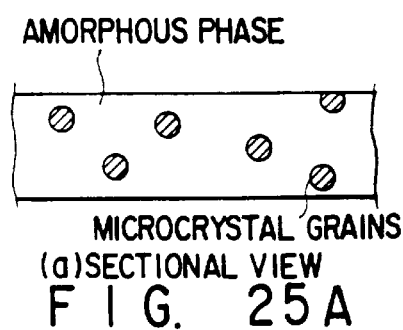
FIGS. 25A and 25B are diagrams illustrating an amorphous layer containing microcrystal grains.
Figure 25B:
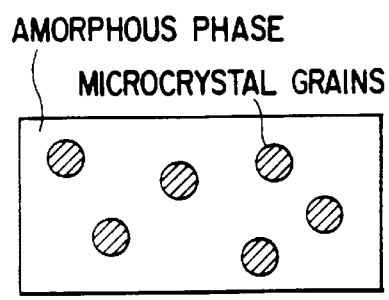

The barrier metal layer is an amorphous alloy which contains microcrystal grains as illustrated in FIG. 25A or 25B. The microcrystal grains which have a size less than the thickness of the amorphous alloy layer. Therefore, metal or impurity does not diffuse unlike in the case where the barrier layer is made of TiN, and the barrier layer can have its barrier property improved. When the amorphous alloy layer shown in FIG. 25A or 25B is formed on an gate insulating film, the work function of the barrier metal layer can be controlled to a single value, making it possible to increase the reliability and performance of the semiconductor device incorporating the barrier metal layer.

Preferred embodiments according one aspect of the present invention have the following features:

(1) An electrode or a wiring layer is buried in a groove made in an insulating film, and a barrier metal layer is provided on the bottom and sides of the electrode or wiring layer.

(2) The refractory metal, one component of the barrier metal layer, is selected from the group consisting of Ti, Zr, Hf, Mo and W.

(3) The barrier metal layer is made of an alloy which has no crystal grain boundaries.

(4) The electrode or wiring layer is made of Al, Cu, Ag or W, or an alloy of at least two of these metals.

Another aspect of the present invention relates to a semiconductor device which comprises an electrode or a wiring layer, a barrier metal layer provided on the bottom of the electrode or wiring layer, and an oxide layer interposed between the electrode or wiring layer and the barrier metal layer. The oxide layer is made of an oxide of the metal which is one component of the barrier metal layer.

Preferred embodiment according to the other aspect of the present invention has the following features:

(1) The barrier metal layer is made of TiN, and the oxide layer is a $TiO_2$ film.

(2) The $TiO_2$ film has a thickness of 2 nm or less.

(3) A TiN layer is used as the diffusion barrier layer for the wiring layer, and the atomic ratio of Ti to N ranges from 0.95:1.05 to 1.05:0.95.

(4) A TiN layer is used as the diffusion barrier layer for the wiring layer, and its surface is oxidized at a low temperature of 450° C. or less by means of either oxygen-plasma processing or ozone processing.

(5) The surface of the substrate, on which the barrier layer is to be formed, is smoothed prior to the formation of the barrier layer.

(6) The smoothed surface of the substrate has an average roughness of 1 nm or less.

The other embodiments of the present invention is characterized in the following respects:

(1) If an electrode is provided, a barrier metal layer is formed on the bottom and sides of the electrode. If a wiring layer is provided, a barrier metal layer is formed on the bottom, sides and top of the wiring layer.

(2) The barrier metal layer contains a semiconductor selected from the group consisting of a IV-metal such as Si, Ge, C or the like, a III-V compound semiconductor such as GaAs, InP, InSb, BN, GaP or the like, an II-VI compound semiconductor such as ZnSe, ZnS, CdS, CdTe or the like, a ternary compound semiconductor such as II-IV-V, III-IV-VI, I-III-VI, II-V-VII or the like.

(3) The barrier metal layer contains a refractory metal, and the semiconductor has an atomic ratio of 0.7 or more with respect to the refractory metal.

(4) The refractory metal has at least one main component selected from the group consisting of Mo, W, V, Nb, Ta, Ti and Co.

(5) A refractory metal silicide layer of a polycide structure contains at least one metal selected from the group consisting of Mo, W, V, Nb, Ta, Ti and Co.

Moreover, the present invention provides a method of manufacturing a semiconductor device having an electrode or a wiring layer of polycide structure, said method comprising the steps of: forming a nitrogen-containing, refractory metal silicide layer on a polysilicon layer; performing heat treatment on the resultant structure, forming a layer having a higher nitrogen concentration than the metal silicide layer, at the interface between the polysilicon layer and the metal silicide layer.

It is possible to use as a refractory metal an alloy of at least two elements selected from the group consisting of Ti, Zr, Hf, W and Mo.

Various examples of the present invention will be described in detail.

EXAMPLE 1

FIGS. 3A to 3E are sectional views, explaining how to form a buried wiring layer is formed in a semiconductor device according to the first example of the invention.

Figure 3A:
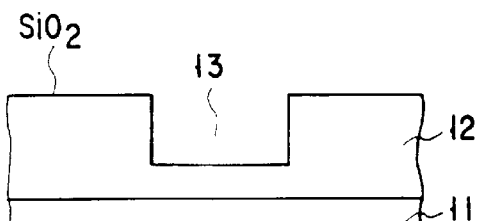
FIGS. 3A to 3E are sectional views, explaining the steps of forming a buried wiring layer in a semiconductor device according to a first example of this invention.

At first, as shown in FIG. 3A, an $SiO_2$ film 12 used as an insulating film is formed on a semiconductor substrate 11. Then, a groove 13 is made in the surface of the $SiO_2$ film 12 by means of RIE method or the like. The insulating film 12 may be made of polyimide, not $SiO_2$. It is desirable that the inner surface of the groove 13 be smoothed by, for example, CDE (chemical dry etching) or the like—preferably to surface roughness of 1 nm or less.

Figure 3B:
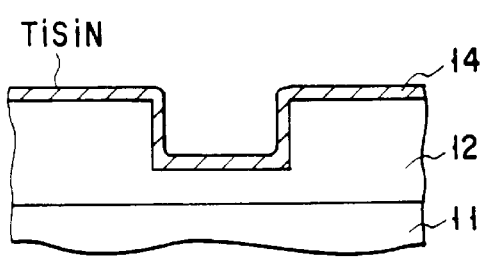

Next, as shown in FIG. 3B, a TiSiN film 14, i.e., a diffusion barrier film or bonding layer made of a ternary compound of Ti, Si and N, is deposited on the resultant structure to a thickness of 25 nm. More precisely, the TiSiN film 14 is formed by chemical or reactive sputtering by means of a DC magnetron sputtering apparatus, using a Ti silicide target, supplying argon at flow rate of 10 to 20 sccm and nitrogen at flow rate of 30 to 100 sccm, at pressure of 0.3 Pa and electric power of about 1 kW. The film 14 thus formed is an amorphous one, as was proved by examining an actually formed TiSIN film by means of XRD (X-Ray Diffractometry).

The method of forming the TiSiN film 14 and the conditions applied to that method are not limited to those specified above. They can be changed in accordance with the specification for the film 14. For instance, the sputtering may be performed by using Ti targets and, Si targets which are arranged in a mosaic pattern. Whatever method can be employed, provided the resultant film is made of a ternary compound of Ti, Si and N.

Figure 4:
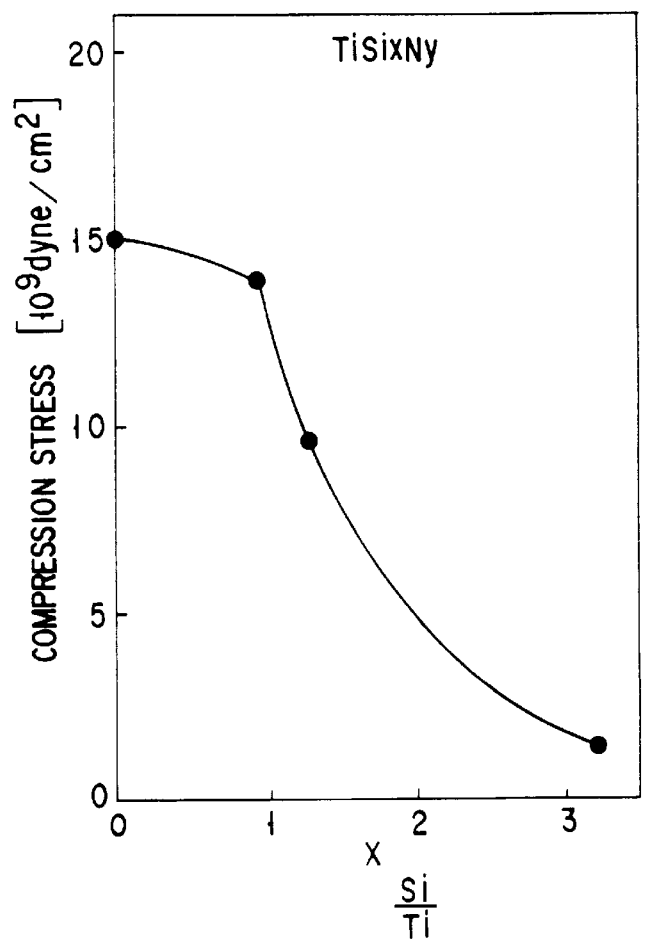
FIG. 4 is a diagram illustrating how the compression stress on a TiSiN film changes with the Si/Ti atomic ratio.

The stress on the TiSiN film 14 greatly depends on the atomic ratio of Si to Ti. TiSiN films of various Si/Ti atomic ratios X were formed, and their compression stresses were measured. The results were as shown in FIG. 4. As can be understood from FIG. 4, the compression stress sharply decreased when the Si/Ti atomic ratio X was 1 or more. If the compression stress on the TiSiN film 14 is high, the device characteristics (i.e., operating speed, electrical reliability and the like) of the semiconductor device incorporating the TiSiN film 14 will be deteriorated, and the TiSiN film 14 will exfoliate from the $SiO_2$ film 12. This is why the Si/Ti atomic ratio X should better be 1 or more.

The lower the Si/Ti atomic ratio, the lower the electric resistance of the TiSiN film 14. Even if the TiSiN film 14 has a relatively high resistance, the resistance of the wiring layer to be formed will not be affected, provided that the TiSiN film 14 is made sufficiently thin. Further, no problems will arise even if the TiSiN film 14 is rendered rich in silicon (Si) as mentioned above. Still further, a thin film of Ti or the like can be formed on the SiO$_2$ film 12 beforehand so that the TiSiN film 14 may adhere to the Sio$_2$ film 12 more firmly than otherwise.

As already explained, the ternary compound of Ti, Si and N is amorphous. The stress on the TiSiN film 14 is therefore low (e.g., $1.7 \times 10^9$ dyn/cm$^2$), not likely to jeopardize the characteristics of the semiconductor device. In addition, the TiSiN film 14 has no crystal grain boundaries, because TiSiN is amorphous like glass. No impurities can diffuse through the crystal grain boundaries of the TiSiN film 14 into any neighboring layer or film, whereas impurities can diffuse through a polycrystalline thin film of TiN or TiW which has been conventionally used and which has crystal grain boundaries. Thus, the TiSiN film 14 possesses ideal barrier property.

Table 1 presented blow shows the properties of TiSiN having various Si/Ti atomic ratios.

TABLE 1

| Composition | Orientation (X-ray strength ratio I(111)/I(200)) | Stress 10$^9$ dyn/cm$^9$ | Crystallinity | ρ mΩcm |
|---|---|---|---|---|
| TiSi$_{2.2}$N$_{3.7}$ | 56.57 | 7.58 | Amorphous | 1.5 |
| TiSi$_{3.5}$N$_{4.6}$ | 41.22 | 4.72 | Amorphous | 1.1 |
| TiSi$_{3.2}$N$_{4.2}$ | 183.1 | 1.37 | Amorphous | 1.4 |
| TiN (Comparative) | 8.88 | 14.8 | Polycrystalline | 0.07 |

Figure 3C:
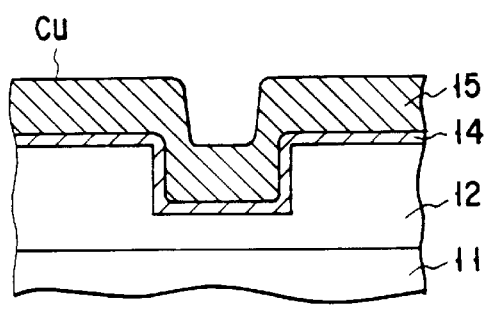
Figure 3D:
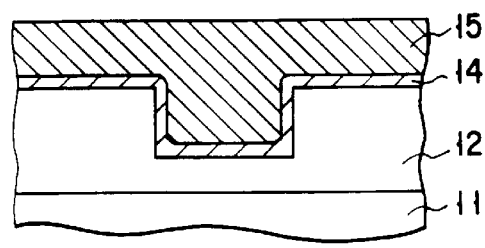

Thereafter, as shown in FIG. 3C, a Cu film 15, which will be processed to be main wiring layer, is formed on the TiSiN film 14 by means of sputtering to a thickness of 400 nm. The TiSiN film 14 and the Cu film 15 may be continuously formed, without exposing the structure to the atmosphere. During or after the sputtering, the structure is annealed at 200 to 700° C., thereby re-flowing Cu into the groove 13, as is shown in FIG. 3D. The upper surface of the Cu film 15 is thereby made flat. It is possible to lower the contents of the oxidizing gases (e.g., oxygen or water vapor) in the annealing atmosphere (to 1 ppm or less) or to add a reducing gas (e.g., hydrogen) to the annealing atmosphere.

Figure 3E:
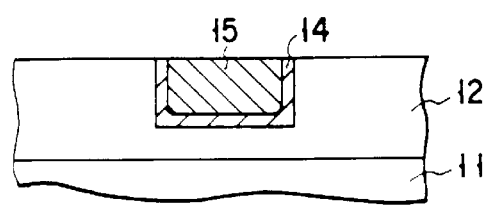

Next, the structure of FIG. 3D is etched at its upper surface, removing the TiSiN film 14 and the Cu film 15, except those portions located in the groove 13, as is illustrated in FIG. 3E. A buried wiring layer made of Cu is thereby formed in the surface of the SiO$_2$ film 12. This etching process may be RIE method or ion milling, or may be replaced by polishing. The Cu wiring thus obtained has high reliability.

The TiSiN film 14 used as the barrier metal layer in Example 1 remains amorphous even at high temperatures. This is because the Si/Ti atomic ratio is high—that is, the film 14 made of ternary compound (TiSiN) is rich in silicon (Si) The experiments the inventors had conducted showed that the ternary compound of Ti, Si and N was thermally stable and did not crystallize, remaining amorphous even after the structure of FIG. 3C was annealed at 750° C. for 30 minutes. Being amorphous, the TiSiN film 14 does not allow impurities to diffuse through it, unlike a TiN film which is polycrystalline and has crystal grain boundaries. The TiSiN film 14 can therefore function as an effective barrier. Furthermore, since the ternary compound (i.e., the material of the film 14) is rich in silicon (Si), the stress on the TiSiN film 14 is low enough to improve the characteristics of the semiconductor device.

EXAMPLE 2

FIG. 5A to 5D are sectional views, explaining the steps of forming wiring layers in a semiconductor device according to the second example of the invention.

Figure 5A:
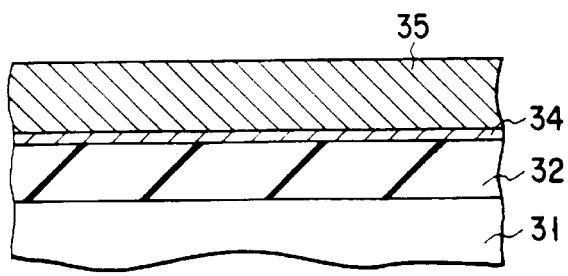
FIGS. 5A to 5D are sectional views, explaining the steps of forming wiring layers in a semiconductor device according to a second example of the invention.

First, as shown in FIG. 5A, an SiO$_2$ film 32 used as an insulating film is formed on a semiconductor substrate 31. A TiSiN film 34, i.e., a barrier metal layer or bonding layer made of a ternary compound, is deposited on the SiO$_2$ film 32 to a thickness of 10 to 25 nm by means of sputtering. Then, a Cu film 35, which will be processed to be main wiring layers, is formed on the TiSiN film 34 to a thickness of 400 nm. As in Example 1, the TiSiN film 34 has a high Si/Ti atomic ratio—that is, the film 34 is rich in silicon.

Figure 5B:
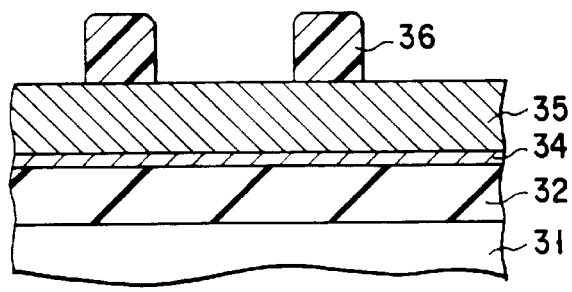
Figure 5C:
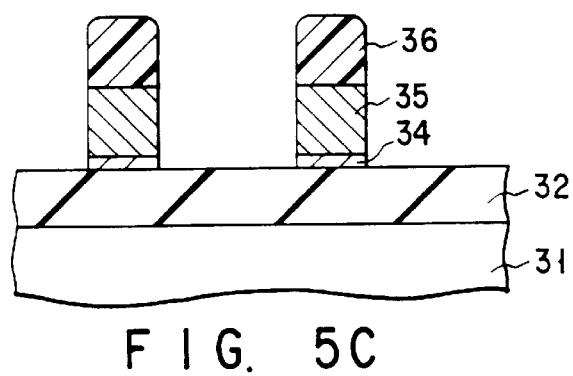

Next, as shown in FIG. 5B, a resist pattern 36 is formed on the Cu film 35 by photolithography. As shown in FIG. 5C, the Cu film 35 and the TiSiN film 34 are subjected selective etching, using the resist pattern 36 as mask, by means of RIE method using chlorine-based gas, ion milling or wet etching using an acid.

Figure 5D:
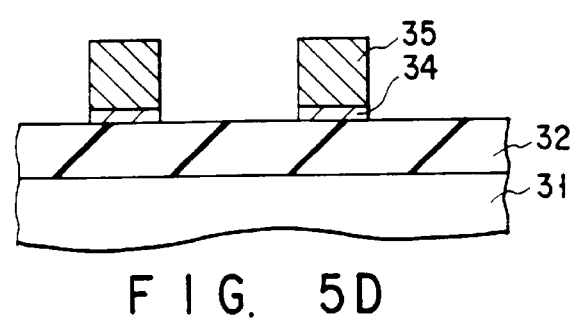

As shown in FIG. 5D, the resist pattern 36 is removed by etching with organic solvent or down-flow ashing using a mixture of oxygen gas and fluoride-based gas or by RIE method using oxygen gas. As a result, the TiSiN film 34 and the Cu film 35 are processed into wiring layers each having a TiSiN layer which functions as a barrier metal layer.

In Example 2, too, the barrier metal layers are made of a ternary compound of Ti, Si and N. Hence, Example 2 achieves the advantages as Example 1.

EXAMPLE 3

FIGS. 6A to 6D are sectional views, depicting the steps of forming wiring layers in a semiconductor device according to the third example of the invention.

Figure 6A:
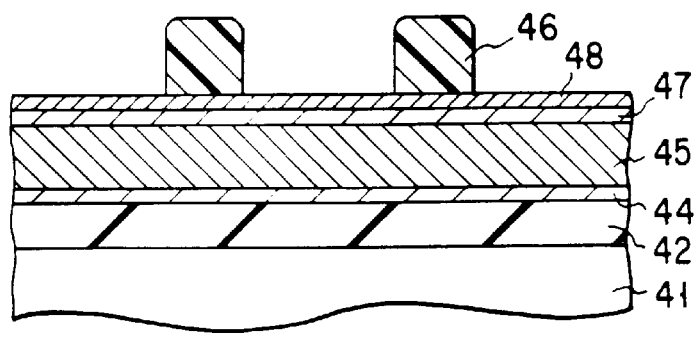
FIGS. 6A to 6D are sectional views, depicting the steps of forming wiring layers in a semiconductor device according to a third example of the invention.

As shown in FIG. 6A, an SiO$_2$ film 42 used as an insulating film is formed on a semiconductor substrate 41. A TiSiN film 44, i.e., a barrier metal layer or bonding layer made of a ternary compound, is deposited on the SiO$_2$ film 42 to a thickness of 10 to 25 nm by means of sputtering. Then, a Cu film 45, which will be processed to be main wiring layers, is formed on the TiSiN film 44 to a thickness of 40 nm. Thus far, the method of manufacturing Example 3 is exactly the same as the method of manufacturing Example 2.

Then, a TiSiN film 47, a film made of ternary compound of Ti, Si and N, is formed by sputtering on the Cu film 45 to a thickness of 10 to 25 nm. A carbon film 48 is formed on the TiSiN film 47 to a thickness of 10 nm. Further, a resist pattern 46 is formed on the carbon film 48 by means of photolithography.

Figure 6B:
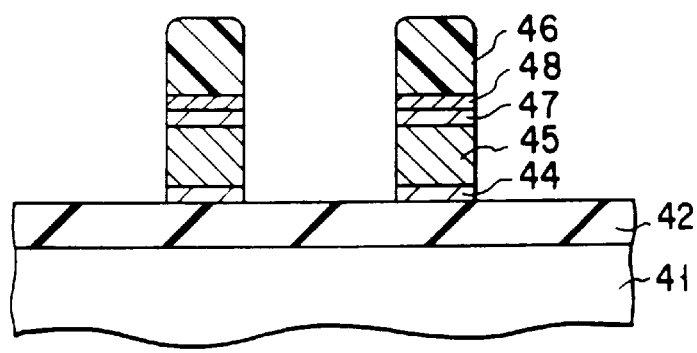

Next, as shown in FIG. 6B, the carbon film 48 is patterned by RIE method using oxygen gas, by using the resist pattern 46 as mask. The three-layer structure beneath the carbon film 48 is subjected selective etching, using the resist pattern 46 and the patterned carbon film 48 as a mask, by means of RIE method using chlorine-based gas, ion milling or wet etching using an acid. As a result, strips are formed on the SiO$_2$ film 42, each consisting of a part of the TiSiN film 44, a part of the Cu film 45, a part of the TiSiN film 47, a part of the carbon film 48 and a part of the resist pattern 46.

Figure 6C:
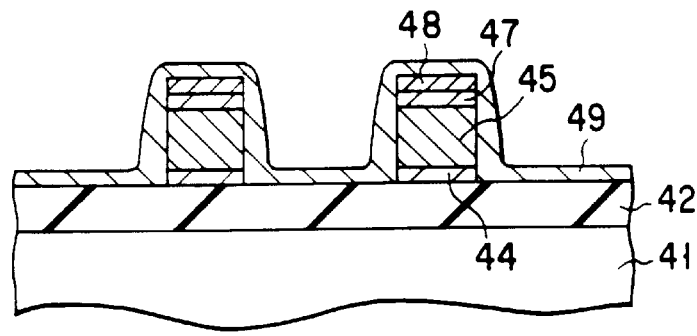

Further, as shown in FIG. 6C, the resist pattern 46 is removed by down-flow ashing using a mixture of oxygen gas and fluoride-based gas. This done, a film 49 made of ternary compound of Ti, Si and N is deposed by sputtering on the entire surface of the resultant structure, to a thickness of 10 to 30 nm.

Figure 6D:
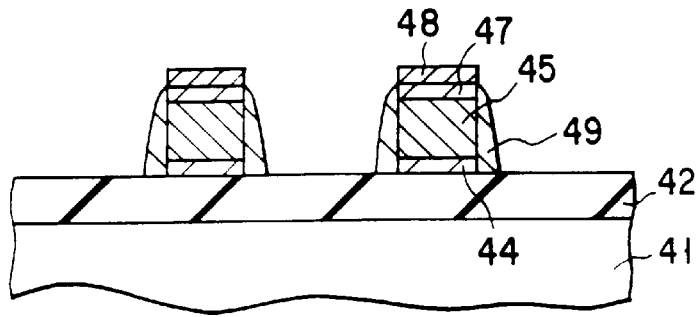

As shown in FIG. 6D, the TiSiN film 49 is etched by RIE method or ion milling, leaving the TiSiN film 49 on only the sides of each strip which consists of the TiSiN film 44, the Cu film 45 and the TiSiN film 47. Finally, the carbon film 48 is removed etching with a mixture solution of hydrogen peroxide and sulfuric acid or by ashing using oxygen plasma, or by RIE method using oxygen gas. As a result, wiring layers are formed, each having a main wiring (Cu) layer 45 and barrier metal (TiSiN) layers 44, 47 and 49 completely covering and surrounding the main wiring layer 45.

Needless to say, Example 3 attains the same advantages as Example 2. It has another advantage. Thoroughly covered with barrier metal layers 44, 47 and 49, the wiring layers are more reliable than that of Example 2.

In Examples 1, 2 and 3, the wiring layers are made of Cu. Alternatively, the wiring layers may be formed of other metal such as Al, Ag or Au. Moreover, they may be made of a Cu—Ag based alloy, which is preferred since it has low resistivity and can re-flow at low temperatures since its melting point is low (770° C.). Furthermore, they may be each a Cu layer and an Ag layer, laid one upon the other, or may be made of a Cu—Ag alloy. In either case, the wiring layers are formed by sputtering, for example, directly on the TiSiN film 44. Table 2 presented below shows the physical properties of various Cu—Ag alloys having different composition.

TABLE 2

| Composition % | | Density | Hardness | Melting | Resistivity |
|---|---|---|---|---|---|
| Ag | Cu | (g/cm$^3$) | (HV) | (° C.) | ($\mu\Omega$cm) |
| 100 |  | 10.5 | 26 | 961.9 | 1.6 |
| 92.5 | 7.5 | 10.4 | 56 | 778 | 1.9 |
| 90 | 10 | 10.3 | 62 | 778 | 2.0 |
| 80 | 20 | 10.2 | 85 | 778 | 2.1 |
| 50 | 50 | 9.7 | 95 | 778 | 2.1 |

The hardness of a metal is an important physical property when the surface of the metal layer is subjected to chemomechanical polishing to selectively leave the metal layer in grooves or contact holes. The inventors' experiments on various Cu—Ag based alloys reveal that Cu—Ag—P alloy which consists of 88% of Cu, 5% of Ag and 7% of P has a melting point of 640° C. and a flowing point of 720° C. This means that, when Ag and P are added to Cu, thus formed alloy can be easily made to flow into grooves.

The refractory metal, a component of the barrier metal layer, is not limited to Ti. Instead, Zr, Hf, Mo W or the like may be selected and used, if necessary. Also when one of these refractory metals other than Ti is used as a component of the barrier metal layer, the stress on the layer (i.e., made of ternary compound) will be small provided that the layer is rich in silicon, as in Examples 1, 2 and 3.

In Examples 1, 2 an 3, the wiring layers are formed on an insulating film. Nonetheless, the invention can be applied to any other type of a wiring layer and electric contacts. Further, the present invention is not limited to the forming of wiring layers. Rather, it can be applied to the formation of electrodes, as well.

EXAMPLE 4

A semiconductor device according to the fourth example of this invention will now be described. Example 4 is characterized in that a major surface of a layer is made flat by CDE (Chemical Dry Etching), polishing or the like, before a barrier metal layer is formed on it. It is desired that the surface of the layer be smoothed to an average roughness of 1 nm or less.

A BPSG film formed by CVD method, for example, has in its surface roughness which has an average depth of 5 nm—with the largest one being 50 nm deep. If the surface of the BPSG film is polished, its roughness is reduced to 0.6 nm on average, and to 13 nm at the maximum If TiN or the like is deposited on the smoothed surface of the BPSG film, there will be formed a barrier metal layer which has a sufficiently uniform thickness, having no excessively thin portions. The barrier metal layer, thus formed, can serve as an effective barrier.

Figure 7A:
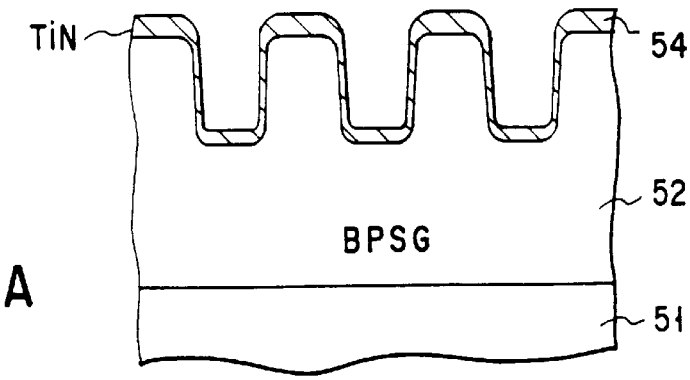
FIG. 7A is a sectional view, explaining a conventional method of depositing a barrier metal layer on a BPSG film.

When BPSG is deposited by CVD method film 52 on a semiconductor substrate 51, a BPSG film 52 to be used as an insulating film is formed on the substrate 51 as shown in FIG. 7A. The film 52 is slightly uneven. Namely, it has a rough surface. If a barrier metal layer 54 of TiN is deposited by sputtering on the rough surface of BPSG film 52, it will have thin portions formed on the sides of the dents, due to shadowing effect, as shown in FIG. 7A. These portions are too thin to act effectively as barriers. The metal layer 54 cannot function as a barrier as a whole.

Figure 7B:
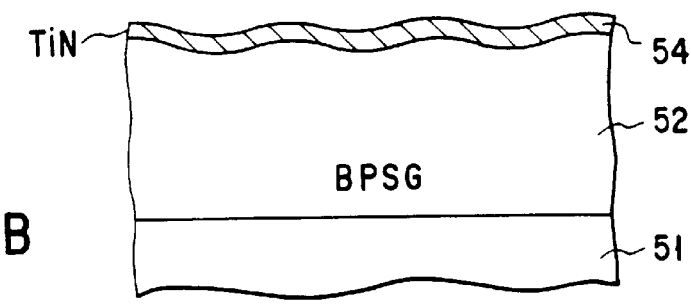
FIG. 7B is a sectional views, explaining the method of depositing a barrier metal layer on a BPSG film in a semiconductor device according to a fourth example of the invention.

In Example 4, as shown in FIG. 7B, the upper surface of a BPSG film 52 is smoothed, and a barrier metal layer 54 is deposited by sputtering on the smoothed surface of the BPSG film 52. The layer 54 therefore has a uniform thickness and can serve as an effective barrier. A barrier metal layer formed by this method can be uniform in thickness even if it is made comparatively thin to provide, as will be demanded in future, wiring layers which have low resistance. In view of this, the method of forming a barrier metal layer, employed in Example 4, is considered advantageous.

The method of forming wiring layers on the smoothed surface of the insulating film will be described in greater detail. First, TiN which has an atomic ratio of Ti to N ranging from 0.95:1.05 to 1.05:0.95 is deposited on the smoothed surface of the insulating film. More specifically, the TiN film is formed by sputtering by means of layer-a DC magnetron sputtering apparatus, using a TiN target whose Ti-to-N atomic ratio falls within the range mentioned above, supplying argon at flow rate of 40 sccm, at pressure of 0.3 Pa and electric power of about 1 kW. The TiN film, thus formed, can have a stable Ti-to-N atomic ratio.

The TiN film may be formed by chemical sputtering, utilizing a Ti target and an N-containing gas. In this instance, the flow-rate ratio between argon and nitrogen must be adjusted in accordance with the material of the substrate on which to form the TiN film. For example, in order to form a TiN film having a Ti-to-N atomic ratio of 1:1 by chemical sputtering on an Si substrate, the flow-rate ratio between argon and nitrogen must be set at 1:1. To form a TiN film having a Ti-to-N atomic ratio of 1:1 by chemical sputtering on an SiO$_2$ substrate, the flow-rate ratio between argon and nitrogen must be adjusted to 1.5:1. Thus, only if the flow-rate ratio between argon and nitrogen is adjusted based on the material of the substrate, a TiN film can be formed which has an atomic ratio of Ti to N ranging from 0.95:1.05 to 1.05:0.95. Having a stable Ti-to-N atomic ratio, the TiN film has improved crystallinity and, hence, excellent barrier property.

Thereafter, the TiN film used as a barrier metal layer is processed with oxygen plasma, to have its surface forcedly oxidized. More correctly, the surface of the TiN film is oxidized in an oxygen-plasma processing apparatus, at oxygen flow rate of 500 sccm, with high-frequency output of 800 W, at pressure of 1 Torr, at room temperature, for the period of 10 minutes. Alternatively, the surface of the TiN film may be oxidized with ozone. Thus surface-oxidized, the TiN film has its barrier property greatly enhanced.

The reason why the TiN film has acquired enhanced barrier property will be explained, with reference to FIGS. 8A, 8B and 9. Shown in FIGS. 8A and 8B are a semiconductor substrate 61, an $SiO_2$ film 62 serving as an insulating film, a TiN film 64 used as a barrier metal layer, a Cu film 65 used as main wiring layer, TiN grain boundaries 67, and a film 69 of oxide ($TiO_2$) of the metal component (Ti) of the barrier metal layer.

Figure 8A:
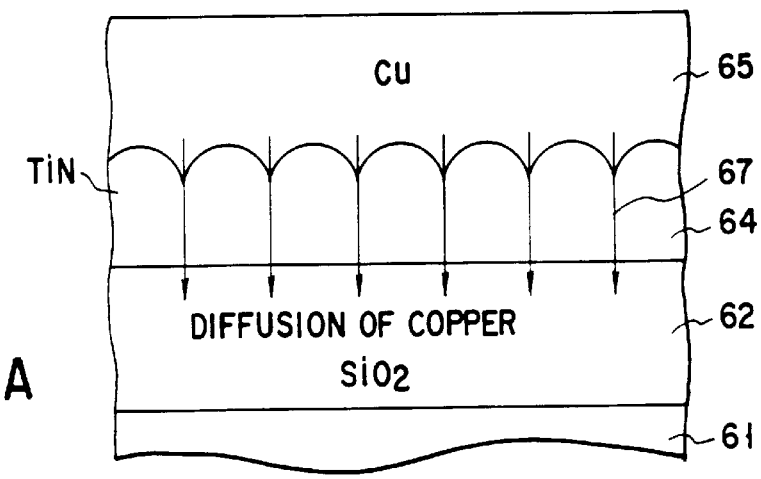
FIGS. 8A and 8B are sectional views, explaining two alternative methods of forming a Cu layer in the fourth example of the invention.
Figure 8B:
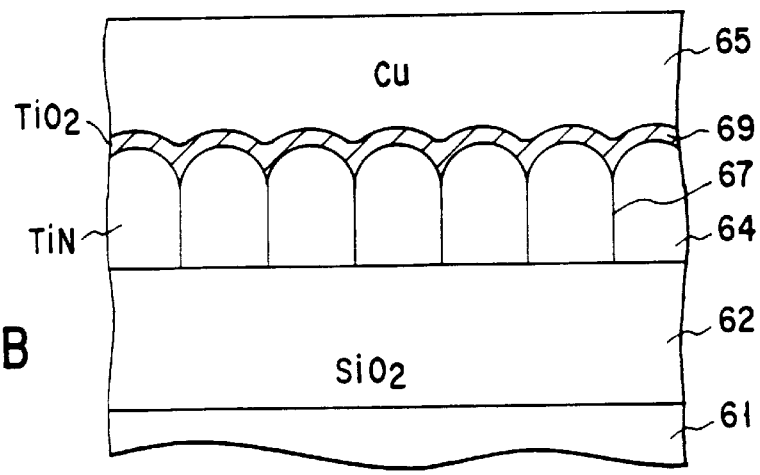

If the Cu film 65 were formed on the TiN film 64 by continuous deposition of Cu, no $TiO_2$ film would be formed at the interface between the TiN film 64 and the Cu film 65 as is illustrated in FIG. 8A. Then, Cu would readily diffuse into the TiN film 64 through the TiN grain boundaries 67. In Example 4, the TiN film 64 has its surface oxidized forcedly at a low temperature, forming a $TiO_2$ film 69 as shown in FIG. 8B. The $TiO_2$ film 69 covers the entire surface of the TiN film 64 and filling the TiN grain boundaries. This enhances the barrier property of the TiN film 64. As indicated above, the $TiO_2$ film 69 can be formed at a low temperature. The forced surface oxidation can, therefore, be employed to form another wiring layer on the wiring layer which comprises the TiN film 64 and the Cu film 65.

Figure 9:
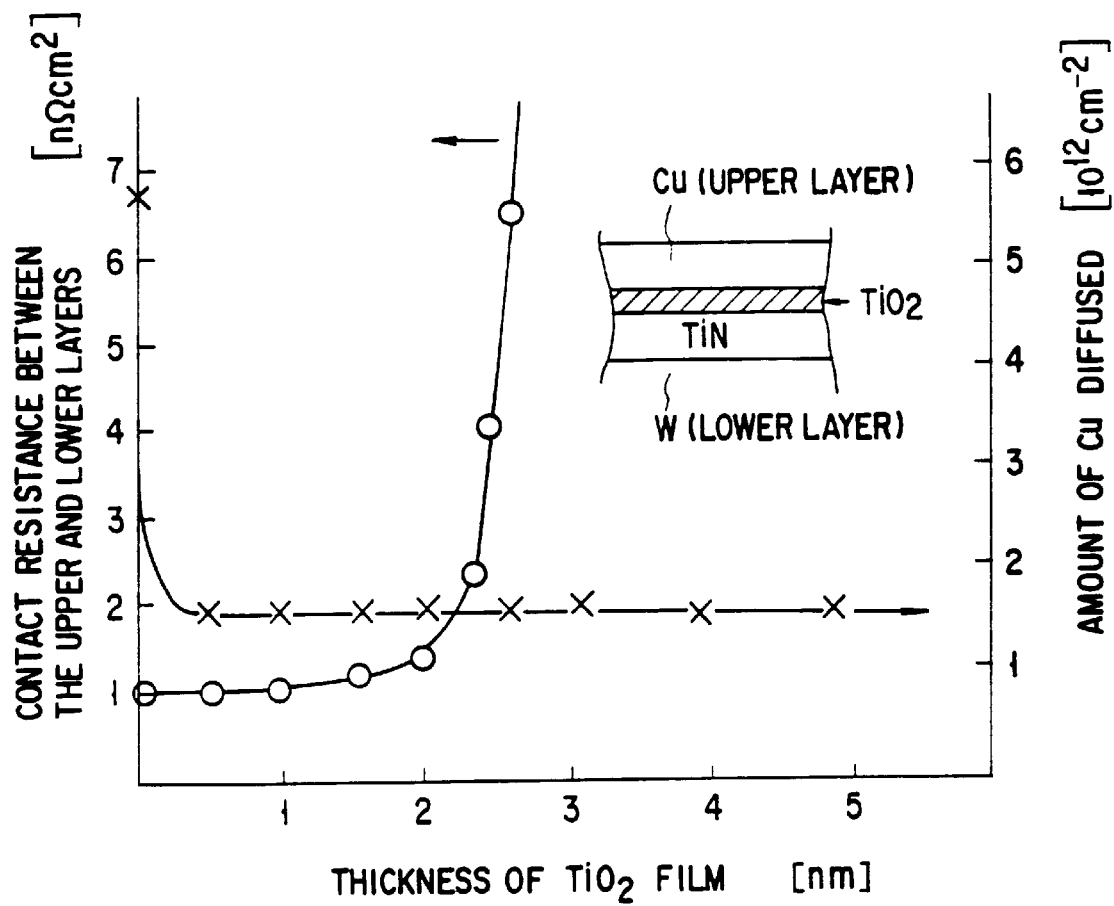
FIG. 9 is a graph representing how the amount of Cu diffused and the contact resistance between an upper layer and a lower layer depends upon the thickness of a $TiO_2$ film formed between the upper layer and a TiN layer.

FIG. 9 is a graph representing how the amount of Cu diffused and the contact resistance between an Cu film (upper layer) and a W film (lower layer) depends upon the thickness of a $TiO_2$ film formed between the Cu film and a TiN film. As FIG. 9 may suggest, the diffusion of Cu can be controlled if a $TiO_2$ is formed at all between the Cu layer and the TiN film. This means that the $TiO_2$ possesses barrier property and can cooperate with the TiN film to prevent Cu from diffusing into the w film.

As is evident from FIG. 9, the contact resistance sharply increases when the thickness of the $TiO_2$ film exceeds about 2 nm, increasing the resistance of the wiring layer formed of the Cu and the w film This is because $TiO_2$ exhibits high resistivity. The thicker the $TiO_2$ film, the higher the contact resistance between the Cu film and W film The wiring layer made up of the W film, the TiN film, the $TiO_2$ film and the Cu film inevitably has a high resistance. As a consequence, the wiring layer deteriorates the characteristics of the semiconductor device in which it is incorporated. Hence, it is preferred that the $TiO_2$ film have a thickness of 2 nm or less.

Example 4 employs three techniques in combination—the surface smoothing of the TiN film, the limiting of the Ti/N atomic ratio, and the forced surface oxidation of the TiN film. Nonetheless, only one of these techniques or any two of them may be utilized, provided the resultant wiring layers can impart good characteristics to the semiconductor device.

In Example 4, a Cu film is used as main wiring layer. Alternatively, the main wiring layer may be formed of other metal such as Al, Ag, Au or the like, or may be formed of a Cu—Ag based alloy. Furthermore, the refractory metal, i.e., a component of the barrier metal layer, is not limited to Ti; instead, Zr, Hf, Ho W or the like may be selected and used, if necessary. Still further, the wiring layer may be formed on another wiring layer or a semiconductor device, forming a contact therewith, not on an insulating film as in Example 4. Moreover, Example 4 can be applied not only to the formation of a wiring layer, but also to the formation of an electrode.

EXAMPLE 5

The fifth example (Example 5) of the present invention will now be described Example 5 is concerned with the formation of buried wiring layers and is basically the same as Example 1.

At first, as shown in FIG. 3A, an $SiO_2$ film 12 is formed on a semiconductor substrate 11 by means of CVD method or the like. The $SiO_2$ film 12, which is used as an insulating film, may be replaced by either a polyimide film or a fluorine-added $SiO_2$ film Next, a groove 13 is made by RIE method or the like in the surface of the $SiO_2$ film 12. Thereafter, as shown in FIG. 3B, a TiSiN film 14, i.e., a film made of ternary compound, is formed on the $SiO_2$ film 12 to a thickness of 25 nm. This film 14 serves as a diffusion barrier layer or bonding layer. Ti is used as a component of the film 14, for the following reason.

Figure 10:
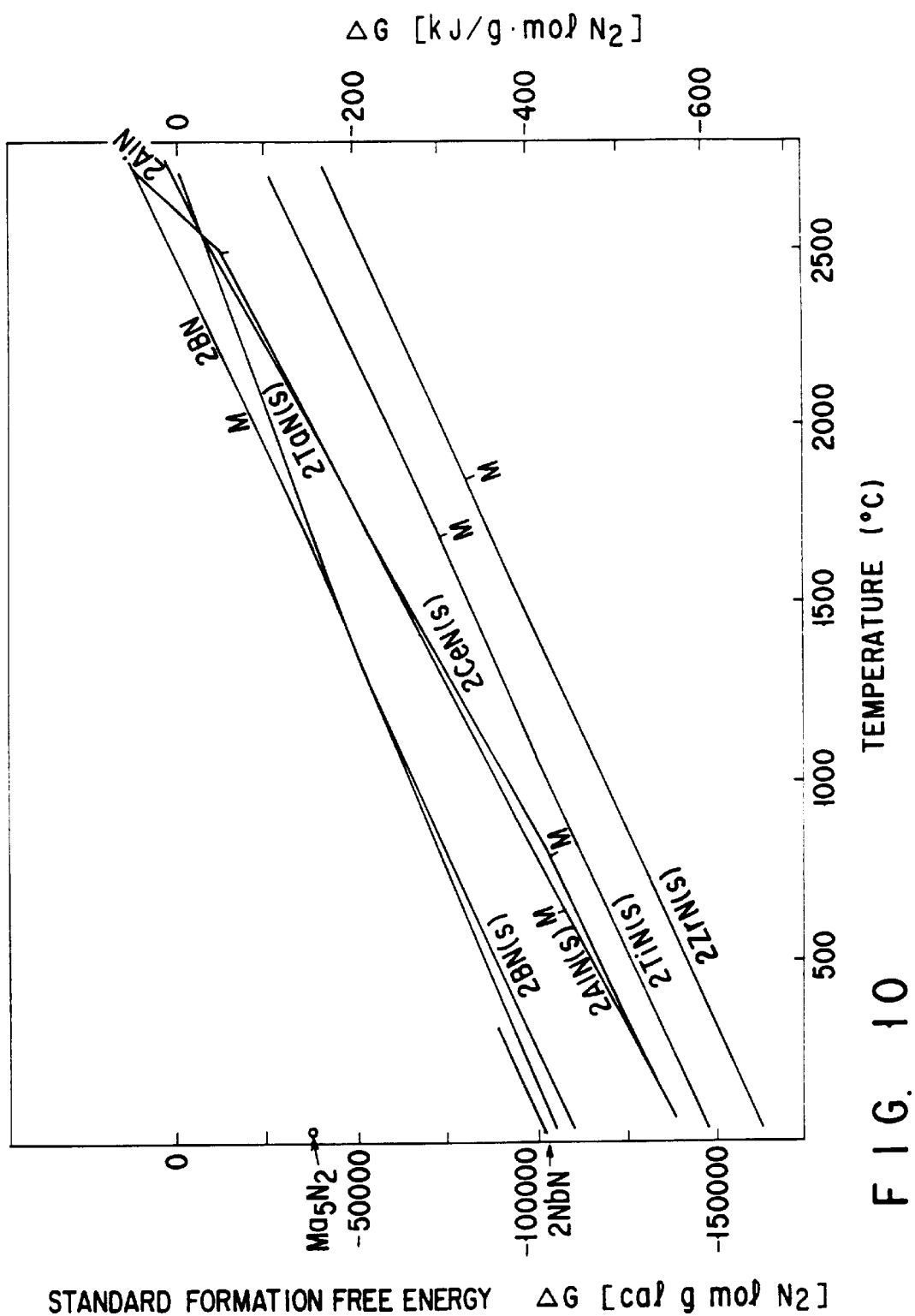
FIG. 10 is a graph showing how the normal free energies of formation of various nitrides depend upon temperature.

Amorphous $Ta_{36}Si_{14}N_{50}$ is known as material for barrier metal layers (E. Kolawa et al., Sputtered Ta—Si—N Diffusion Barriers in Cu Metallizations for Si, EDL. Vol. 12, No. 6, June 1991, pp. 321–323). Having Ta as one component, this alloy is relatively stable at high temperatures As seen from FIG. 10, the standard formation free energy of a nitride at any temperature by using Ti, Zr or the like is greater in absolute value than the standard formation free energy of a nitride at any temperature by using Ta. It follows that the bond between Ti, Zr or the like and N is more stable than the bond between Ta and N. Table 3 presented below shows the standard formation enthalpies ($-\Delta Hf$)(kcal/metal, atom) of various silicides. As can be understood from Table 3, the greater the enthalpy, the more stable the bond between the metal and silicon. Obviously, the standard formation enthalpy of a silicide of Ti, Zr, Hf or the like is greater in absolute value than the standard formation enthalpy of a silicide of Ta. Thus, it should be better combine Ti, Zr, Hf or the like, not Ta, with nitrogen or semiconductor to form a stable and effective barrier metal layer.

TABLE 3

| Si/M | 0.33 | 0.5 | 0.6 | 1.0 | 2 |
| --- | --- | --- | --- | --- | --- |
| M | $M_3Si$ | $M_2Si$ | $M_2Si_3$ | MSi | $MSi_2$ |
| Ti |  |  | 27.8 | 31 | 32 |
| Zr |  | 25 | 27.6 | 37 | 38 |
| Hf |  | 22.5 | 26.7 | 34 | 54 |
| Ta | 12.3 | 15 | 16.0 |  | 28.5 |

Barrier metal layers used in semiconductor devices must be made as thin as possible so that wiring layers each having a barrier metal layer may have sufficiently low resistance. Hence, it is demanded that barrier metal layers be provided that can function under sever conditions.

Ta—Si—N and Ti—Si—N were compared in terms of barrier property against Al. In the case of a Ta—Si—N barrier layer having a thickness of 30 nm, Ta reacted with Al at the melting point of Al (about 660° C.), forming a compound of Ta and Al. The Ta—Si—N barrier layer was not effective as a barrier to Al. On the other hand, Ti of Ti—Si—N barrier layer having the same thickness (i.e., 30 nm) did not react with Al at all. The Ti—Si—N barrier layer remained stable and probed better than the Ta—Si—N barrier layer. In other words, Ti is a barrier metal more stable than Ta. This is why the TiSiN film 14 is used as a barrier metal layer in Example 5.

More specifically, the TiSiN film 14 is formed by sputtering, by means of a DC magnetron sputtering apparatus, using a Ti silicide target, supplying argon at flow rate of 0 to 39 sccm and nitrogen at flow rate of 40 to 1 sccm, at pressure of 0.3 Pa and electric power of about 1 kW. The film 14 thus formed is an amorphous one, as was proved by examining an actually formed TiSiN film by means of XRD analysis. Further, the film 14 remained amorphous even when heated at 750° C. Its atomic ratio was stable even after annealed. Ternary compounds of Ti, Si and N, having different atomic ratios, were annealed at 600° C. for 30 minutes, and were examined for changes in their atomic ratios.

The results were as shown in the following Table 4.

TABLE 4

| Before Annealing | After Annealing |
|---|---|
| $TiSi_{2.2}N_{3.4}$ | $TiSi_{2.1}N_{2.9}$ |
| $TiSi_{2.2}N_{3.2}$ | $TiSi_{2.4}N_{2.8}$ |
| $TiSi_{2.1}N_{2.9}$ | $TiSi_{2.4}N_{3.1}$ |

The method of forming the TiSiN barrier layer is not limited to the one described above. For example, the sputtering may be performed by using Ti targets and, Si targets which are arranged in a mosaic pattern. Alternatively, the sputtering may be performed, using a collimator. Further, the TiSiN barrier may be formed by CVD method, using $TiCl_3$ gas, $NH_3$ gas and $SiH_4$ gas. Still further, it may be formed by CVD method, using a mixed gas atmosphere consisting an organic gas source such as TMAT (Tetrakis-dimethyl-Amino Titanium) and $SiH_4$ gas, $SiCl_4$ gas or $SiH_xCl_y$ gas, at the temperature of 350° C. and the pressure of 0.5 Torr. The CVD method may be preformed by using plasma or excited species. Whatever method can be employed, provided the resultant film is made of a ternary compound of Ti, Si and N. Generally, CVD method is desirable for forming a TiSiN film which fills up grooves and holes having a high aspect ratio, since this method can achieve conformal deposition.

The resistivity of TiSiN depends on the Ti—Si—N composition. To be more specific, the smaller the atomic ratio of N, the lower the resistivity. Also, there is the trend that the resistivity is inversely proportional to the partial pressure of $N_2$ during the sputtering, as can be seen from FIG. 11A. Further, as shown in FIGS. 11B and 11C, the greater the power, the lower the resistivity. Any TiSiN film is amorphous if formed by sputtering. If the TiSiN film has an extremely low $N_2$ concentration, it will be crystallized when annealed (at about 600° C.), and its barrier property will decrease.

However, the TiSiN film having a relatively high resistance will not influence the resistance of the wiring layer incorporated the TiSiN film, provided that it is thin. Thus, as long as the TiSiN film is thin enough to function as a barrier layer, the Ti—Si—N composition need not be limited. Nonetheless, if the TiSiN film is incorporated in an LSI wiring layer, it is desired that its resistance be as low as possible in order to minimize the contact resistance of the LSI wiring layer.

TiSiN films having different Si/Ti atomic ratios X were formed, and the compression stresses on them were measured. The results were as represented in FIG. 12. The graph of FIG. 12 is very similar to the graph of FIG. 4, but is different in that the stress was measured at more sampling points. As is evident from FIG. 12, it is desired that the atomic ratio of Si to Ti be 0.7 or more, or preferably 1 or more, in order to reduce the compression stress on the TiSiN film (i.e., the load on the semiconductor element incorporating the TiSiN film. If the TiSiN film is used in such a way that the load resulting from the compression stress makes no problem, its Si/Ti atomic ratio x is not limited at all.

To render the TiSiN film more adhesive, a thin Ti film may be formed on the TiSiN film. TiSiN has adhesivity far greater than than those of TiN and TiN/Ti. When a structure comprising an $SiO_2$ or $Si_3N_4$ layer and a TiN film and a TiSiN film both deposited on that underlayer is etched by ClayerHP (Chemomechanical Polishing) method, applying a pressure of 400 g/$cm^2$ on the structure and using silica as polishing grains, the TiN film peels from the underlayer, but the TiSiN film does not. TiSiN is more stable and more easy to process than TiN.

As indicated above, the ternary compound of Ti, Si and N is amorphous. The stress on a film of TiSiN is relatively small (e.g., $1.7 \times 10^9$ dyn/$cm^2$), smaller than the stress on a crystalline film. Hence, a TiSiN film incorporated in a semiconductor device is less likely to impose adverse influence on the semiconductor device. As the term "amorphous" indicates, the TiSiN film has no crystal grain boundaries (like a glass layer). Having no crystal grain boundaries, the TiSiN film can make an ideal barrier to impurities, unlike the polycrystalline films hitherto used (e.g., TiN films and TiW films) which have crystal grain boundaries.

Of amorphous alloys, some do not contain nitrogen. They are NiNb, Mgzn, CuZr and the like. These amorphous alloys have been formed by unstable processing such as quenching. Inevitably, they are thermally unstable and can readily crystallized at high temperatures. To make matters worse, they are liable to react with the metal of a wiring layer to form an intermetallic compound, which would increase the resistance of the wiring layer. NiNb, Mgzn, CuZr and the like are not suitable as materials for barrier layers. The best possible material for barrier layers is a compound of refractory metal, semiconductor and nitrogen.

After the TiSiN film 14 has been formed on the $SiO_2$ film 12 as shown in FIG. 3B, a Cu film 15, which will be processed into main wiring layer, is deposited to a thickness of 400 nm by sputtering or the like on the TiSiN film 14, as is illustrated in FIG. 3C. Since the TiSiN film 14 and the Cu film 15 are sequentially deposited without being exposed to the atmosphere, the TiSiN film 14 is far more adhesive to the Cu film 15 than a film of TiN or the like. Firmly adhering to the Cu film 15, TiSiN is not repelled or does not coagulate in the subsequent step of annealing, despite the surface tension of Cu. Therefore, TiSiN can readily fill grooves or holes made in the surface of the $SiO_2$ film 12.

Next, as shown in FIG. 3D, the structure of FIG. 3C is annealed at 200 to 700° C. during or after the sputtering, thereby re-flowing Cu into the groove 13. The upper surface of the Cu film 15 is thereby made flat. Then, the resultant structure (FIG. 3D) is etched at its upper surface, removing the TiSiN film 14 and the Cu film 15, by except those portions located in the groove 13, as is illustrated in FIG. 3E. A buried wiring layer made of Cu is thereby formed in the surface of the $SiO_2$ film 12. This etching process may be RIE method or ion milling, or may be replaced by CMP or polishing. The Cu wiring thus obtained has high reliability.

In order to determine whether or not the TiSiN film 14 is effective as a barrier against Cu, the structure of FIG. 3E was actually formed and put to junction-leakage test. In the test, the area of contact between the TiSiN film and the Cu film was set at 300×80 $\mu m^2$, and the structure was annealed at 600° C. for 30 minutes. Even after the annealing in the forming gas, the leakage current did not increase at a reverse bias. Thus, the TiSiN film exhibited good barrier property. The structure was further examined by atomic absorption analysis, for Cu diffusion into the silicon substrate. Even after the annealing in the forming gas, the Cu concentration in the silicon substrate was equal to or less than the detection limit (i.e., $2 \times 10^{12}/cm^3$). This means that the TiSiN film had good barrier property. It was also found that a TiSiN film served effectively as a barrier even if its thickness is 5 nm.

Therefore, the TiSiN film 14 can be regarded an excellent barrier metal layer, because it prevents Cu from diffusing through it, firmly adheres to the $SiO_2$ film 12 (the lower layer), and has low contact resistance with the Cu film (the upper layer) and the $SiO_2$ film 12. In addition, the TiSiN film 14 has sufficient barrier property even if made thin. Since the TiSiN film 14 and the Cu film 15 are sequentially formed by sputtering, the method of forming the wiring layer can be simplified.

The wiring layer of Example 5 is a buried one. Instead, a wiring layer may be formed on the $SiO_2$ film 12, not in a groove 13 made in the surface of the film 12, by patterning the barrier metal layer made of of ternary compound of a metal (Ti, Zr or Hf), semiconductor (e.g., silicon) and nitrogen and the Cu film formed on the barrier metal layer. Further, Si used as semiconductor may be replaced any other IV-group element or a compound semiconductor such as III-V, II-VI, II-IV-VI, II-IV-V, III-IV-VI, I-III-VI or II-V-VII. The Cu film used as main wiring layer may be replaced by a film of Al, Au, Ag or W, or by a film of an alloy of two or more of these metals.

EXAMPLE 6

FIG. 13A to 13D are sectional views, explaining the steps of forming a wiring layer in a semiconductor device of the sixth example of the present invention.

Figure 13A:
FIGS. 13A to 13D are sectional views, explaining the steps of forming a wiring layer in a semiconductor device according to a sixth example of the present invention.
Figure 13B:
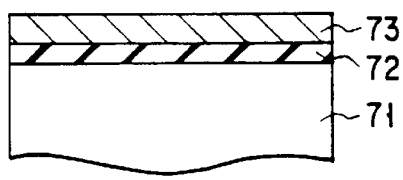

At first, as shown in FIG. 13A, an $SiO_2$ or ONO ($SiO_2$/$Si_3N_4$/$SiO_2$) film 72, used as a gate insulating film, is formed on a Si substrate 71 to a thickness of 60 nm. Then, as shown in FIG. 13B, an amorphous alloy film 73 made of Ti, Si and N is formed on the film 72. Generally, an amorphous film has relatively smooth surfaces and is not likely to generate surface states. Unlike a polycrystalline film, an amorphous film has a uniform work function because of the absence of crystal axes. It therefore has a stable breakdown voltage and imparts stable characteristics to the semiconductor device incorporating it.

Figure 13C:
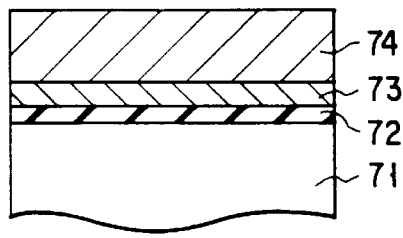
Figure 13D:
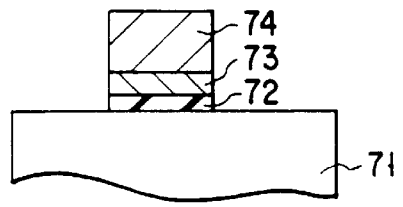

Next, as shown in FIG. 13C, a W film 74 is formed on the alloy film 73 to a thickness of 100 to 150 nm. Being amorphous, the alloy film 73 made of Ti, Si and N acts as an effective barrier to tungsten (W), preventing tungsten from diffusing from the W film 74 into the gate insulating film 72. This done, as shown in FIG. 13D, the gate insulting film 72, the alloy film 73 and the W film 74 are processed by photolithography and RIE method, thereby forming a gate electrode structure.

MOSFETs of n-channel and p-channel types, each having a gate electrode structure of this type, were manufactured and tested Their threshold voltage was found to be as low as 0.6 eV, and they were considered suitable for low-voltage operation If a polysilicon layer were formed, instead of the amorphous alloy film 73, on the gate insulating film 72, this layer should be processed into $n^+$-type or $p^+$-type polysilicon layer in order to impart such a low threshold voltage to the n-channel or p-channel MOSFET. In view of this, the gate electrode of Example 6 helps to greatly reduce the steps of manufacturing the MOSFET.

In Example 6, the alloy of Ti, Si and S, which is amorphous, is used as amorphous metal. Instead, any other amorphous metal can be used. Further, tungsten (W) used as material for the gate electrode may be replaced by Al, Ag, Au or Cu, or an alloy of any of these metals.

EXAMPLE 7

FIG. 14A to 14D are sectional views, explaining the steps of forming wiring layers in a semiconductor device according to the seventh example of the invention.

Figure 14A:
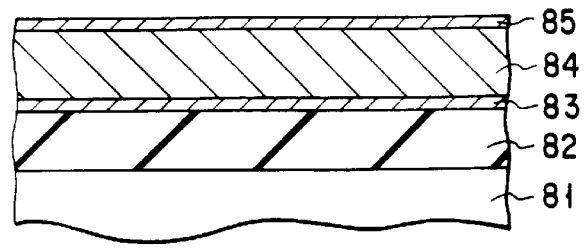
FIGS. 14A to 14D are sectional views, explaining the steps of forming wiring layers in a semiconductor device according to a seventh example of the invention.

First, as shown in FIG. 14A, an $SiO_2$ film 82 is formed on a semiconductor substrate 81. Then, a TiSiN film 83, i.e., a diffusion barrier film or bonding layer made of a ternary compound, is formed on the $SiO_2$ film 82 by sputtering to a thickness of 10 nm. An Al—Cu or Al—Si—Cu alloy film 84, which is used as main wiring layer, is formed on the TiSiN film 83, to a thickness of 400 nm. Further, a film 85 made of a ternary compound of Ti, Si and N is formed on the alloy film 84 by sputtering, to a thickness of 10 nm. The film 85 has a lower reflectance than Al and Cu, which is sufficiently low to all wavelengths of exposure light used in photolithography. Hence, the film is effective in controlling the reflection of exposure light to be applied in photolithography.

Figure 14B:
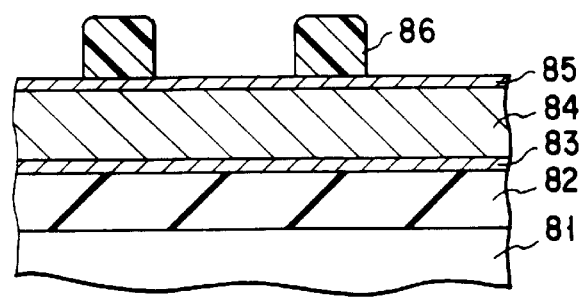

Next, a photoresist film is formed on the film 85. As shown in FIG. 14B, the photoresist film is patterned into a resist pattern 86 by means of photolithography. Unlike TiN, the ternary compound of Ti, Si and N is resistant to SH (mixture solution of hydrogen peroxide and sulfuric acid). Therefore, the resist pattern 86 can be easily peeled from the upper barrier metal layer 85, if necessary as in the case where photolithography must be repeated.

Figure 14C:
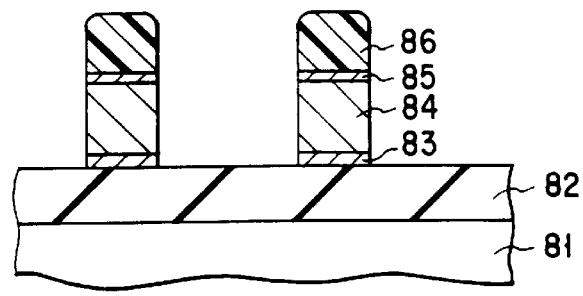

Then, as shown in FIG. 14C, the main wiring layer 84 and the barrier metal layers 83 and 85 are processed by RIE method using chlorine-based gas, by ion milling or by wet etching using an acid, or by a similar method. Since the ternary compound can be etched with diluted fluoric acid, diluted fluoric acid is an effective wet-etching agent to the barrier metal layers 83 and 85.

Figure 14D:
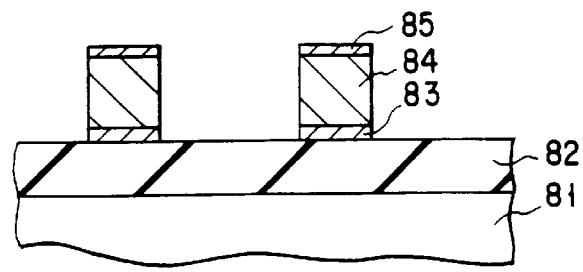

Next, as shown in FIG. 14D, the resist pattern 86 is removed by wet etching using organic solvent or down-flow ashing using a mixture of oxygen gas and fluoride-based gas, by RIE method using oxygen gas, or by plasma ashing wherein the pattern 86 is exposed to oxygen plasma. As a result, wiring layers are formed, each having two films 83 and 85 which are made of ternary compound of Ti, Si and N and which function as barrier metal layers.

EXAMPLE 8

Figure 15A:
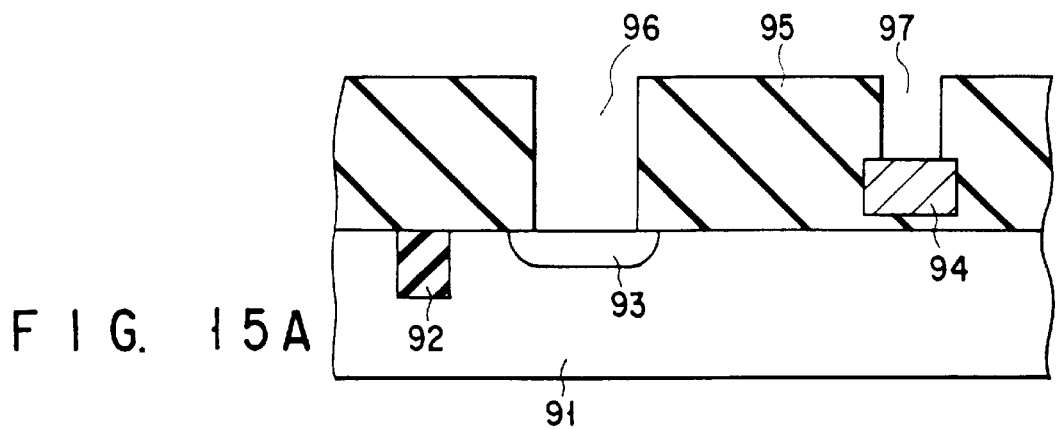
FIGS. 15A to 15C are sectional views, explaining the steps of forming wiring layers in a semiconductor device according to an eighth example of this invention.
Figure 15B:
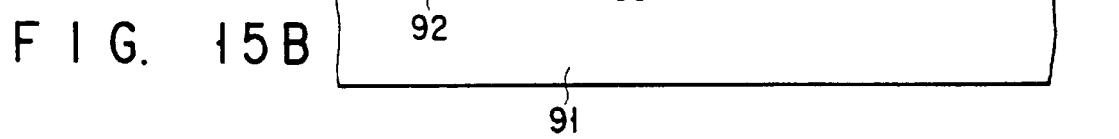
Figure 15C:
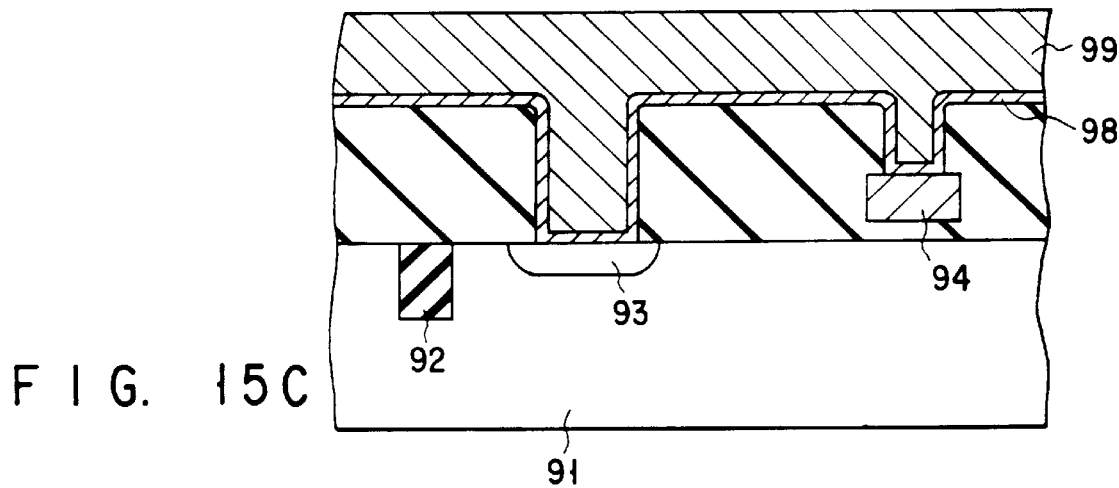

FIG. 15A to 15C are sectional views, explaining the steps of forming wiring layers in a semiconductor device according to the eighth example of this invention.

As shown in FIG. 15A, a semiconductor substrate 91 containing an impurity of a first conductivity type is prepared. An element-isolating film 92 and a diffusion layer 93 of the second conductivity type are formed in the upper surface of the substrate 91. A conductive film 94 is formed, which has an upper layer made of W or W silicide. An inter-layer insulating film 95 is formed on the resultant structure, covering the substrate 91 and the conductive film 94. Contact holes 96 and 97 are formed in the insulating film 95, exposing the diffusion layer 93 and the conductive film 94.

Thereafter, an alloy film according to the invention is formed on the structure of FIG. 15A. More specifically, as shown in FIG. 15B, a Ti—Si—N or Zr—Si—N or Hf—Si—N alloy film 98 is formed on the structure to a thickness of 5 to 100 nm. The thickness of the film 98 is changed in accordance with the aspect ratio (i.e., the ratio of diameter to depth) of the contact holes 96 and 97. The greater the aspect ratio, the thicker the film 98 should be. Next, the structure is transferred to a sputtering chamber while maintaining vacuum, and an Al film 99 is formed on the alloy film 89 to a thickness of 0.4 to 0.8 $\mu$m, by sputtering in the sputtering chamber.

Next, the Al film 99 is heated at 500 to 600° C. for 30 seconds to 5 minutes. The heating is performed in a vacuum so that the surface of the Al film 99 may not be oxidized. The surface of the Al film 99 is thereby made flat. The Al film 99 is then processed into a desired wiring pattern. Thus, contacts and wires are formed at the same time.

Generally, an Al film is heated by using a barrier metal layer which has a multi-layer structure of TiN/Ti or Ti/TiN/Ti—for two reasons. At first, since the contact resistance between a TiN layer and an Si layer is high, it is necessary to form silicide at the interface between the TiN and Si layers by interposing a Ti film between these layers. Second, a Ti layer must be interposed between the the TiN and Si layers since the wettability of aluminum decreases because the surface of the the TiN layer has been oxidized to prevent the forming of grain boundaries. The wiring structure according to the eighth example needs to have only one barrier metal layer. Thus, it serves to greatly decrease the steps of manufacturing the semiconductor device incorporating it and, hence, to reduce the manufacturing cost of the device.

The wiring layer of the any example described above, which has a barrier metal layer, may be formed by any method other than the method described above. Further, the barrier metal layer can be made of a compound of refractory metal (Zr, Hf, W, Mo or the like), semiconductor and nitrogen (N), instead of ternary compound of Ti, Si and N. Moreover, Si used as semiconductor may be replaced any other IV-group element or a compound semiconductor such as III-V, II-VI, II-IV-VI, II-IV-V, III-IV-VI, I-III-VI or II-V-VII. The wiring layer can be replaced by a film of Cu, Al, Ag, Au, W, or by a film of an alloy of two or more of these metals.

In Examples 1 to 8, the barrier metal layer is incorporated in a wiring layer or an electrode. Nonetheless, the barrier metal layer may be applied to contacts each connecting a wiring layer and another wiring layer or a semiconductor device.

EXAMPLE 9

Figure 16:
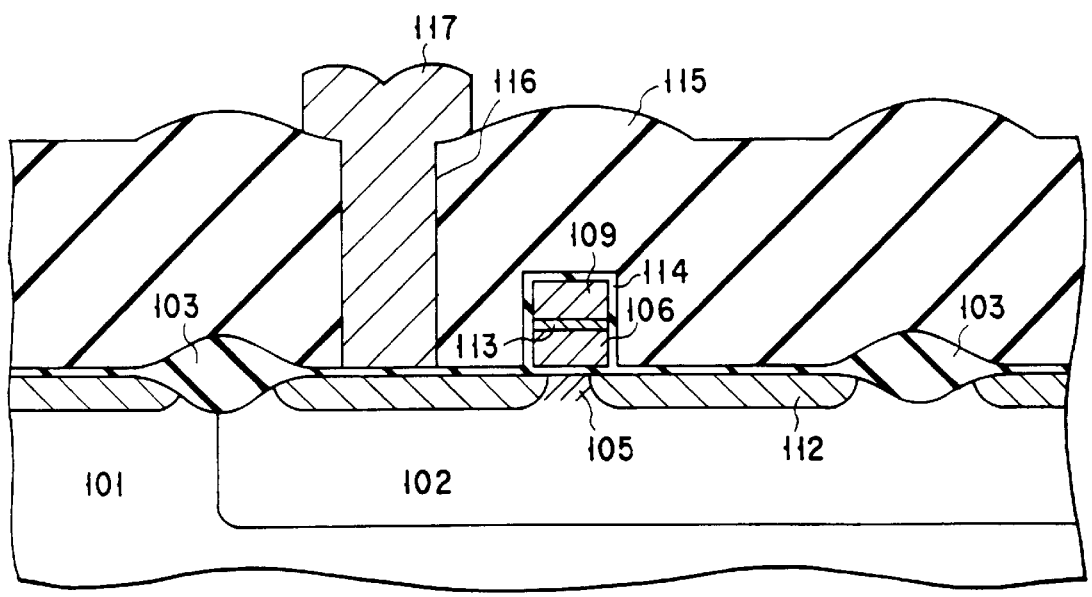
FIG. 16 is a schematic sectional view showing a semiconductor device according to a ninth example of the present invention.

FIG. 16 is a schematic sectional view showing a semiconductor device according to a ninth example of the present invention. FIG. 17A to 17J are sectional views, explaining the steps of forming this semiconductor device.

Figure 17A:
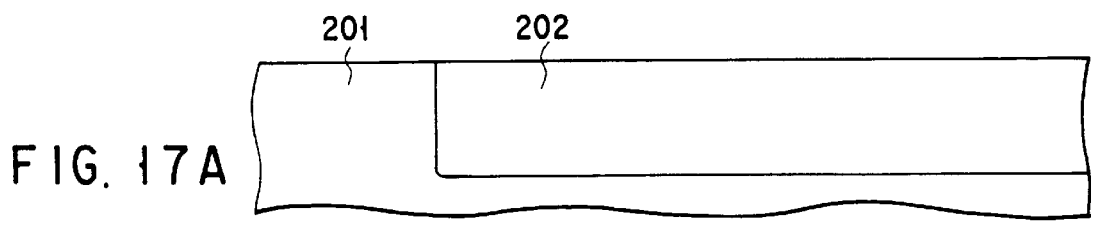
Figure 17B:
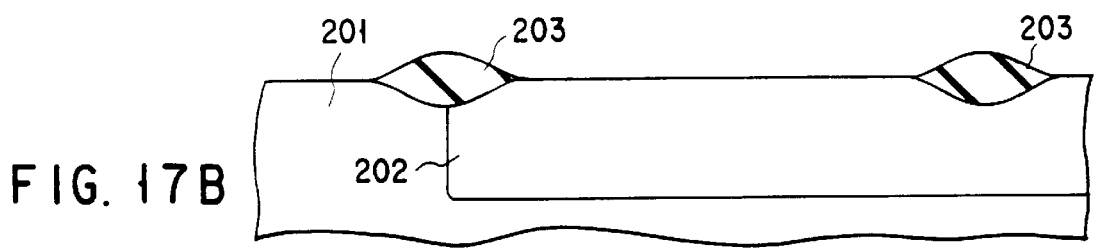

First, as shown in FIG. 17A, boron (B), is ion-implanted into a silicon substrate 201 and subsequently diffused by heating, thereby forming a p-type region 202 which has a depth of about 1 μm. Then, as shown in FIG. 17B, an oxide film 203 about 600 nm thick is formed on prescribed parts of the silicon substrate 201, thus forming element-isolating region. Thereafter, as shown in FIG. 17C, an oxide film 204 about 10 nm thick is formed on the resultant structure, and ions 205 are implanted into the silicon substrate 201 and the p-type region 202.

Figure 17C:
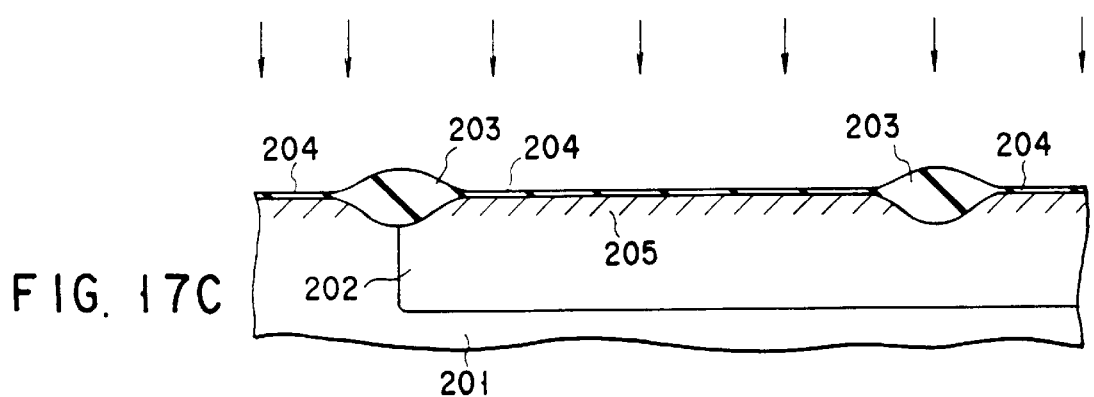

Next, the oxide film 204 is removed from the structure illustrated in FIG. 17C. Then, as shown in FIG. 17D, a gate oxide film 206 about 10 nm thick is formed on the structure, and a polysilicon film 207 about 200 nm thick is formed on the gate oxide film 206. The resultant structure is heated in POCl$_3$ atmosphere at 850° C. for about 60 minutes, thereby introducing phosphorus (P) into the polysilicon film 207. Instead of phosphorus, another n-type impurity or a p-type impurity may be introduced into the polysilicon film 207. Which impurity should be introduced depends on the threshold voltage desirable for the transistor to be manufactured. The impurity may be introduced from either a vapor-phase source or a solid-phase source. Alternatively, ions of the impurity may be implanted into the polysilicon film 207.

whichever method is employed, the impurity should be introduced in such an amount that the film 207 has an impurity concentration of about $2 \times 10^{20}$ cm$^{-3}$ or more.

Then, the oxide film naturally formed during the heating of the structure is removed from the polysilicon film 207. The structure is subjected to chemical sputtering using a WSi$_x$ target, in an atmosphere containing Ar and N$_2$. A SWi$_x$H$_y$ film 208 about 5 nm thick is thereby formed chemical sputtering is performed as illustrated in FIG. 17E. The SWi$_x$H$_y$ film 208 may be formed by means of CVD method using a gas system such as WSi$_6$+SiH$_4$+NH$_3$. Then, a WSi$_x$ film 209 having a thickness of 200 to 300 nm is formed by sputtering using a WSi$_x$ target in an Ar atmosphere.

Next, as shown in FIG. 17F, a resist pattern 210 is formed by photolithography, in preparation for forming a gate electrode or a wiring layer. Using the resist pattern 210 as a mask, the polysilicon film 207, the SWi$_x$H$_y$ film 208 and the WSi$_x$ film 209 are patterned by RIE method as illustrated in FIG. 17G.

Further, as shown in FIG. 17G, the resist pattern 210 is removed by means of an asher, thereby forming a gate electrode or a wiring layer. The resultant structure is subjected to oxidation in an oxygen (O$_2$) atmosphere at 800° C. for 30 minutes. As a result, an oxide film 211 is formed on the substrate 201 and on the top and sides of the gate electrode or the wiring layer. The oxide film 211 thus formed serves to prevent forming of defects in the substrate 201 in the subsequent heating step, despite the impurity ions have been directly implanted into the silicon substrate 201.

The device formed in this case is an nMOS device. To manufacture a CMOS device, a resist mask is formed, and ions are implanted into the substrate 201 through the resist mask. If this is the case, the oxide film 211 prevents the substrate 201 from being contaminated with the resist In the subsequent heating step, a part of the SWi$_x$H$_y$ film 208 reacts with the oxide film naturally formed on the polysilicon film 207. A WSi$_x$N$_y$O$_z$ film 213 is thereby formed. This film 213 possesses barrier property.

Next, arsenic (As) is ion-implanted into the substrate 201 and the p-type region 202 at 60 KeV to a concentration of $5 \times 10^{15}$ cm$^{-3}$. The resultant structure is subjected to oxidation in an oxygen (O$_2$) atmosphere at 900° C. for about 60 minutes, thereby forming an oxide film 214 as illustrated in FIG. 17I. Thanks to this oxidation, the end portions of the oxide film on the gate electrode become thicker than the middle portion, thus improving the gate breakdown voltage, as has been described in "Description of the Related Art." The extend to which the oxidation should be performed depends on the gate breakdown voltage desired of the transistor to be manufactured.

Also, it is necessary to perform this oxidation such that the atomic ratio x of silicon in the WSi$_x$ film 209 does not fall below 1.8. Even if x is slightly less than 2 (i.e., the stoichiometric amount of Si), the film 209 will not absorb silicon from the polysilicon film 207, and the atomic ratio of tungsten (W), which is greater than normal value, increases the stress but to only 1 to $3 \times 10^9$ dyn/cm$^2$. If the WSi$_x$ film 209 is more W-rich than WSi$_{1.8}$, there will be formed WO$_3$, inevitably increasing the volume of the WSi$_x$ film 209 and possibly causing the exfoliation of the gate electrode. Thus, the oxidation must be carried out not to make the atomic ratio x of WSi$_x$ fall below 1.8, in consideration of the thickness and width of the WSi$_x$ film 209 (i.e., the gate electrode).

Thereafter, as shown in FIG. 17J, an inter-layer insulating layer 215 is deposited on the structure, and an contact hole 216 is made in a desired part of the insulating layer 215. Further, aluminum (Al) is deposited on the insulating layer 215 and in the contact hole 216. The resultant Al film is patterned, forming a wire 217.

Figure 18:
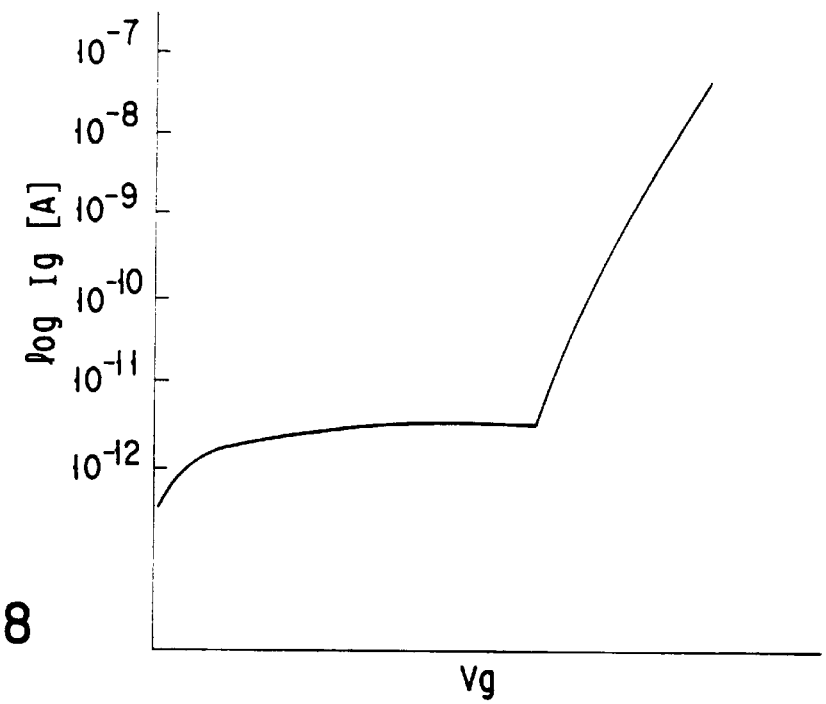
FIG. 18 is a graph representing the the Ig-vg characteristic of a gate electrode formed by a method according to the present invention.

FIG. 18 is a graph representing the the Ig-vg characteristic of a gate electrode formed by a method according to the present invention. As is evident from FIG. 18, the gate breakdown voltage is not deteriorated as in the conventional semiconductor device.

Explained above is a method of manufacturing an nMOS device. Nonetheless, a playerHOS device can be manufactured, merely by exchanging the n-type impurity to be ion-implanted, with the p-type impurity also to be ion-implanted. Further, a CMOS device can be manufactured, merely by forming a resist mask on a desired part of the structure and then implanting impurity ions into the structure using the resist mask.

EXAMPLE 10

FIG. 19A to 19J are sectional views, explaining the steps of forming the semiconductor device according to the tenth example of the invention.

Figure 19A:
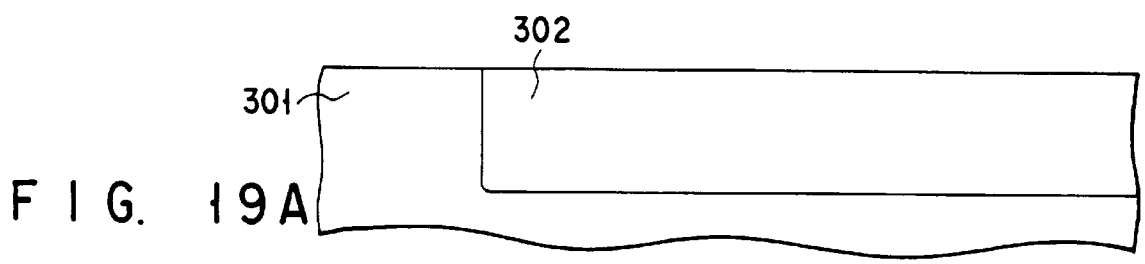
FIGS. 19A to 19J are sectional views, explaining the steps of forming a semiconductor device according to a tenth example of the invention.
Figure 19B:
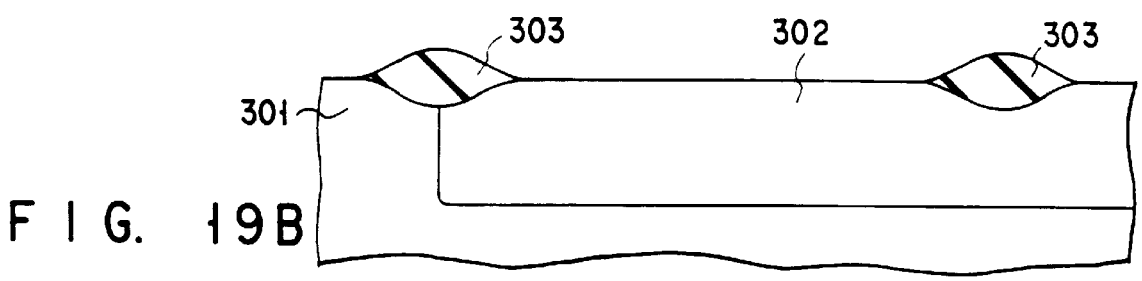
Figure 19C:
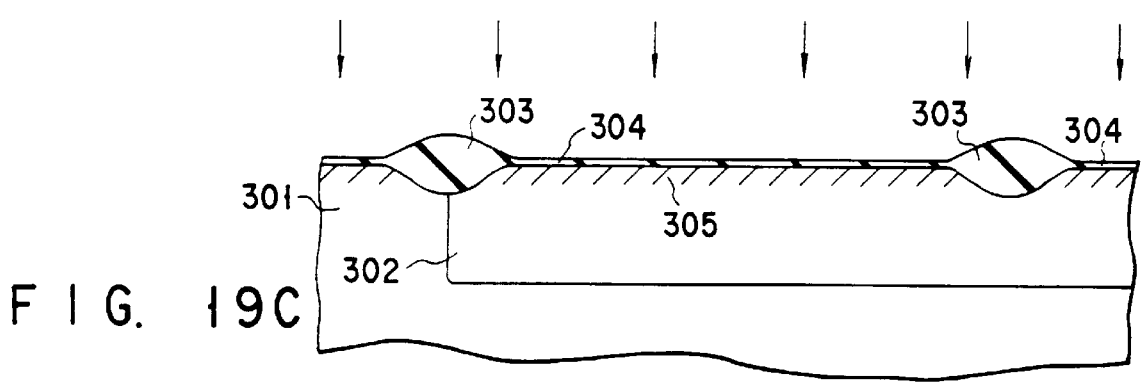
Figure 19D:
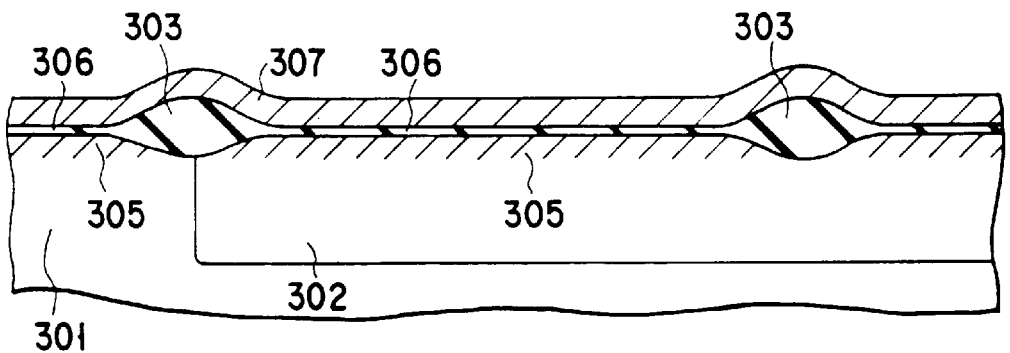

At first, as shown in FIGS. 19A, 19B and 19C and in exactly the same way as in Example 9, a p-type region 302 and an element-isolating oxide film 303 are formed in the surface of a silicon substrate 301, an oxide film 304 is then formed on the resultant structure, and ions 305 are implanted into the structure to set a value for the threshold voltage of the transistor to be manufactured. Further, as in Example 9, the oxide film 304 is removed, and a gate oxide film 206 is formed on the structure Next, as shown in FIG. 19D, a polysilicon film 307 is formed on the gate oxide film 206. The structure of FIG. 19D is heated in an atmosphere of $POCl_3$, thereby introducing phosphorus (P) into the polysilicon film 307.

Figure 19E:
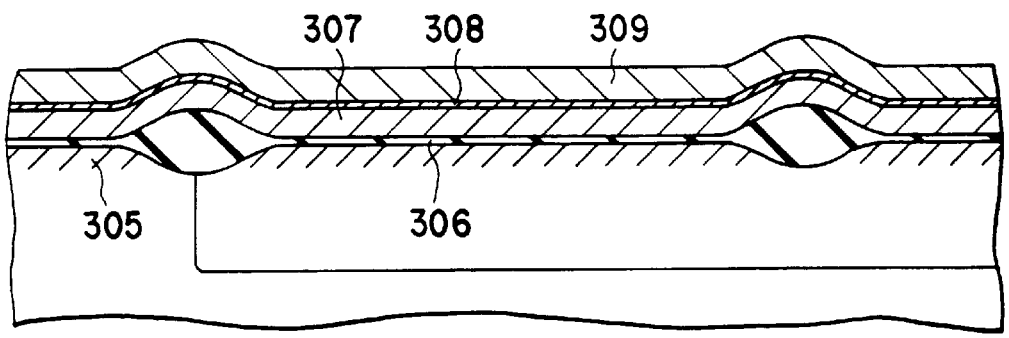

Next, the structure is treated with diluted fluoric acid or like, removing the oxide film naturally formed during the heating of the structure is removed from the polysilicon film 307. Chemical sputtering is performed, using a W target in an atmosphere containing Ar and $N_2$. A $WN_x$ film 308 about 5 nm thick is thereby formed on the polysilicon film 307, as illustrated in FIG. 19E. Then, the structure is subjected to sputtering in an Ar atmosphere, using a $WSi_x$ target, thereby forming a $WSi_x$ film 309 having a thickness of about 200 nm.

Figure 19F:
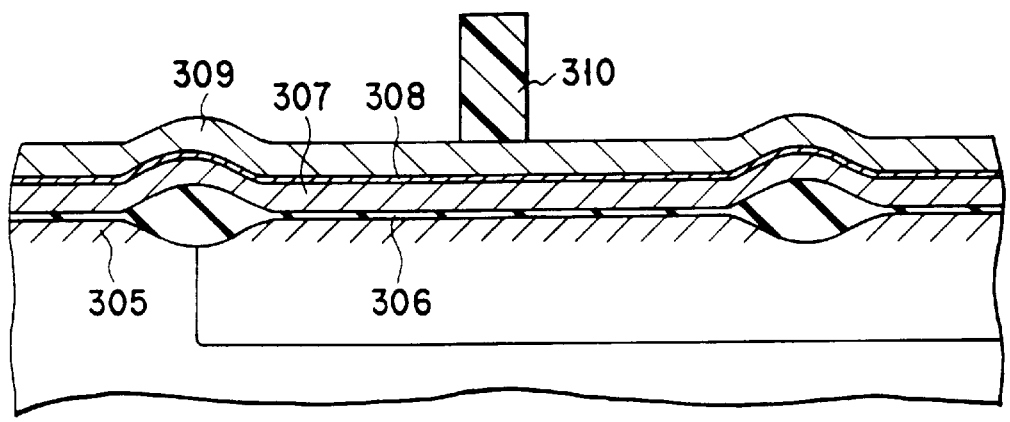

Then, as shown in FIG. 19F, a resist pattern 310 having the same shape as a gate electrode to be formed is formed on the $WSi_x$ film 309 by means of photolithography. Using the resist pattern 310 as mask, the $WSi_x$ film 309, the $WN_x$ film 308 and the polysilicon film 307 are patterned by means of RIE method.

Figure 19G:
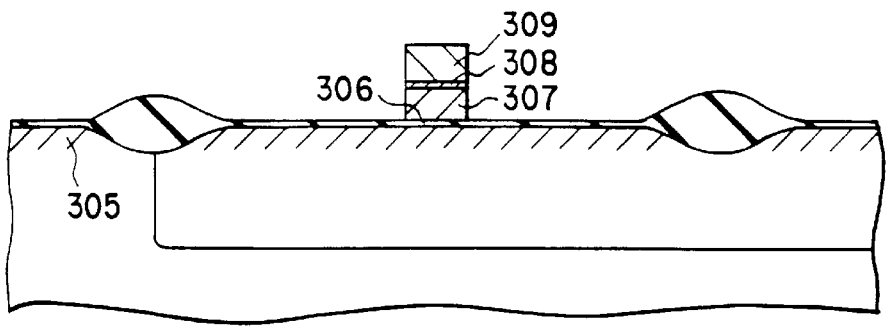
Figure 19H:
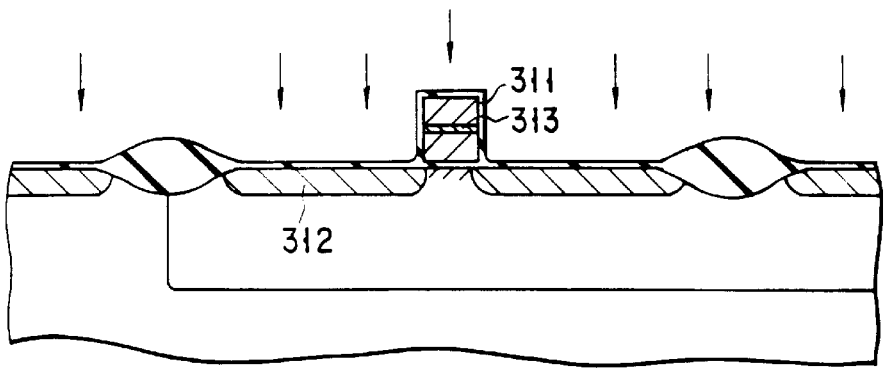

Next, as shown in FIG. 19G, the resist pattern 310 is removed by means of an asher, thereby forming a gate electrode or a wiring layer. The resultant structure is subjected to oxidation in an oxygen ($O_2$) atmosphere at 800° C. for 30 minutes. As a result, an oxide film 311 is formed on the substrate 301 and on the top and sides of the gate electrode or the wiring layer. During this thermal oxidation, a part of the $WN_x$ film 308 reacts with the the polysilicon of the film 307 and also with the oxide film naturally formed on the polysilicon film 307. A $WSi_xN_y$ or $WSi_xN_yO_z$ film 312 is thereby formed.

Figure 19I:
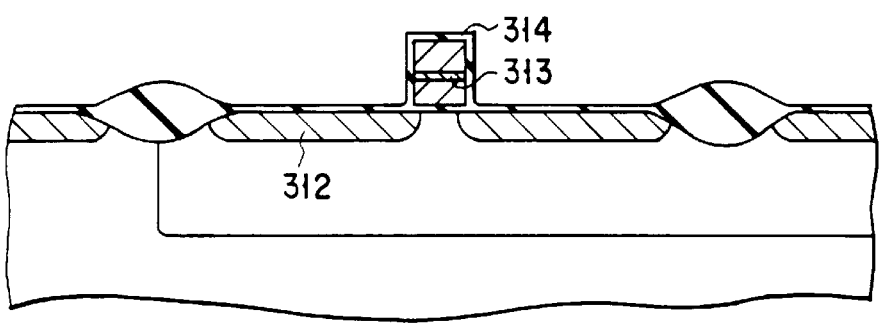

Further, arsenic (As) is ion-implanted into the substrate 301 and the p-type region 302 at 60 KeV to a concentration of $5 \times 10^{15}$ cm$^{-3}$, thereby forming diffusion layers 312. The resultant structure is subjected to oxidation in an oxygen ($O_2$) atmosphere at 900° C. for about 60 minutes, thereby forming an oxide film 314 as illustrated in FIG. 19I. Thanks to this oxidation, the end portions of the oxide film on the gate electrode become thicker than the middle portion, thus improving the gate breakdown voltage, as has been described in "Description of the Related Art." The extend to which the oxidation should be performed depends on the gate breakdown voltage desired of the transistor to be manufactured.

Figure 19J:
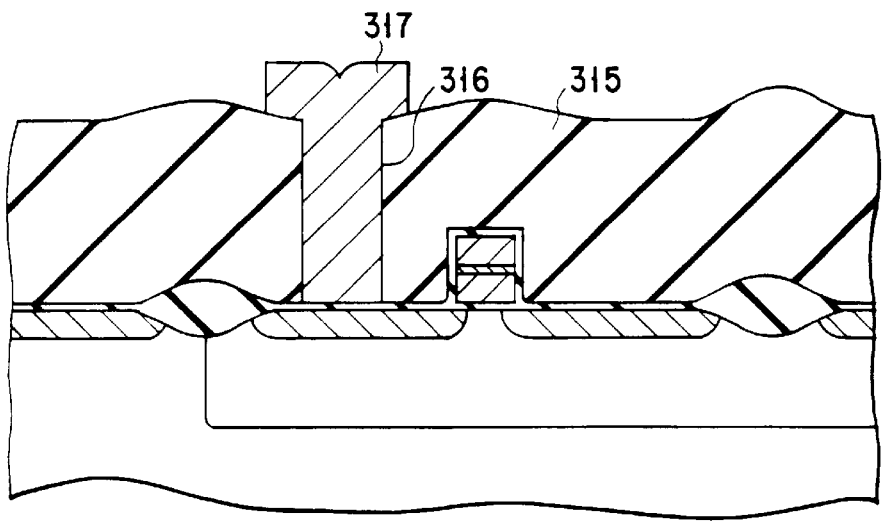

Thereafter, as shown in FIG. 19J, an inter-layer insulating layer 315 is deposited on the structure, and an contact hole 316 is made in a desired part of the insulating layer 215. Further, aluminum (Al) is deposited on the insulating layer 315 and in the contact hole 316. The resultant Al film is patterned, forming a wiring 317.

EXAMPLE 11

FIG. 20A to 20L are sectional views, explaining the steps of forming a semiconductor device according to the eleventh example of the invention.

Figure 20A:
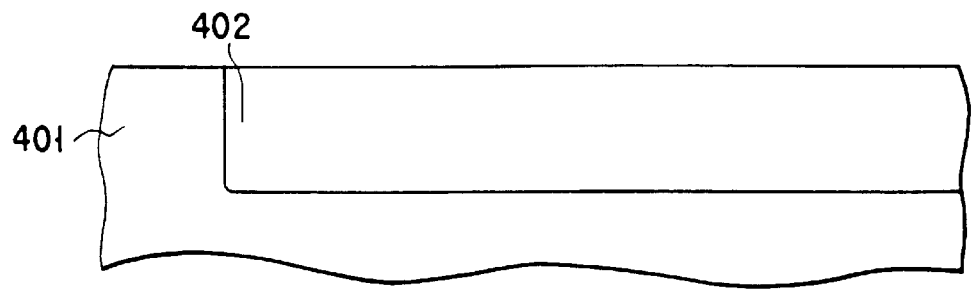
FIGS. 20A to 20L are sectional views, explaining the steps of forming a semiconductor device according to an eleventh example of the invention.
Figure 20B:
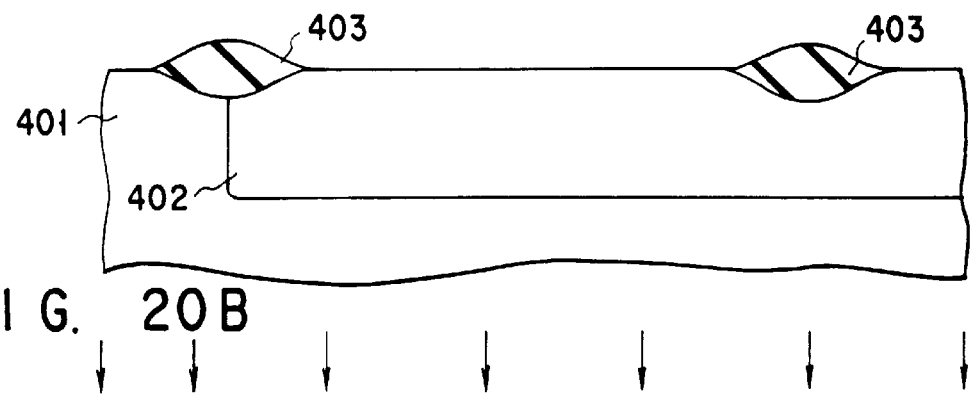
Figure 20C:
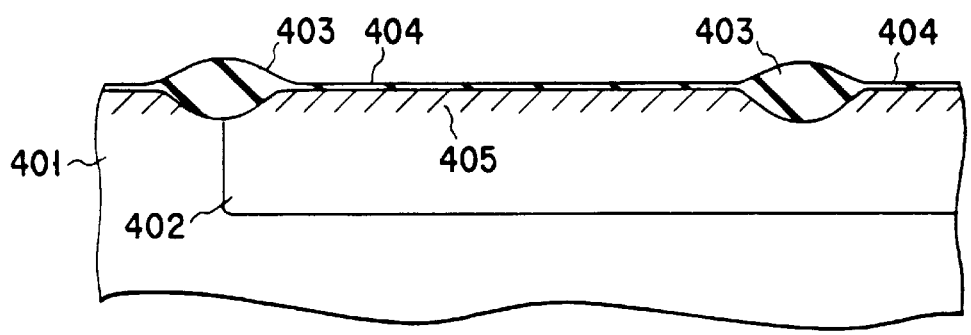

First, as shown in FIGS. 20A, 20B and 20C and in exactly the same way as in Example 9, a p-type region 402 and an element-isolating oxide film 403 are formed in the surface of a silicon substrate 401, an oxide film 404 is then formed on the resultant structure, and ions 405 are implanted into the structure to set a value for the threshold voltage of the transistor to be manufactured.

Figure 20D:
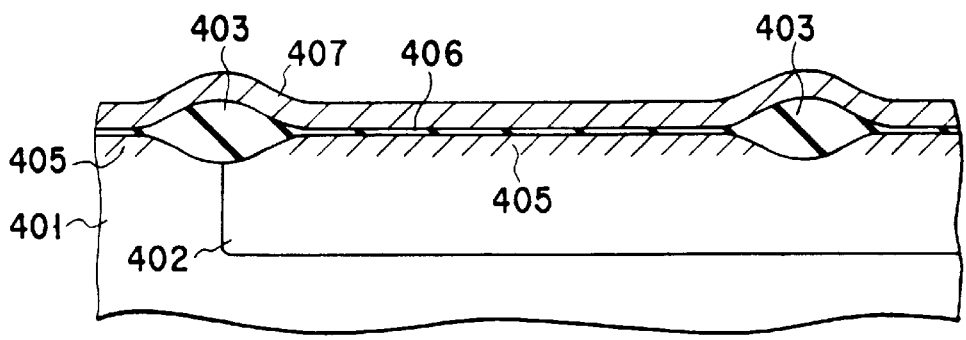

Then, as depicted in FIG. 20D, the oxide film 404 is removed, and a tunnel oxide film 406 about 10 nm thick is formed on the silicon substrate 401. The resultant structure is subjected to nitrization in an $NH_3$ atmosphere at 1000° C. for about 30 seconds and further to re-oxidation at 1000° C. for about 30 seconds. The nitrization and the re-oxidation serve to decrease the surface states of the tunnel oxide film 406 and the trapping in the tunnel oxide film 406. Then, a polysilicon film 407 having a thickness of 200 nm is formed on the entire surface of the resultant structure The structure is heated in $POCl_3$ atmosphere at 850° C. for about 60 minutes, thereby introducing phosphorus (P) into the polysilicon film 407.

Figure 20E:
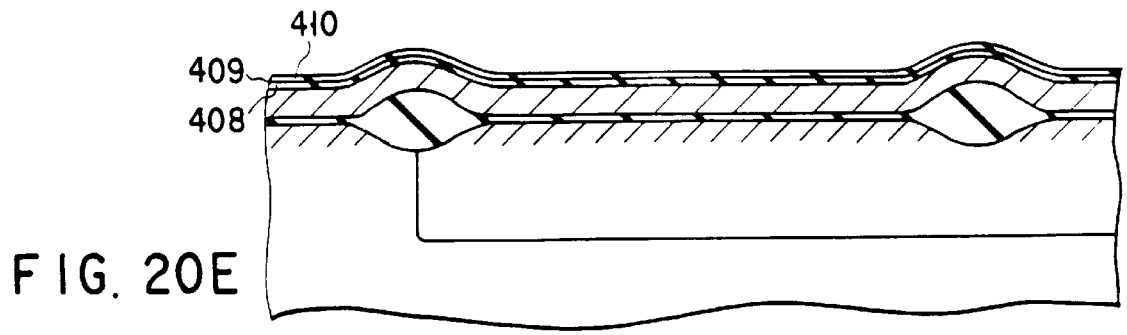
Figure 20F:
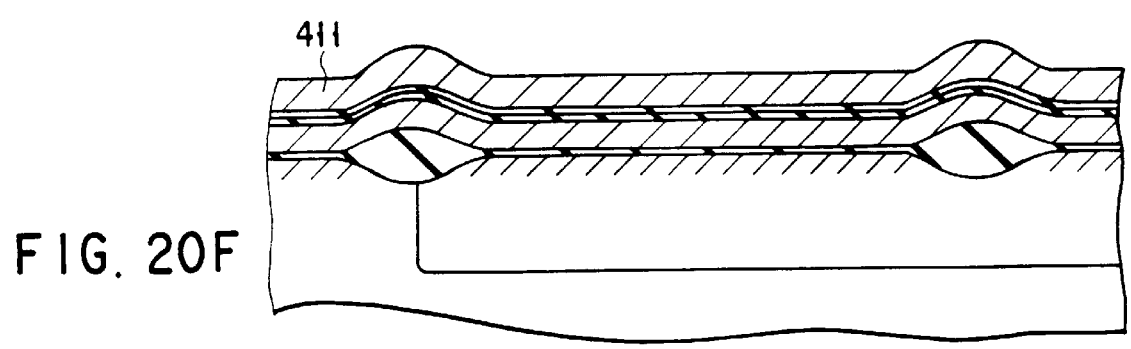

Next, as shown in FIG. 20E, an oxide film 408 about 10 nm thick is formed on the polysilicon film 407 by thermal oxidation, and an SiN film 409 about 10 nm thick is formed on the oxide film 408 by LPCVD method. The surface of the SiN film 409 is oxidized at 900° C. for about 30 minutes, thereby forming an oxide film 410. Then, as shown in FIG. 20F, a polysilicon film 411 is formed on the oxide film 410, to a thickness of 200 nm. The resultant structure is heated in a $POCl_3$ atmosphere at 850° C. for about 60 minutes, introducing phosphorus into the polysilicon film 411.

Figure 20G:
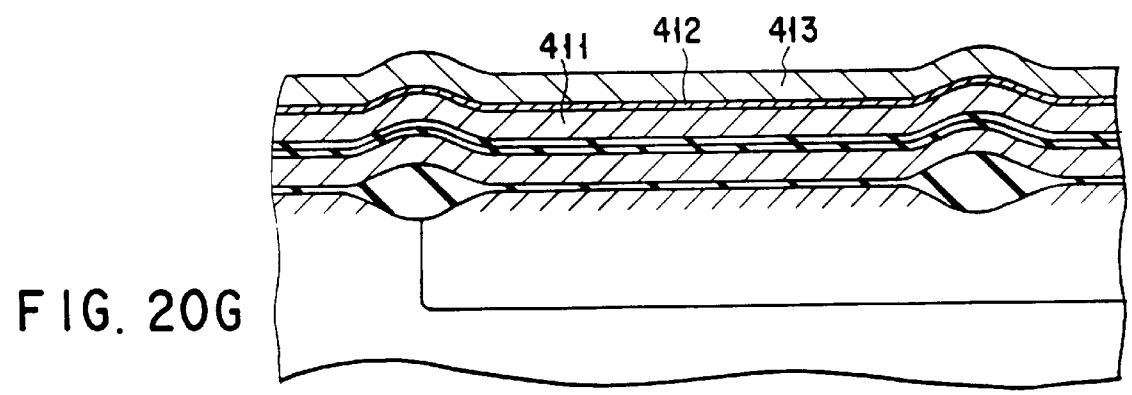

Thereafter, the structure of FIG. 20F is treated with, for example, diluted fluoric acid, removing the oxide film naturally formed during the heating of the structure is removed from the polysilicon film 411. Chemical sputtering is performed, using a W target in an atmosphere containing Ar and $N_2$. A $WN_x$ film 412 about 5 nm thick is thereby formed on the polysilicon film 411, as illustrated in FIG. 20G. Then, the structure is subjected to sputtering in an Ar atmosphere, using a $WSi_x$ target, whereby a $WSi_x$ film 413 about 200 nm thick is formed on the $WN_x$ film 412.

Figure 20H:
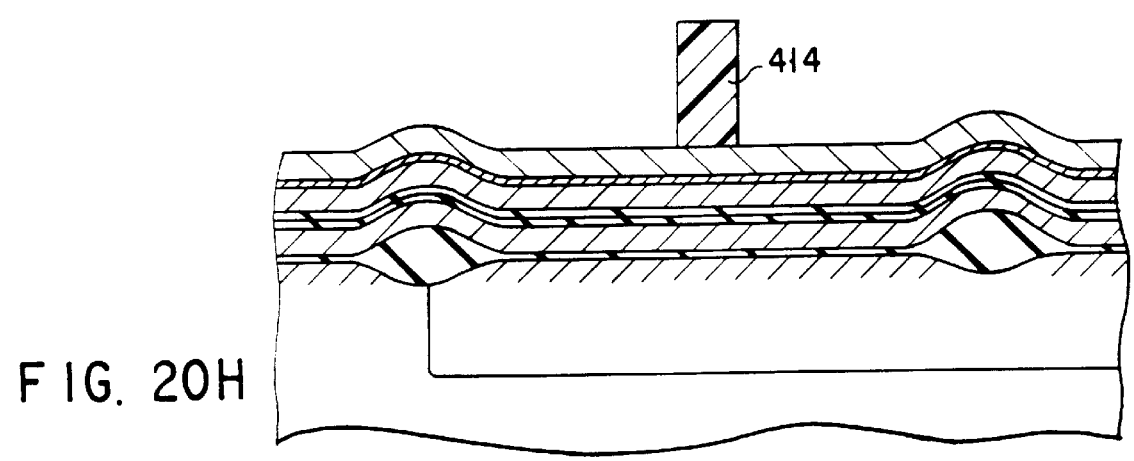
Figure 20I:
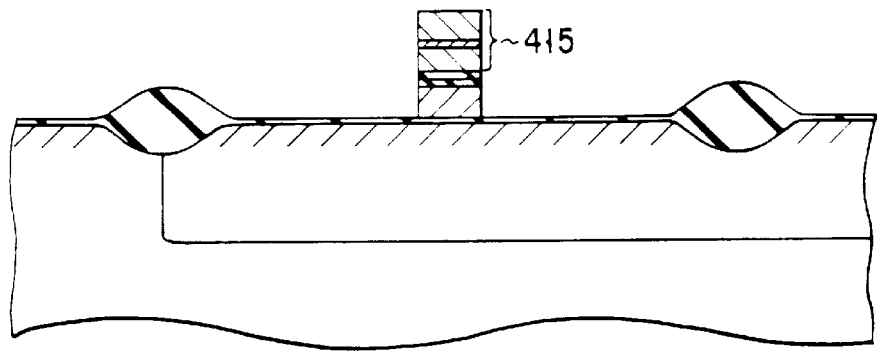

Then, as shown in FIG. 20H, a resist pattern 414 having the same shape as a gate electrode to be formed is made on the $WSi_x$ film 413 by means of photolithography. Using the resist pattern 414 as mask, the $WSi_x$ film 413, the $WN_x$ film 412 and the two polysilicon films 407 and 411 are patterned by means of RIE method. This done, the resist pattern 414 is removed by means of an asher, thereby forming a floating gate, and a control gate or a wiring layer 415 of an EEPROM.

Figure 20J:
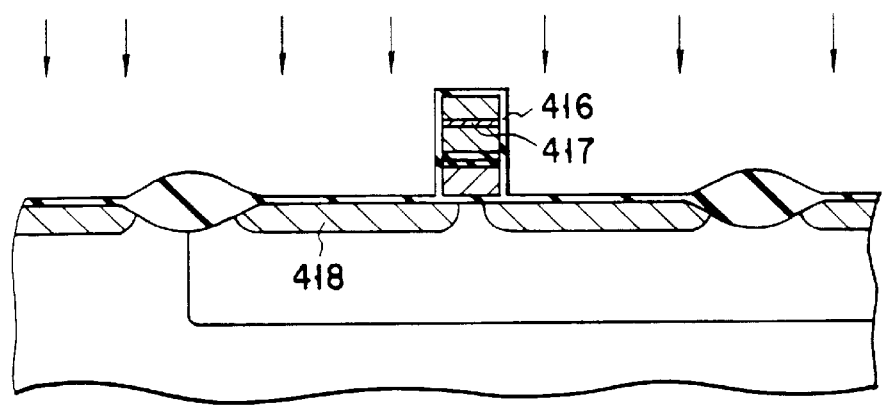

The resultant structure is subjected to oxidation in an oxygen ($O_2$) atmosphere at 800° C. for 30 minutes. An oxide film 416 is thereby formed on the substrate 401 and on the top and sides of the gate electrodes or wiring layer, as illustrated in FIG. 20J. During this thermal oxidation, a part of the $WN_x$ film 412 reacts with the the polysilicon film 411 and also with the oxide film naturally formed on the polysilicon film 411. A $WSi_xN_y$ or $WSi_xN_yO_z$ film 417 is thereby formed at the interface between the polysilicon film 411 and the $WSi_x$ film 413. A greater part of nitrogen is released from the $WN_x$ film 412, whereby the film 412 changes into a W film or a WSi film. Then, arsenic (As) is ion-implanted into the substrate 401 and the p-type region 302 at 60 KeV to a concentration of $5\times10^{15}$ cm$^{-3}$, thereby forming diffusion layers 418.

Figure 20K:
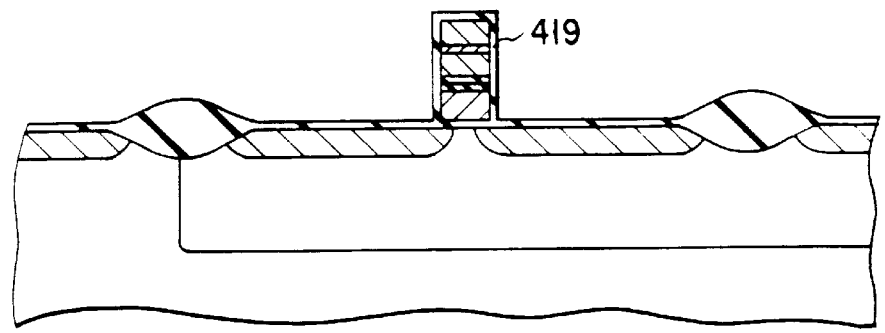

Next, as shown in FIG. 20K, the resultant structure is subjected to oxidation in an oxygen ($O_2$) atmosphere at 900° C. for about 60 minutes, thereby forming an oxide film 419. Owning to this oxidation, the end portions of the oxide film on the gate electrode become thicker than the middle portion, thus improving the gate breakdown voltage, as has been described in "Description of the Related Art." The extend to which the oxidation should be performed depends on the gate breakdown voltage desired of the transistor to be manufactured. However, for the following reason, the oxidation must be performed such that the atomic ratio x of silicon in the $WSi_x$ film 413 does not fall below 1.8. If the $WSi_x$ film 413 is more W-rich than $WSi_{1.8}$, there will be formed $WO_3$, inevitably increasing the volume of the $WSi_x$ film 413 and possibly causing the exfoliation of the gate electrode. Thus, the oxidation must be carried out not to make the atomic ratio x of $WSi_x$ fall below 1.8, in consideration of the thickness and width of the gate electrode.

Figure 20L:
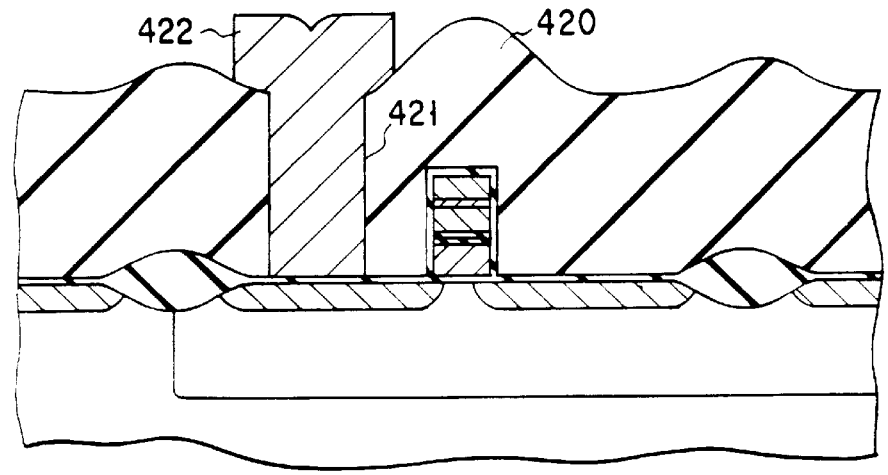

Thereafter, as shown in FIG. 20L, an inter-layer insulating layer 420 is deposited on the structure, and an. contact hole 421 is made in the insulating layer 420. Further, aluminum (Al) is deposited on the insulating layer 420 and in the contact hole 421. The resultant Al film is patterned, forming a wiring 422. As a result, a MOS semiconductor device is manufactured

EXAMPLE 12

FIG. 21A to 21L are sectional views, explaining the steps of forming a semiconductor device according to a twelfth example of this invention.

Figure 21A:
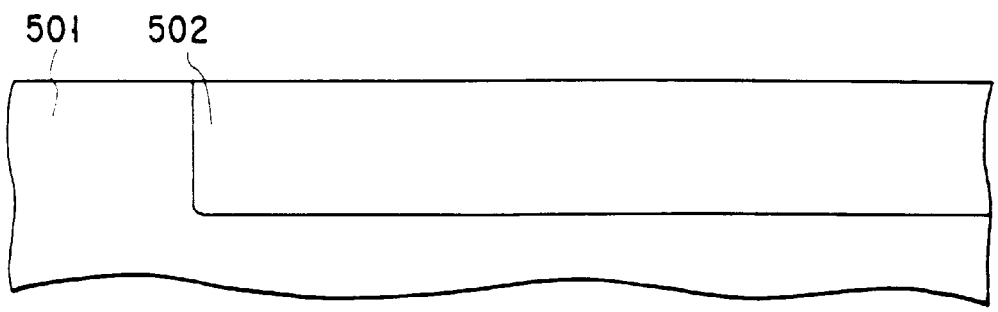
FIGS. 21A to 21L are sectional views, explaining the steps of forming a semiconductor device according to a twelfth example of this invention.
Figure 21B:
Figure 21C:
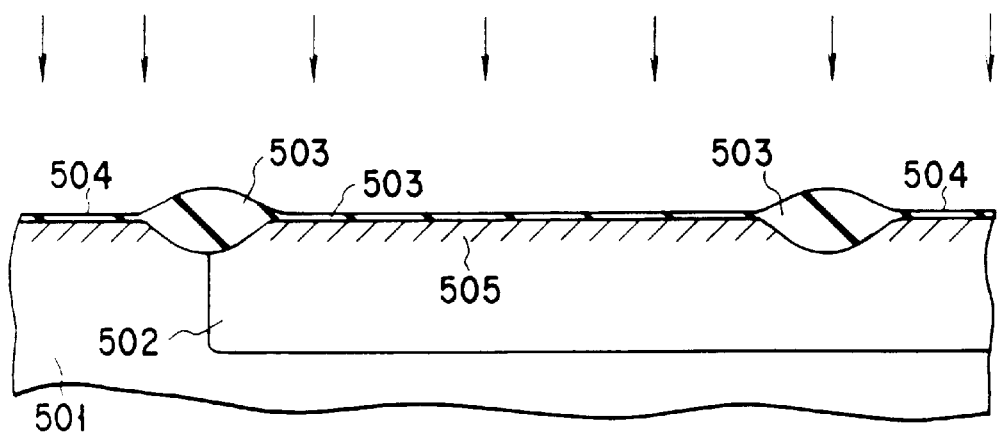

First, as shown in FIGS. 21A, 21B and 21C, and in exactly the same way as in Example 9, a p-type region 502 and an element-isolating oxide film 503 are formed in the surface of a silicon substrate 501, an oxide film 504 is then formed on the resultant structure, and ions 505 are implanted into the structure to set a value for the threshold voltage of the transistor to be manufactured.

Figure 21D:
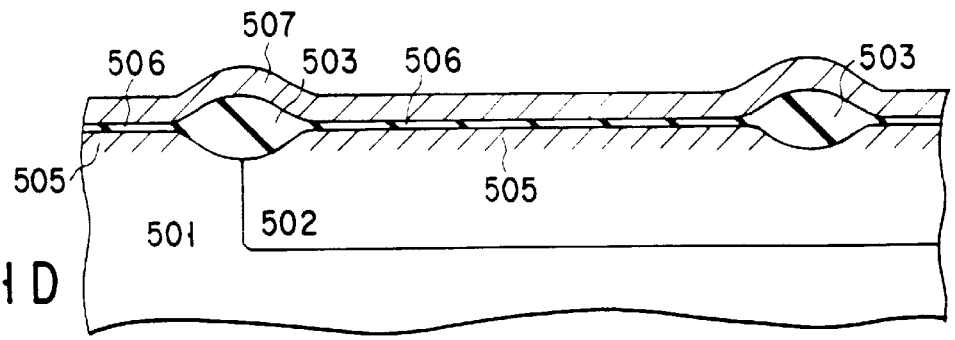
Figure 21E:
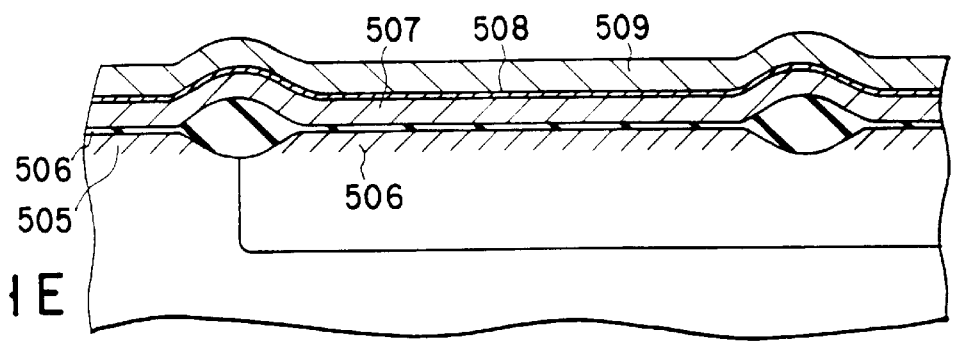

Then, as illustrated in FIG. 21D and as in Example 9, the oxide film 504 is removed, and a gate oxide film 506 is formed on the entire surface of the structure. A polysilicon film 507 is then formed on the gate oxide film 506. Phosphorus (P) is then introduced into the polysilicon film 507. Then, as shown in FIG. 21E and as in Example 9, an oxide film such as a naturally formed one is removed, and chemical sputtering is performed on the resultant structure, thereby forming a $WSi_xN_y$ film 508 on the polysilicon film 507. Further, sputtering is carried out, forming a $WSi_x$ film 509 on the $WSi_xN_y$ film 508.

Figure 21F:
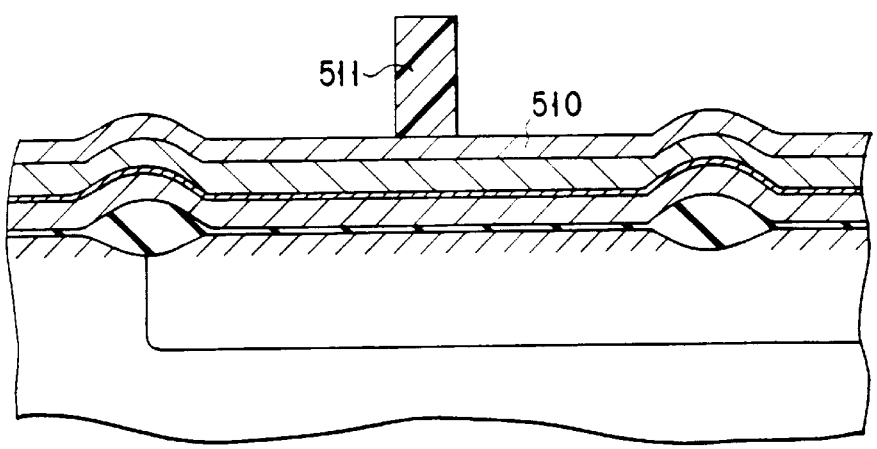

Next, as shown in FIG. 21F, an SiN film 510 is deposited by CVD method to a thickness of 200 nm and subsequently processed by photolithography into a resist pattern 511 having the same shape as a gate electrode or a gate wiring to be formed is made on the $WSi_x$ film 509. Using the resist pattern 511 as mask, the SiN film 510, the $WSi_x$ film 509, the $WSi_xN_y$ film 508 and the polysilicon film 507 are patterned by means of RIE method.

Figure 21G:
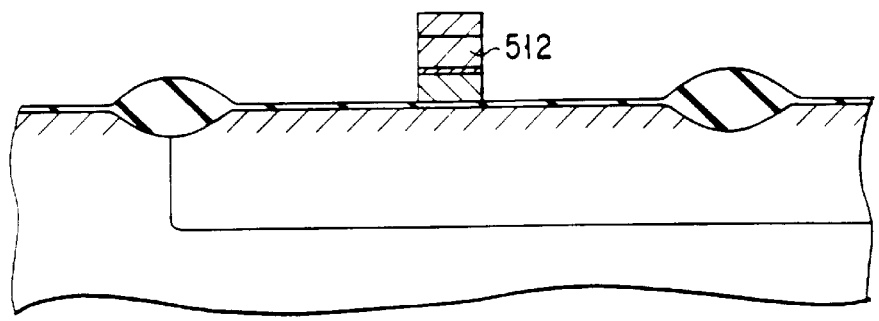

Then, as shown in FIG. 21G, the resist pattern 511 is removed by means of an asher, thereby forming a gate electrode or a wiring 512. The SiN film 510 deposited on the on the $WSi_x$ film 509 serves to prevent ions for being implanted into a source and a drain from reaching to a channel region, and to prevent the $WSi_x$ film 509 from being surface-oxidized.

Figure 21H:
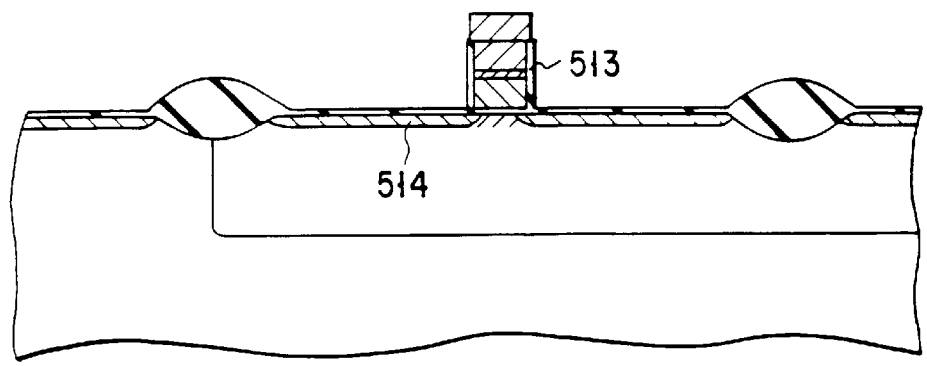

The resultant structure is subjected to oxidation in an oxygen ($O_2$) atmosphere at 800° C. for 30 minutes. An oxide film 513 is thereby formed on sides of the gate electrode, as illustrated in FIG. 21H. Thanks to this oxidation, the end portions of the oxide film on the gate electrode become thicker than the middle portion, thus improving the gate breakdown voltage, as has been described in "Description of the Related Art." The extend to which the oxidation should be performed depends on the gate breakdown voltage desired of the transistor to be manufactured. However, for the following reason, the oxidation must be performed such that the atomic ratio x of silicon in the $WSi_x$ film 509 does not fall below 1.8. If the film 509 is more W-rich than $WSi_{1.8}$, there will be formed $WO_3$, inevitably increasing the volume of the film 409 and possibly causing the exfoliation of the gate electrode Thus, the oxidation must be carried out not to make the atomic ratio x of $WSi_x$ fall below 1.8, in consideration of the thickness and width of the $WSi_x$ film 509.

During this thermal oxidation, a $WN_x$ film already formed reacts with the polysilicon film 507 and also with the oxide film naturally formed on the polysilicon film 506. A $WSi_xN_y$ or $WSi_xN_yO_z$ film is thereby formed at the interface between the polysilicon film 507 and the $WSi_x$ film 509. A greater part of nitrogen is released from the $WN_x$ film, whereby the $WN_x$ film changes into a W film or a WSi film.

Figure 21I:
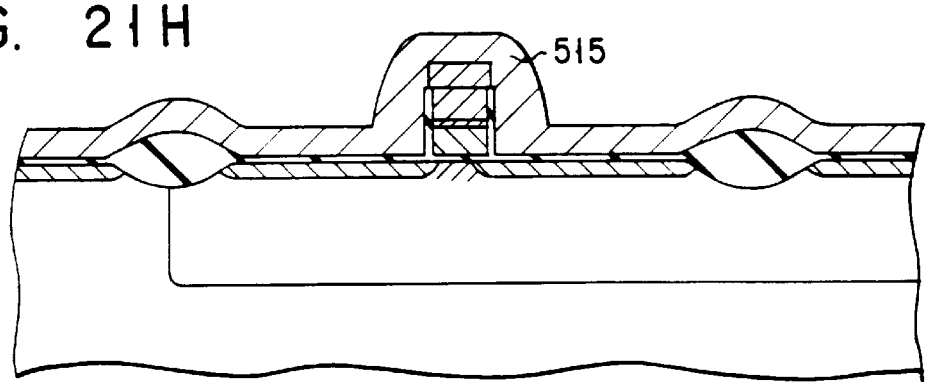

Next, arsenic (As) is ions-implanted into the substrate 501 at 60 KeV to a concentration of $5\times10^{14}$ cm$^{-3}$, forming an n-type diffusion layer 514. Then, as shown in FIG. 21I, an SiN layer 515 is deposited to a thickness of 100 nm, on the resultant structure by means of CVD method.

Figure 21J:
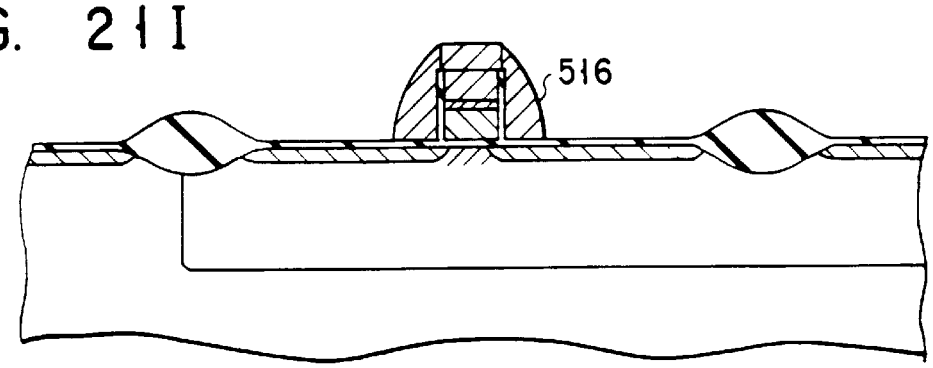
Figure 21K:
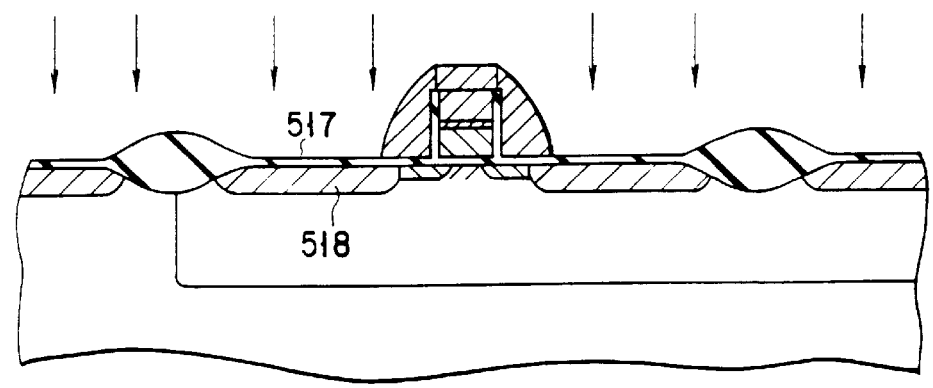

Further, as shown in FIG. 21J, the SiN layer 515 is subjected to anisotropic etching by means of RIE method, thus removing the SiN layer 515 except those parts 516 (SiN walls) laid on the sides of the gate electrode structure. The oxidation is performed on the resultant structure at 800° C. for about 30 minutes, thereby forming an oxide film on the substrate 501. Then, as shown in FIG. 21K, arsenic (As) is ion-implanted into the substrate 501, and annealing is performed at a high temperature of 950° C. for a short time of about 30 seconds, thereby forming a diffusion layers 518. The diffusion layer 518 has a shallow portion, located right below the SiN walls 516 and on the side of the channel region. The shallow portion of this diffusion layer 518 controls short-channel effect. Due to the deep portion, of the diffusion layer 518 makes a sheet resistance of the diffusion layer 518 low, and thus enhancing the drive efficiency of the transistor.

Figure 21L:
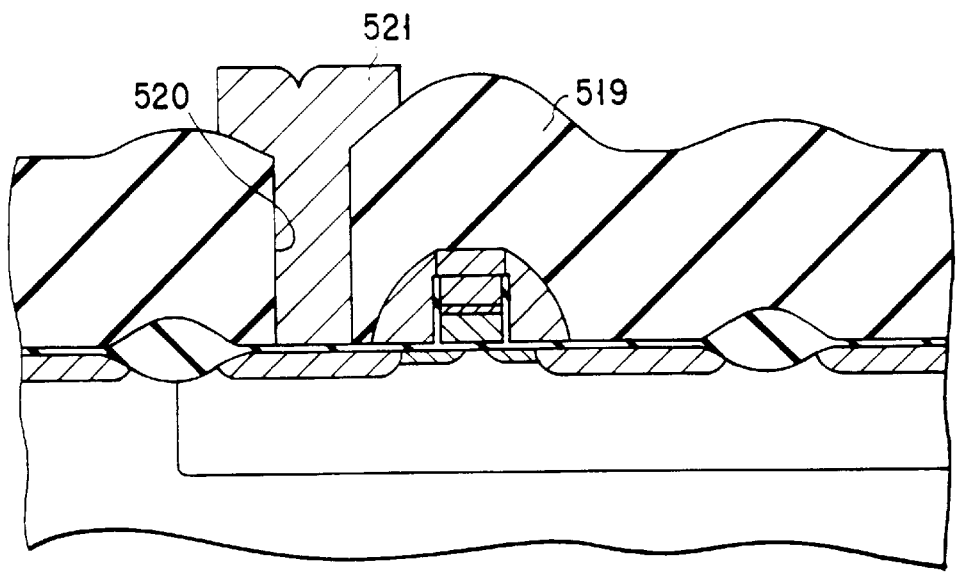

Thereafter, as shown in FIG. 21L, an inter-layer insulating layer 519 is deposited on the structure, and an contact hole 520 is made in a desired part of the insulating layer 519.

Further, aluminum (Al) is deposited on the insulating layer 519 and in the contact hole 520. The resultant Al film is patterned, forming a wiring 521. As a result, a MOS semiconductor device is manufactured.

EXAMPLE 13

The thirteen embodiment of the present invention will be described with reference to FIGS. 22A and 22B. These figures are sectional views, explaining the structure of a semiconductor device of Example 13.

Figure 22A:
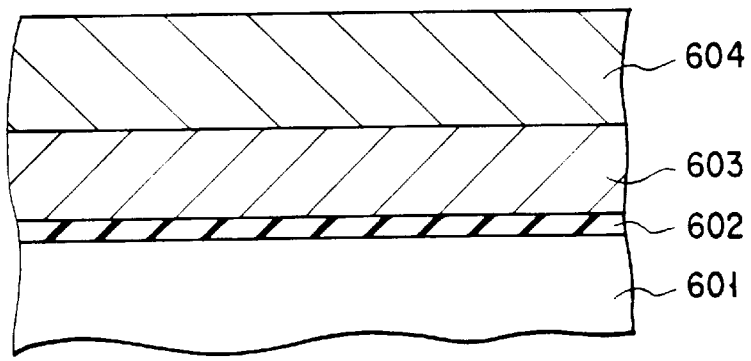
FIGS. 22A and 22B are sectional views, explaining the structure of a semiconductor device according to a thirteenth example of the invention.

As shown in FIG. 22A, a silicon oxide film 602 having a thickness of 10 nm, a polysilicon film 603 having a thickness of 100 nm, a tungsten silicide film 604 having a thickness of 200 nm are laid one upon another, in the order mentioned, on a silicon substrate 601. The resultant four-layer structure is heated at 800 to 900° C., forming a $WSi_nN_y$ film 605 at the interface between the polysilicon film 603 and the tungsten silicide film 604 as illustrated in FIG. 22B. The $WSi_nN_y$ film 605 (i e., a reaction-inhibiting layer) contains nitrogen segregated at a concentration as high as $10^{21}$ cm$^{-3}$ or more.

Figure 22B:
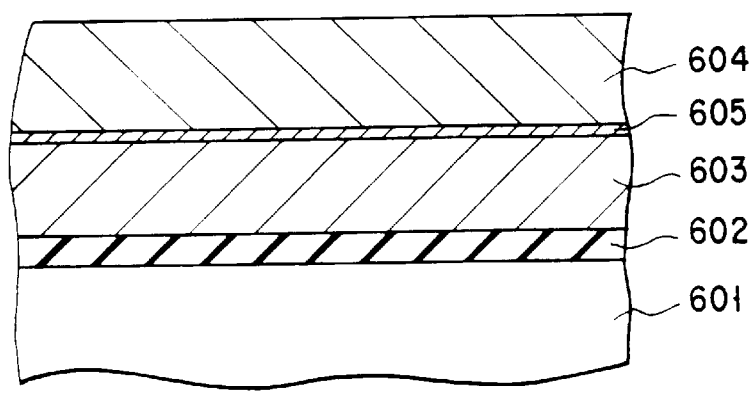

The structure shown in FIG. 22B may be processed to provide a gate electrode of the type which is incorporated in Examples 9 to 12. The tungsten silicide ($WSi_x$) layer 694 can be replaced by a metal silicide layer which has at least one main component selected from the group consisting of Mo, V, Nb, Ta, Co and Ti. In this case, too, the structure of FIG. 22B can be processed to form the same gate electrode as is used in Examples 9 to 12.

EXAMPLE 14

FIGS. 23A to 23E are sectional views, explaining the steps of forming a semiconductor device according to the fourteenth example of this invention. The components similar or identical to those shown in FIGS. 3A to 3E are denoted at the same numerals in FIGS. 23A to 23E and will not be described in detail.

Figure 23A:
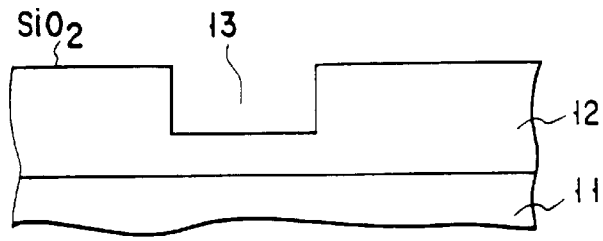
FIGS. 23A to 23E are sectional views, explaining the steps of forming a semiconductor device according to the fourteenth example of this invention.

At first, as shown in FIG. 23A, an $SiO_2$ film 12 is formed on a semiconductor substrate 11 by means of CVD method or the like. Next, a groove 13 is made by RIE method or the like in the surface of the $SiO_2$ film 12. The $SiO_2$ film 12, which is used as an insulating film, may be replaced by either a polyimide film or a fluorine-added $SiO_2$ film It is desirable to smooth the surfaces of the groove 13 by means of CDE or polishing, preferably to an average roughness of 1 nm or less.

Figure 23B:
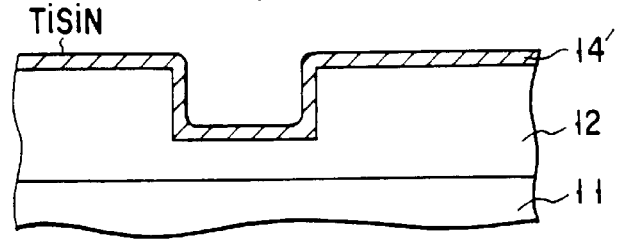

Next, as depicted in FIG. 23B, a TiSiN film 14', i.e., a layer made of ternary compound of Ti, Si and N, is formed to a thickness of 20 nm on the $SiO_2$ film 12 and in the groove 13. This film 14' serves as a diffusion barrier layer or bonding layer. Ti is used as refractory metal which is a component of the barrier metal layer, is not limited to Ti. Rather, Zr, Hf, Mo W or the like may be selected and used. More precisely, the TiSiN film 14' is formed by chemical sputtering, by means of a DC magnetron sputtering apparatus, using a Ti silicide target (e.g., a $TiSi_{0.6}$ target), supplying argon at flow rate of 0 to 39 sccm and nitrogen at flow rate of 40 to 1 sccm, at pressure of 0.3 Pa and electric power of about 1 kw.

Figure 24A:
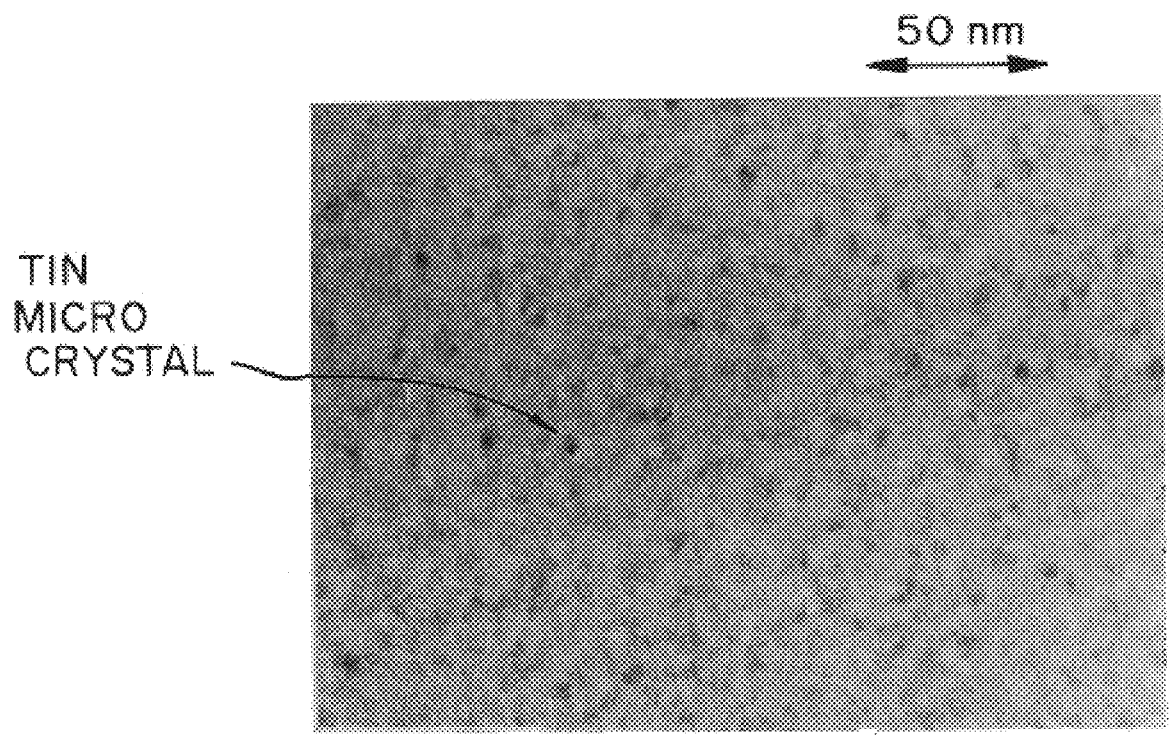
FIGS. 24A and 24B are microscopic photographs of TiSiN films.
Figure 24B:
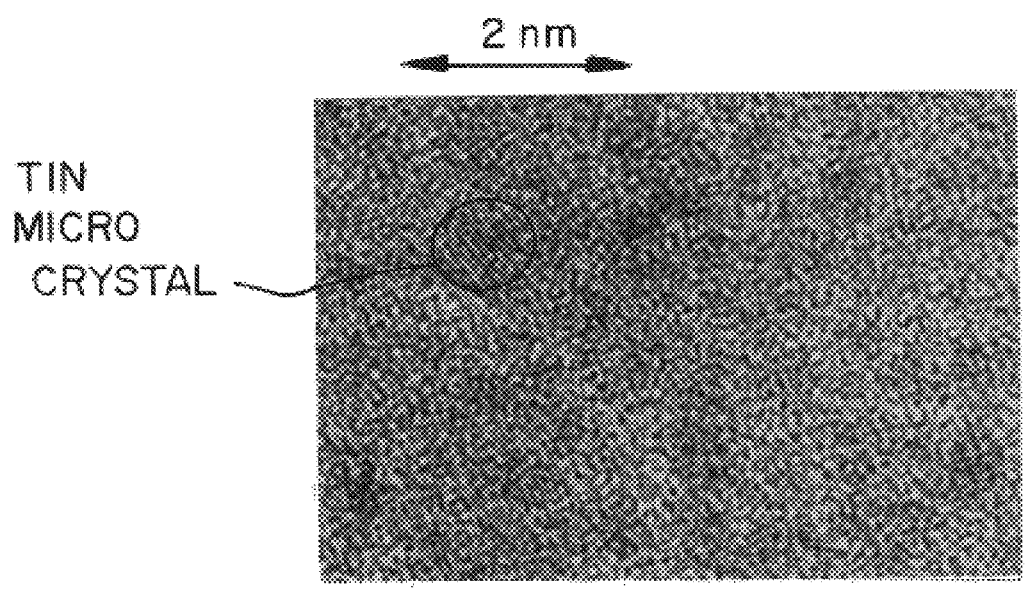

A TiSiN film was actually formed in the method described above and examined by TEM (Transmission Electron Microscope). As evident from a TEM photograph of FIG. 24A and an enlarged TEM photograph of FIG. 24B, the TiSiN film was found to be amorphous, containing TiN microcrystal grains having a diameter of about 2 nm. No crystal grain boundaries were observed to extend throughout the TiSiN film. This means that the TiSiN film can function as an effective barrier. Furthermore, containing the microcrystal grains, the TiSiN film was found to have a low resistivity. Namely, the TiSiN film exhibited excellent barrier property and a very low electric resistance.

As has indicated, Ti may be replaced by any other refractory metal. Even so, there will be provided an amorphous film which contains microcrystal grains of the nitride of that refractory metal. These grains will not grow even when the film is annealed at high temperatures (e.g., 750° C.). No crystal grain boundaries will be formed in the film to extend throughout the amorphous film. Hence, the barrier property of the film will not be deteriorated at all.

The method and conditions of forming the TiSiN film 14' are not limited to those specified above. For example, the sputtering may be performed by using Ti targets and Si targets which are arranged in a mosaic pattern. Alternatively, the sputtering may be performed, using a Ti collimator. Further, the TiSiN film 14' may be formed by CVD method, using $TiCl_3$ gas, $NH_3$ gas and $SiH_4$ gas. Still further, the film may be formed by CVD method, using an organic gas source (e.g., TMAT, or tetradimethylamino titanium) in place of $TiCl_4$. The CVD conditions for forming the film are, for example, temperature of 350° C. and pressure of 0.5 Torr. Generally, CVD method is desirable for forming a TiSiN film which fills up grooves and holes having a high aspect ratio, since this method can achieve conformal deposition.

A thin Ti film may be formed on the $SiO_2$ film 12 beforehand so that the TiSiN film 14' may adhere to the $SiO_2$ film 12 more firmly than otherwise. Generally, the stress on an amorphous film is low. The stress on a film of ternary compound of Ti, Si and N is lower than the stress on a crystalline film because the ternary compound is amorphous. The stress on the TiSiN film 14' is, for example, $1.7 \times 10^9$ dyn/cm$^2$). The possibility is low that the film 14' jeopardizes the characteristics of the semiconductor element to be manufactured.

Figure 23C:
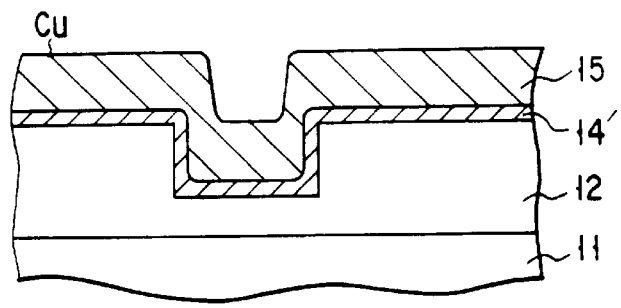

Next, as shown in FIG. 23C, a Cu film 15, which will be processed into main wiring layer, is deposited on the TiSiN film 14, to a thickness of 400 nm, by sputtering or the like. Since the TiSiN film 14' and the Cu film 15 are sequentially deposited without being exposed to the atmosphere, the TiSiN film 14' is far more adhesive to the Cu film 15 than a film of TiN or the like.

Firmly and strongly adhering to the Cu film 15, TiSiN is not repelled or does not coagulate in the subsequent annealing step, despite the surface tension of Cu. Therefore, TiSiN can readily fill grooves or holes made in the surface of the $SiO_2$ film 12.

Figure 23D:
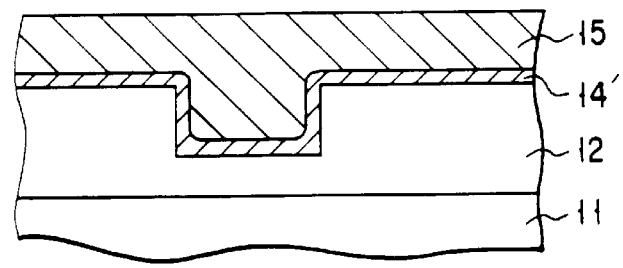

Next, as shown in FIG. 23D, the structure of FIG. 23C is annealed at 200 to 700° C. during or after the sputtering, thereby re-flowing Cu into the groove 13. The upper surface of the Cu film 15 is thereby made flat. It is possible to lower the contents of the oxidizing gases (elayerDg., oxygen or water vapor) (to 1 ppm or less) in the annealing atmosphere or to add a reducing gas (e.g., hydrogen) to the annealing atmosphere.

Figure 23E:
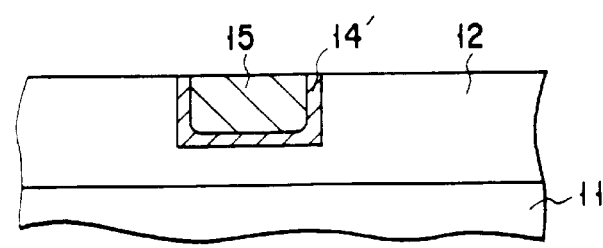

The resultant structure (FIG. 23D) is etched at its upper surface, removing the TiSiN film 14' and the Cu film 15, except those portions located in the groove 13, as is illustrated in FIG. 23E. A buried wiring layer made of Cu is thereby formed in the surface of the $SiO_2$ film 12. This etching process may be RIE method or ion milling, or may be replaced by polishing. The Cu wiring thus obtained has high reliability.

In order to determine whether or not the TiSiN film 14' is effective as a barrier against Cu, the structure of FIG. 23E was actually formed and put to junction-leakage test. In the test, the area of contact between the TiSiN film and the Cu film was set at 300×80 $\mu m^2$ in the forming gas, and the structure was annealed at 600° C. for 30 minutes. Even after the annealing, the leakage current did not increase at a reverse bias. Thus, the TiSiN film exhibited good barrier property. The structure was further examined by atomic absorption analysis, for Cu diffusion into the silicon substrate. The Cu concentration in the silicon substrate was equal to or less than the detection limit (i.e., $2\times10^{12}/cm^3$). This means that the TiSiN film had good barrier property It was also found that a TiSiN film served effectively as a barrier even if its thickness is 5 nm.

In view of this fact, the TiSiN film 14' can be regarded an excellent barrier metal layer, even if made thin. Since the TiSiN film 14' and the Cu film 15 are sequentially formed by sputtering, the method of forming the wiring layer can be simplified.

The wiring layer of Example 14 is a buried one. Instead, a wiring layer may be formed on the SiO₂ film 12, not in the groove 13, by patterning a barrier metal layer comprised of a Cu film formed on the SiO₂ film 12 and a Cu alloy film formed on the Cu film. Further, Si used as semiconductor may be replaced any other IV-group element (e.g., Si, Ge, C or the like) or a binary compound semiconductor such as III-V (e.g., GaAs, InP, InSb, BN, GaP or the like), II-VI (elayerrg., ZnSe, ZnS, CdS, CdTe or the like), a ternary compound semiconductor II-IV-V, II-IV-VI, III-IV-VI, or II-V-VII. The Cu film used as main wiring layer may be replaced by a film of Al, Au, Ag or W, or by a film of an alloy of two or more of these metals.

EXAMPLE 15

FIGS. 26A to 26D are sectional views, explaining the steps of forming a semiconductor device according to the fifteenth example of the invention. With reference to these figures, it will be explained how to manufacture the device. In the following explanation, the components similar or identical to those shown in FIGS. 13A to 13E are denoted at the same numerals in FIGS. 26A to 26D and will not be described in detail.

Figure 26A:
FIGS. 26A to 26D are sectional views, explaining the steps of forming a semiconductor device according to the fifteenth example of this invention.

First, as shown in FIG. 26A, an SiO₂ or ONO (SiO₂/Si₃N₄/SiO₂) film 72, used as a gate insulating film, is formed on a Si substrate 71 to a thickness of 60 nm.

Figure 26B:
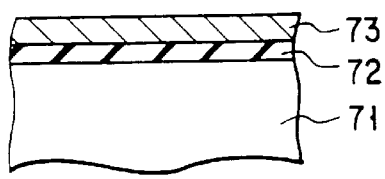

Next, as shown in FIG. 26B, an amorphous alloy film 73' made of Ti, Si and N is formed on the film 72. The amorphous alloy film 73' has TiN microcrystal grains having a diameter which is, of course, less than the thickness of the film 73'. Generally, an amorphous film has relatively smooth surfaces and is not likely to generate surface states when set in face-to-face contact with another film. Unlike a polycrystalline film, an amorphous film has no difference in work function depending on crystal orientation. It therefore has a stable breakdown voltage and imparts stable characteristics to the semiconductor device incorporating it. Further, containing TiN microcrystal grains, the film 73' has a low resistance. It follows that a gate electrode incorporating the film 73' also has a low resistance, which helps to increase the operating speed of the transistor having that gate electrode.

Figure 26C:
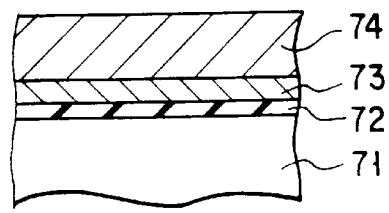

Next, as shown in FIG. 26C, a W film 74 is formed on the alloy film 73' to a thickness of 300 nm. The alloy film 73' made of Ti, Si and N acts as an effective barrier to tungsten (w), preventing tungsten from diffusing from the W film 74 into the gate insulating film 72.

Figure 26D:
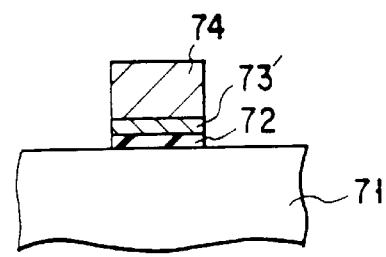

Then, as shown in FIG. 26D, the gate insulting film 72, the alloy film 73' and the W film 74 are processed by photolithography and RIE method, thereby forming a gate electrode.

In Example 15, the film 73' of Ti—Si—N alloy is employed. Nonetheless, a film of any other amorphous material may be used, provided that it contains microcrystal grains whose diameter is less than the thickness of the film. In addition, the w film 74, which is used as main wiring layer, may be replaced by a film of Al, Ag, Ag or Cu, or by a film of an alloy of two or more of these metals.

EXAMPLE 16

A semiconductor device according to the sixteenth embodiment of the present invention will be described, with references to FIGS. 23A to 23E as described in Example 14. Example 16 is identical to Example 14, except that tungsten (W) is used as refractory metal, in place of titanium (Ti).

First, as shown in FIG. 23A and as in Example 14, an SiO₂ film 12 is formed on a semiconductor substrate 11 by means of CVD method or the like. Next, a groove 13 is made by RIE method or the like in the surface of the SiO₂ film 12.

Next, as depicted in FIG. 23B, a WSiN film 14', i.e., a layer made of ternary compound of W, Si and N, is formed to a thickness of 25 nm on the SiO₂ film 12 and in the groove 13. The WSiN film 14' serves as a diffusion barrier layer or bonding layer. To be more specific, the WSiN film 14' formed by chemical sputtering, by means of a DC magnetron sputtering apparatus, using a w silicide target, in an atmosphere of a mixture of argon and nitrogen. The greater the x/y ratio of $W_xSi_yN$, the lower the specific resistance which WSIN formed by the chemical sputtering. If the ratio x/y is 5/3 or more, the W film will contain microcrystal grains of W, Wn or W₂N which have a diameter of several microns.

Also in the case where a $Ti_xSi_y$ target is used, the resultant TiSiN film will contain TiN microcrystal grains having a diameter of several nm if the ratio x/y is 5/3 or more. If the ratio x/y is less than 5/3, no TiN microcrystal grains cannot be observed in the TiSiN film by means of an TEC. TiN microcrystal grains, if any in the TiSiN film, have a diameter of 0.8 nm at most.

A Ti—Si—N film formed by chemical sputtering, using a $Ti_xSi_y$ target, has a composition of $Ti_xSi_yN_2$, the ratio x/y is almost equal. This holds true of not only films of Ti silicide, but also films of any metal silicide, as can be understood from the following Table 5:

TABLE 5

| Target | Ar/N$_2$ | Power | Ti:Si:N | (%) | m$\Omega^p \cdot$ cm | Barrier property against Cu |
|---|---|---|---|---|---|---|
| TiSi$_2$ | 35/10 | 0.5 kW | 1:2.09:3.49 | Ti$_{15}$Si$_{32}$N$_{53}$ | 20 | 750° C. or more |
| TiSi$_1$ | 35/10 | 0.5 kW | 1:1.06:2.59 | Ti$_{21}$Si$_{34}$N$_{56}$ | 70 | 750° C. or more |
| TiSi$_{0.6}$ | 30/10 | 0.5 kW | 1:0.69:2.12 | Ti$_{26}$Si$_{18}$N$_{56}$ | 5.8 | 750° C. or more |
| " | 32/8 | 0.5 kW | 1:0.65:1.56 | Ti$_{31}$Si$_{20}$N$_{49}$ | 3.46 | 750° C. or more |
| " | 32/8 | 1.0 kW | 1:0.61:1.61 | Ti$_{31}$Si$_{19}$N$_{50}$ | 0.5 | 750° C. or more |
| " | 32/8 | 1.5 kW | 1:0.56:0.88 | Ti$_{41}$Si$_{23}$N$_{36}$ | 0.23 | 450° C. or less |
| " | 35/5 | 0.5 kW | 1:0.65:1.78 | Ti$_{29}$Si$_{19}$N$_{52}$ | 0.7 | 750° C. or less |

The chemical sputtering is performed at pressure of 0.3 Pa and electric power ranging from 0.5 to 1.5 kW, while supplying argon and nitrogen at flow rate of 0 to 39 sccm and nitrogen at flow rate of 40 to 1 sccm.

All films formed by sputtering are amorphous ones, as was proved by examining an actually formed films by means of XRD analysis. Any film in which the x/y ratio of W$_x$Si$_y$ is 5/3 or more contains microcrystal grains of W, WN, W$_2$N or the like, as was proved by TEM examination.

In Example 16, sputtering is employed to form the barrierlayer. Any other method can be used instead, provided that the barrier layer formed is made of ternary compound of W, Si and N and contains microcrystal grains of W, WN, W$_2$N, W$_5$Si$_3$, WSi$_2$ or the like.

Thereafter, as shown in FIG. 23C and as in Example 14, a Cu film 15, which will be processed into main wiring layer, is deposited on the TiSiN film 14', to a thickness of 400 nm, by sputtering or the like. As shown in FIG. 23D, the structure of FIG. 23C is annealed, re-flowing Cu into the groove 13 and making the upper surface of the Cu film 15 flat. Then, the structure is etched at its upper surface, removing the TiSiN film 14' and the Cu film 15, except those portions located in the groove 13, as is illustrated in FIG. 23E. A buried wiring layer made of Cu is thereby formed in the surface of the SiO$_2$ film 12. The Cu wiring thus obtained has high reliability.

To determine whether or not the TiSiN film 14' is effective as a barrier against Cu, the structure of Example 16 was actually formed and put to junction-leakage test or atomic absorption analysis, as in Example 14. The results of the test and the analysis showed that the TiSiN film had good barrier property. It was found to serve effectively as a barrier even if its thickness is 5 nm.

In view of this fact, the TiSiN film 14' can be regarded an excellent barrier metal layer, even if made thin. Since the TiSiN film 14' and the Cu film 15 are sequentially formed by sputtering, the method of forming the wiring layer can be simplified.

Figure 27:
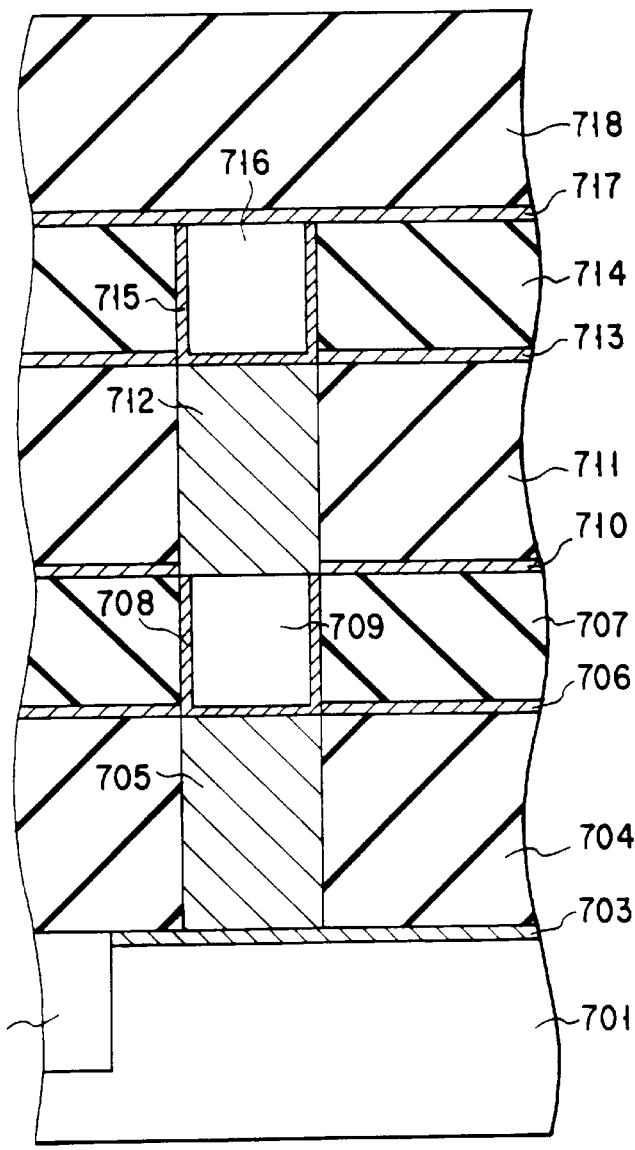
FIG. 27 is a sectional view of a modified semiconductor device according to this invention.

The present invention is not limited to Examples 1 to 16 described above. For instance, the method of Example 1 may be repeatedly performed, thereby to provide the structure of FIG. 27 which has two wiring layers. As shown in FIG. 27, this structure comprises a substrate 701, an element-isolating layer 702, a TiSi$_2$ film 703, inter-layer insulating layers 704, 707, 711, 714 and 718, polysilicon films 705 and 712, Si$_3$N$_4$ layers 706, 710, 713 and 717, Ti—Si—N layers 708, 715, and Cu layers 709 and 716. Moreover, the method Example 1 may be performed twice or more times, to form a structure which has two or more wiring layers.

EXAMPLE 17

A semiconductor device according to the seventeenth example will be described, with reference to FIG. 28, FIGS. 29A to 29D and FIGS. 30A and 30B.

Figure 28:
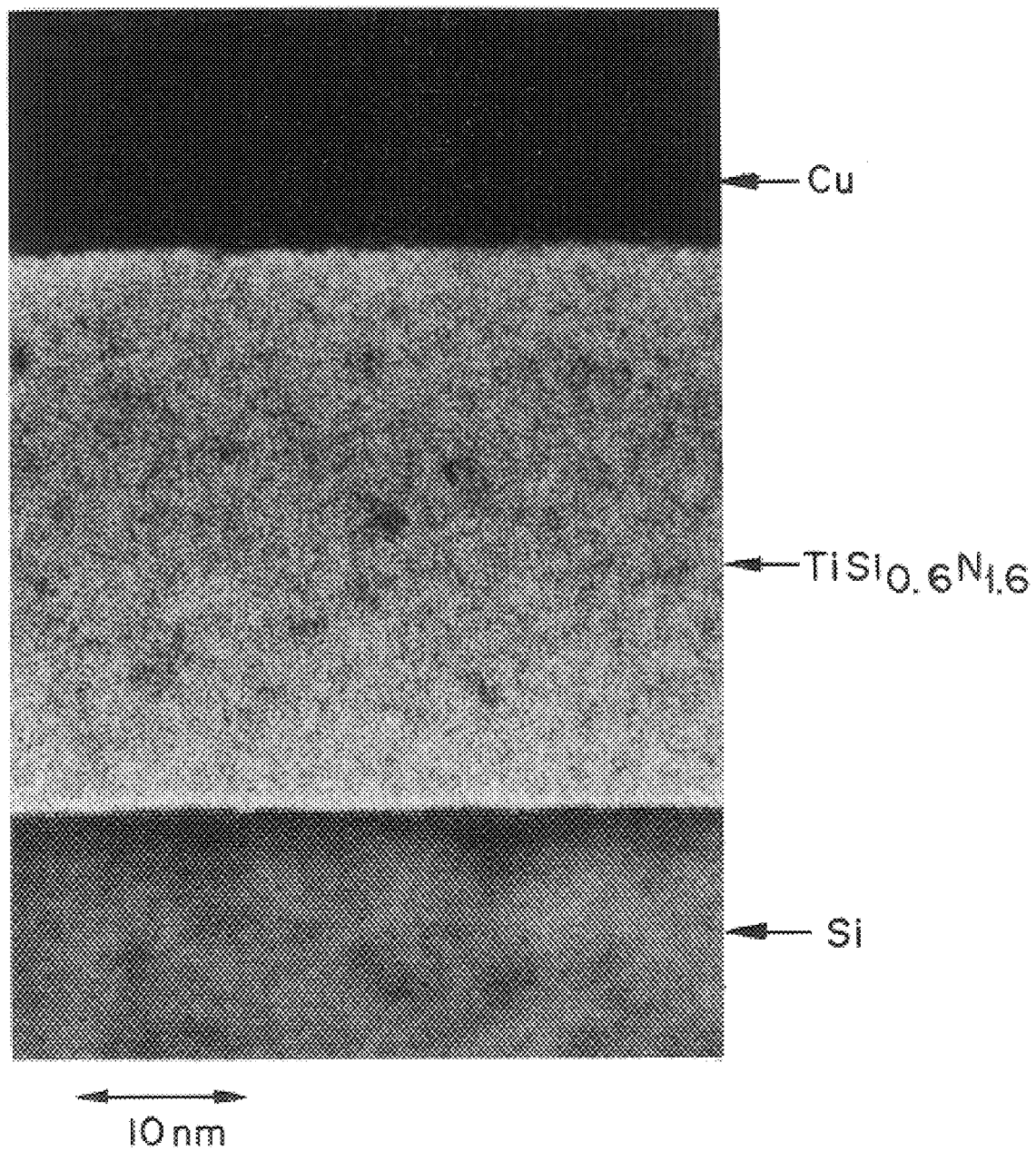
FIG. 28 is a TEM photograph showing a cross section of a Cu/TiSiN/Si structure.

A TiSi$_{0.6}$N$_{1.6}$ alloy layer and a Cu layer were formed on a silicon (Si) substrate. The structure consisting of the Si substrate, the TiSi$_{0.6}$N$_{1.6}$ alloy layer and the Cu layer was cut, and its severed section as photographed by a TEM. FIG. 28 is the TEM photograph this cross section of the Cu/TiSiN/Si structure. As can be seen from FIG. 28, the Ti—Si—N amorphous matrix contained TiN microcrystal grains which look like tiny black spots in the TEM photograph. The TiN microcrystal grains were small and dispersed sparsely. No crystal grain boundaries were found to extend in the direction of the thickness of the Cu/TiSiN/Si structure.

Further, Ti—Si—N films were formed by sputtering, using various targets of TiSi$_2$, TiSi, TiSi$_{0.6}$, thus changing the Ti/Si ratio. The Ti—Si—N films were analyzed by XPS (X-ray Photoelectron Spectroscopy) The results of this analysis were as shown in FIGS. 29A to 29D and FIGS. 30A and 30B. FIGS. 29A to 29D show XPS spectra of TiSiN films formed by using TiSi$_2$ and TiSi as targets, while FIGS. 30A to 30C the XPS spectra of TiSiN films formed by using TiSi$_{0.6}$ as target.

Figure 29A:
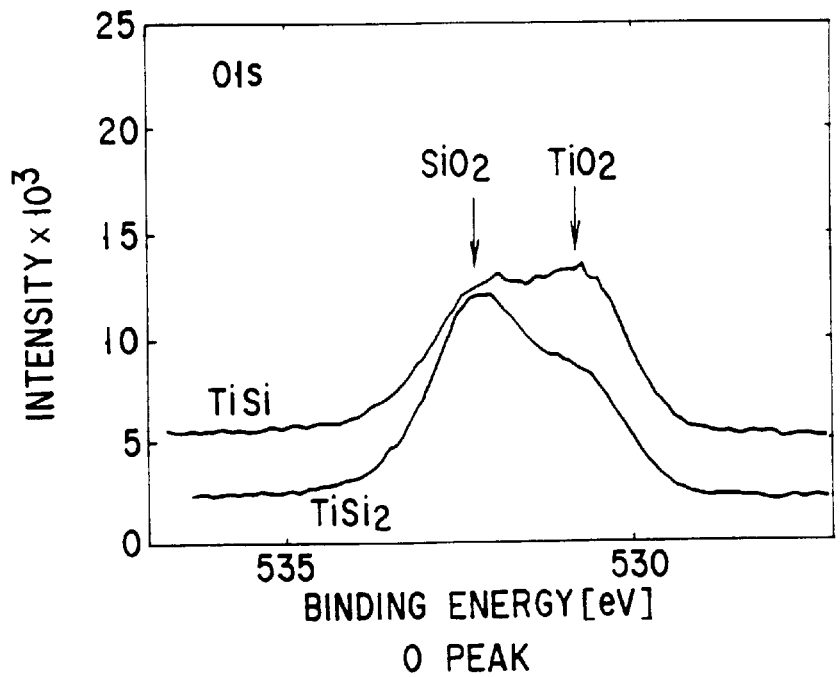
FIGS. 29A to 29D are graphs, each showing the XPS spectrum of a TiSiN film.
Figure 29B:
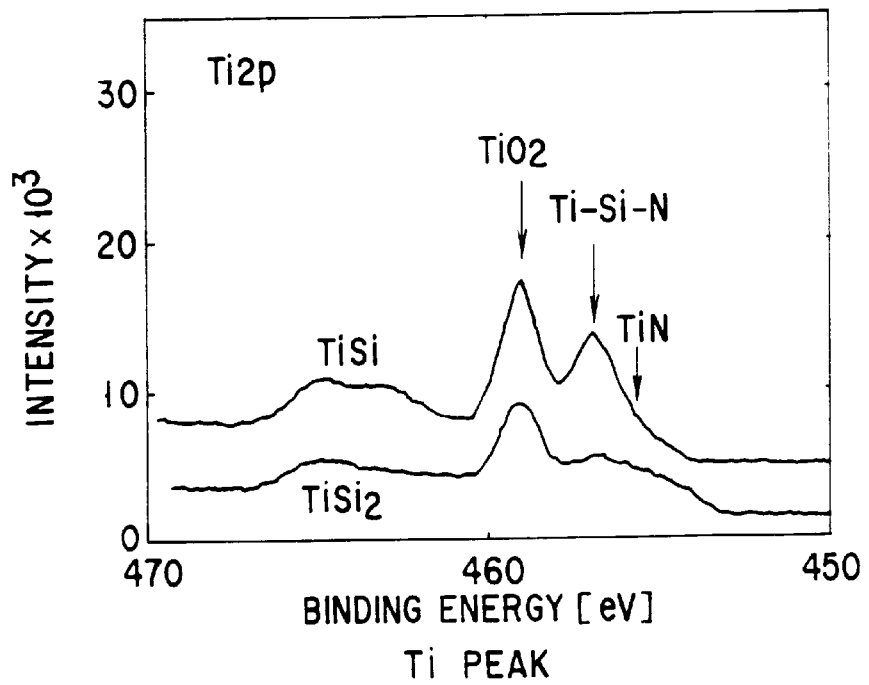
Figure 29C:
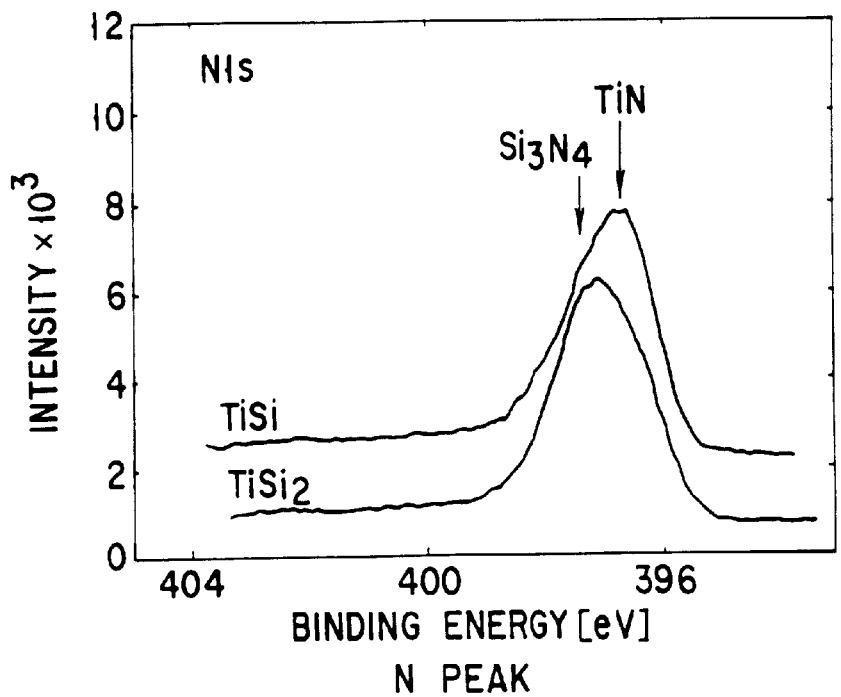
Figure 29D:
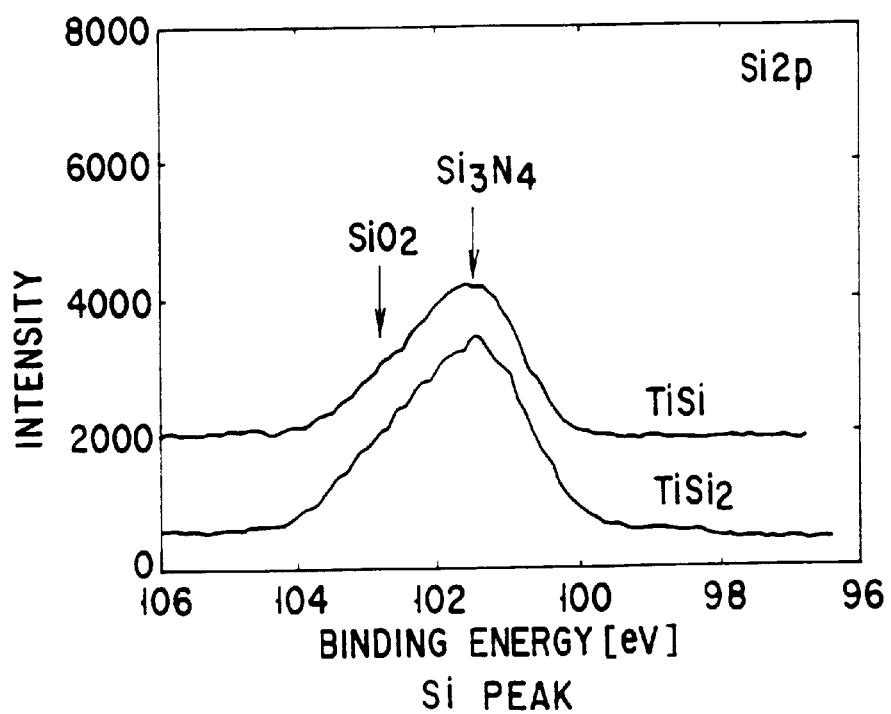

The spectra shown in FIGS. 29A to 29D and FIGS. 30A to 30C have an SiO$_2$ peak and a TiO$_2$ because the Ti—Si—N films were oxidized at surfaces when left to stand in the atmosphere. The inner part of each Ti—Si—N film consisted of TiN, Si$_3$N$_4$ and Ti—Si—N, as can be understood from FIGS. 29A to 29D and FIGS. 30A to 30C. Further, as shown in FIGS. 29C and 30C, the ratio of the TiN peak to the Si$_3$N$_4$ peak increases when the Si/Ti ratio of the sputtering target is decreased. In other words, the TiN bonds increases in the Ti—Si—N film as the Si/Ti ratio of the target is decreased.

As mentioned above, the no TiN microcrystal grains were found in the Ti—Si—N film formed by sputtering using TiSi$_2$ or TiSi as target, whereas TiN microcrystal grains were observed in the Ti—Si—N film formed by sputtering using TiSi$_{0.6}$ because TiN bonds had increased in this Ti—Si—N films.

As has been described in detail, the present invention is characterized in that the barrier layer is made of amorphous alloy in which microcrystal grains are sparsely dispersed, not forming grain boundaries which extend in the direction of thickness of the barrier layer. Hence, the barrier layer can function as an effective barrier, enhancing the characteristic of the semiconductor device incorporating it and increasing the reliability of the wiring layer incorporating it.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor device comprising:
   a conductive layer being at least either one of an electrode layer and a wiring layer, and;
   an amorphous alloy layer formed on a bottom surface of said conductive layer and made of a matrix phase and microcrystal grains, said matrix phase containing amorphous alloy as a main component, and said microcrystal grains being dispersed in the matrix phase, not continuously arranged in the direction of thickness of the amorphous alloy layer.

2. The device according to claim 1, wherein said amorphous alloy layer contains nitrogen, a refractory metal selected from the group consisting of Ti, Zr, Hf, V, Nb, Ta, Cr, W and Mo, and a semiconductor selected from the group consisting of a group IV material, a binary compound semiconductor, and a ternary compound semiconductor.

3. The device according to claim 2, wherein said group IV material is selected from the group consisting of Si, Ge and C, said binary compound semiconductor is selected from the group consisting of GaAs, InP, InSb, BN, GaP, ZnSe, ZnS, CdS and CdTe, and said ternary compound semiconductor is selected from the group consisting of II-IV-VI compound, II-IV-V compound, III-IV-VI compound, I-III-VI compound and II-V-VII compound.

4. The device according to claim 2, wherein said semiconductor is Si.

5. The device according to claim 4, wherein said refractory metal is Ti.

6. The device according to claim 5, wherein said microcrystal grains are TiN grains.

7. The device according to claim 1, wherein said conductive layer is one selected from the group consisting of a Cu layer, an Al layer, an Ag layer, an Au layer, a layer of alloy of at least two of these metals, and a layer consisting of at least two films made of any of these metals.

8. The device according to claim 1, wherein said amorphous alloy layer and said conductive layer constitute a buried wiring layer formed in a groove made in an insulating layer.

9. The device according to claim 1, wherein said amorphous alloy layer is provided not only on the bottom surface of said conductive layer, but also on sides of said conductive layer.

10. The device according to claim 1, wherein said amorphous alloy layer and said conductive layer constitute a wiring layer formed on an insulating layer.

11. The device according to claim 1, wherein said amorphous alloy layer is provided not only on the bottom surface of said conductive layer, but also on the upper surface thereof.

12. The device according to claim 1, wherein said amorphous alloy layer is provided not only on the bottom of said conductive layer, but also on the sides and upper surface thereof.

13. The device according to claim 1, wherein said amorphous alloy layer functions as a barrier metal layer and a bonding layer.

14. A semiconductor device comprising:
    a conductive layer being at least either one of an electrode layer and a wiring layer, and;
    a barrier metal layer formed on a bottom surface of said conductive layer and containing Ti, Si and N.

15. The device according to claim 14, wherein Si contained in said barrier metal layer has an atomic ratio of 1 or more with respect to Ti contained in said barrier metal layer.

16. The device according to claim 14, wherein said conductive layer is one selected from the group consisting of a Cu layer, an Al layer, an Ag layer, an Au layer, a layer of alloy of at least two of these metals, and a layer consisting of at least two films made of any of these metals.

17. A semiconductor device, comprising:
    an insulating layer having a groove;
    a conductive layer selected from the group consisting of an electrode layer and a wiring layer, said conductive layer being buried in said groove; and
    a barrier metal layer formed on bottom and side surfaces of said conductive layer and containing Ti, Si and N.

18. The device according to claim 17, wherein the atomic ratio of Si to Ti is 0.7 or more.

19. The device according to claim 17, wherein the atomic ratio of Si to Ti is 1 or more.

20. A semiconductor device comprising
    a first conductive layer;
    a barrier metal layer formed on said first conductive layer and containing Ti, Si, and N; and
    a second conductive layer formed on said barrier metal layer.

21. A semiconductor device comprising:
    a first conductive layer;
    a barrier metal layer formed on said first conductive layer and formed of an amorphous alloy layer made of a matrix phase and microcrystal grains, said matrix phase containing amorphous alloy as a main component, and said microcrystal grains being dispersed in the matrix phase, not continuously arranged in the direction of thickness of the amorphous alloy layer; and
    a second conductive layer formed on said barrier metal layer.

22. A semiconductor device, comprising:
    a first conductive layer;
    an insulating layer formed on said first conductive layer and having a contact hole exposing an upper surface of said first conductive layer;
    a barrier metal layer formed on said insulating layer, a side surface of said contact hole and upper surface of said first conductive layer, and containing Ti, Si and N; and
    a second conductive layer formed on said barrier metal layer.

23. A semiconductor device, comprising:
    a first conductive layer;
    an insulating layer formed on said first conductive layer and having a contact hole exposing an upper surface of said first conductive layer;
    a barrier metal layer formed on said insulating layer, a side surface of said contact hole and upper surface of said first conductive layer, and formed of an amorphous alloy layer made of a matrix phase and microcrystal grains, said matrix phase containing amorphous alloy as a main component, and said microcrystal grains being dispersed in the matrix phase, not continuously arranged in the direction of thickness of the amorphous alloy layer; and
    a second conductive layer formed on said barrier metal layer.

24. The device according to claim 14, wherein said barrier metal layer consists of Ti, Si and N.

25. The device according to claim 17, wherein said barrier metal layer consists of Ti, Si and N.

26. The device according to claim 20, wherein said barrier metal layer consists of Ti, Si and N.

27. The device according to claim 21, wherein said barrier metal layer consists of Ti, Si and N.

28. The device according to claim 22, wherein said barrier metal layer consists of Ti, Si and N.

29. The device according to claim 23, wherein said barrier metal layer consists of Ti, Si and N.

* * * * *